(12) United States Patent
Shishido

(10) Patent No.: US 11,902,684 B2
(45) Date of Patent: *Feb. 13, 2024

(54) IMAGING DEVICE

(71) Applicant: Panasonic Intellectual Property Management Co., Ltd., Osaka (JP)

(72) Inventor: Sanshiro Shishido, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/832,301

(22) Filed: Jun. 3, 2022

(65) Prior Publication Data

US 2022/0303482 A1  Sep. 22, 2022

Related U.S. Application Data

(63) Continuation of application No. 16/945,979, filed on Aug. 3, 2020, now Pat. No. 11,381,769, which is a (Continued)

(30) Foreign Application Priority Data

Feb. 28, 2018 (JP) ................. 2018-034785

(51) Int. Cl.
  *H04N 25/76* (2023.01)
  *H01L 27/146* (2006.01)
  *H04N 25/79* (2023.01)

(52) U.S. Cl.
  CPC ....... *H04N 25/76* (2023.01); *H01L 27/14612* (2013.01); *H04N 25/79* (2023.01)

(58) Field of Classification Search
  CPC ...... H04N 5/374; H04N 5/379; H04N 5/3651; H04N 5/3745; H04N 5/378;
(Continued)

(56) References Cited

U.S. PATENT DOCUMENTS 6,130,423 A * 10/2000 Brehmer ................. H04N 5/374
                                                        348/308
10,008,525 B2 * 6/2018 Ueno ................. H01L 27/14612
(Continued)

FOREIGN PATENT DOCUMENTS

JP  2008-028516  2/2008
JP  2010-129705  6/2010
(Continued)

OTHER PUBLICATIONS

International Search Report of PCT application No. PCT/JP2019/003775 dated May 7, 2019.
(Continued)

*Primary Examiner* — Abdelaaziz Tissire

(74) *Attorney, Agent, or Firm* — Rimon, P.C.

(57) ABSTRACT

An imaging device includes a first substrate, and a second substrate stacked on the first substrate. A first connection portion and a second connection portion are between the first substrate and the second substrate. A first pixel and a second pixel each include a photoelectric converter that converts incident light into a signal charge, and a detection circuit that detects the signal charge. The first substrate includes the photoelectric converter and the detection circuit. The second substrate includes a first line, and a voltage source that is coupled to the detection circuit of the first pixel, via the first line and the first connection portion, and that is coupled to the detection circuit of the second pixel, via the first line and the second connection portion.

19 Claims, 61 Drawing Sheets

Related U.S. Application Data continuation of application No. PCT/JP2019/003775, filed on Feb. 4, 2019.

(58) Field of Classification Search
CPC ......... H01L 27/14612; H01L 27/14634; H01L 27/14636; H01L 27/14665
See application file for complete search history.

(56) References Cited

U.S. PATENT DOCUMENTS

| | | | |
|---|---|---|---|
| 11,381,769 B2* | 7/2022 | Shishido | H04N 5/374 |
| 2004/0043529 A1* | 3/2004 | Fossum | H01L 27/14643 438/70 |
| 2008/0018761 A1 | 1/2008 | Kondo et al. | |
| 2011/0068252 A1* | 3/2011 | Kawabata | H04N 5/335 257/292 |
| 2012/0049047 A1* | 3/2012 | Yin | H04N 5/37452 250/208.2 |
| 2012/0056251 A1* | 3/2012 | Kudoh | H01L 27/14612 257/292 |
| 2013/0040415 A1* | 2/2013 | Arakawa | H01L 27/14627 257/E31.127 |
| 2013/0070133 A1* | 3/2013 | Takazawa | H04N 5/335 348/294 |
| 2013/0092820 A1* | 4/2013 | Takemoto | H04N 5/3742 250/208.1 |
| 2013/0250151 A1* | 9/2013 | Kato | H04N 5/379 348/300 |
| 2015/0208008 A1* | 7/2015 | Gendai | H04N 5/3698 250/208.1 |
| 2016/0182781 A1* | 6/2016 | Mabuchi | H03M 1/144 348/322 |
| 2016/0182842 A1* | 6/2016 | Mabuchi | H04N 5/378 348/308 |
| 2016/0190187 A1* | 6/2016 | Nishimura | H01L 27/14643 257/292 |
| 2016/0190188 A1* | 6/2016 | Murakami | H01L 27/14609 250/214 A |
| 2016/0261817 A1* | 9/2016 | Totsuka | H04N 25/76 |
| 2016/0360131 A1* | 12/2016 | Shimasaki | H04N 5/37457 |
| 2017/0118426 A1* | 4/2017 | Koifman | H04N 25/772 |
| 2018/0359443 A1* | 12/2018 | Cho | A61K 39/39558 |
| 2019/0007632 A1* | 1/2019 | Kim | H04N 5/374 |
| 2019/0252443 A1* | 8/2019 | Kobayashi | H01L 27/14634 |
| 2019/0393259 A1* | 12/2019 | Kanehara | H01L 27/14612 |

FOREIGN PATENT DOCUMENTS

| | | |
|---|---|---|
| JP | 2013-009294 | 1/2013 |
| JP | 2013-051674 | 3/2013 |
| JP | 2014-030170 | 2/2014 |
| JP | 2014-078870 | 5/2014 |
| JP | 2016-127593 | 7/2016 |
| JP | 2016-152495 | 8/2016 |

OTHER PUBLICATIONS

Non-Final Office Action issued in U.S. Appl. No. 16/945,979, dated Oct. 4, 2021.

Notice of Allowance issued in U.S. Appl. No. 16/945,979, dated Mar. 7, 2022.

* cited by examiner

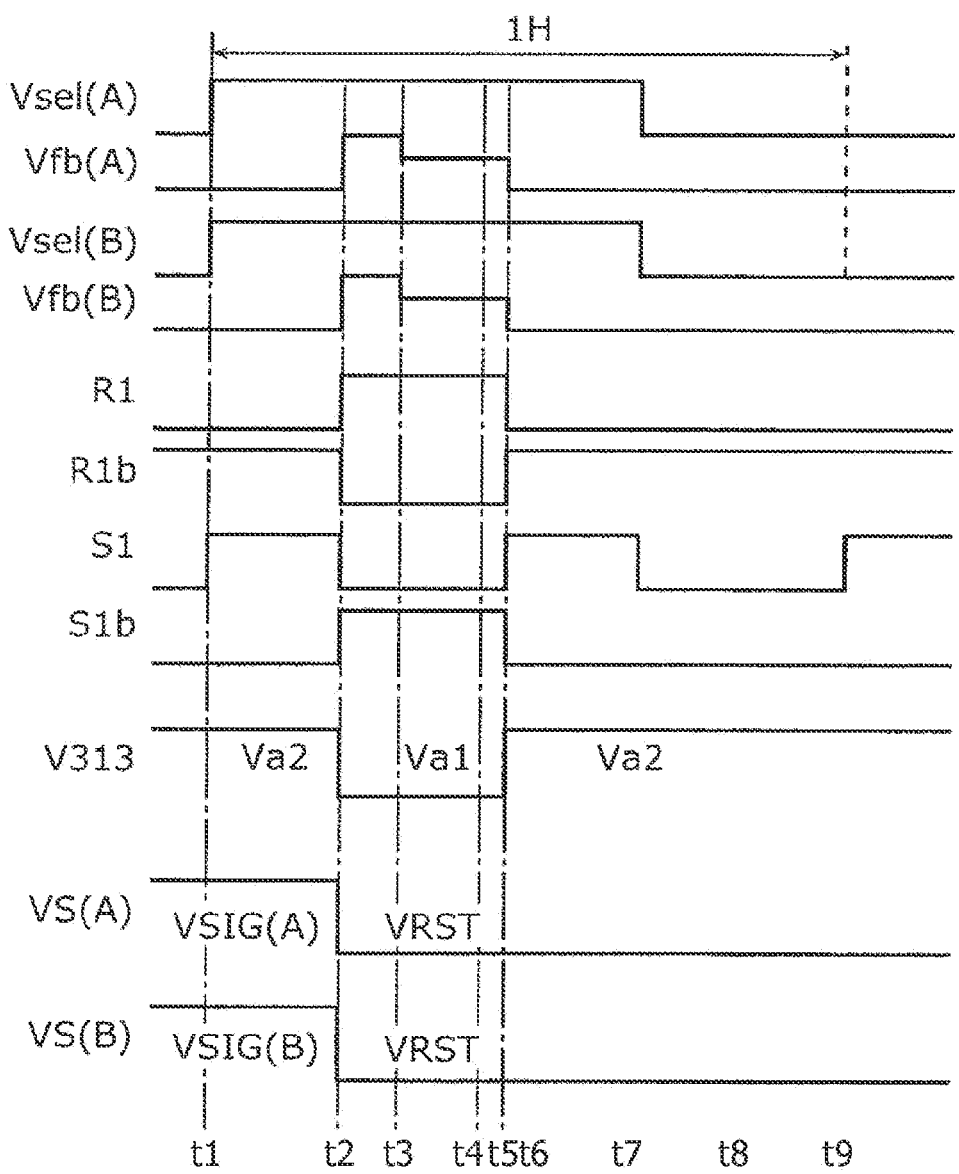

$$A_v = -g_m \cdot R_d$$

$$A_v = \frac{-g_m \cdot R_d}{1 + g_m \cdot R_s}$$

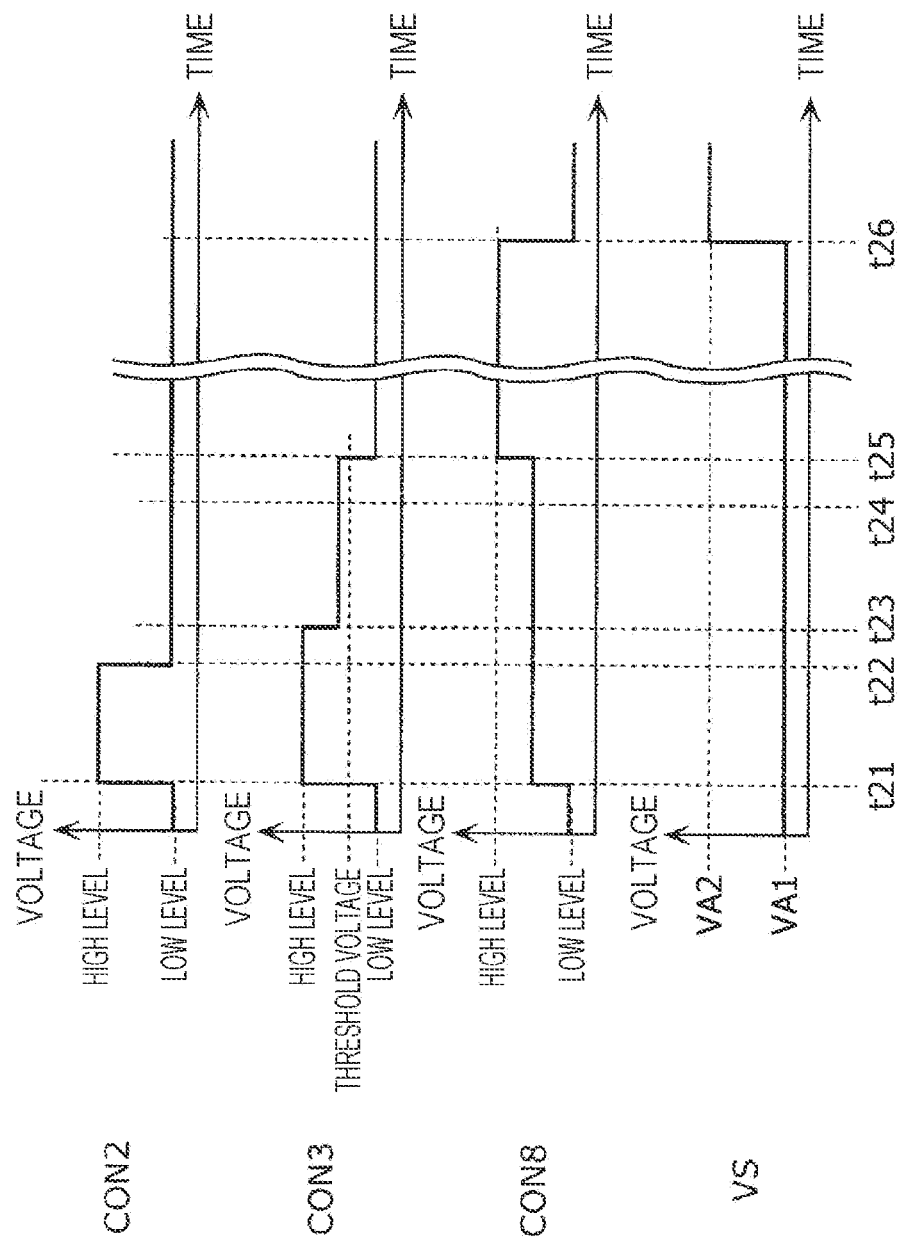

IMAGING DEVICE

CROSS-REFERENCE OF RELATED APPLICATIONS

This application is a continuation of U.S. patent application Ser. No. 16/945,979, filed on Aug. 3, 2020, which is continuation of International Application No. PCT/JP2019/003775, filed on Feb. 4, 2019, which claims the benefit of foreign priority of Japanese Patent Application No. 2018-034785, filed on Feb. 28, 2018, the contents all of which are incorporated herein by reference.

BACKGROUND

1. Technical Field

The present disclosure relates to an imaging device.

2. Description of the Related Art

In recent years, imaging devices have come into widespread use in various categories of products, such as video cameras, digital still cameras, surveillance cameras, and vehicle-mounted cameras. Charge-coupled device (CCD) solid-state imaging devices or complementary metal-oxide semiconductor (CMOS) solid-state imaging devices are used as the imaging devices.

For example, Japanese Unexamined Patent Application Publication No. 2010-129705 discloses a CMOS solid-state imaging device.

SUMMARY

In imaging devices, there are demands for enhancing the degree of freedom of an element layout.

In one general aspect, the techniques disclosed here feature an imaging device including a first substrate, and a second substrate stacked on the first substrate. A first connection portion and a second connection portion are between the first substrate and the second substrate. A first pixel and a second pixel each include a photoelectric converter that converts incident light into a signal charge, and a detection circuit that detects the signal charge. The first substrate includes the photoelectric converter and the detection circuit. The second substrate includes a first line, and a voltage source that is coupled to the detection circuit of the first pixel, via the first line and the first connection portion, and that is coupled to the detection circuit of the second pixel, via the first line and the second connection portion.

According to one aspect of the present disclosure, it is possible to provide an imaging device in which the degree of freedom of an element layout is enhanced.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 6 is a timing chart illustrating one example of the operation of the imaging device according to the first embodiment;

FIG. 36 is a timing chart illustrating one example of an operation of the detection circuit according to the third embodiment;

DETAILED DESCRIPTION

Figure 1:
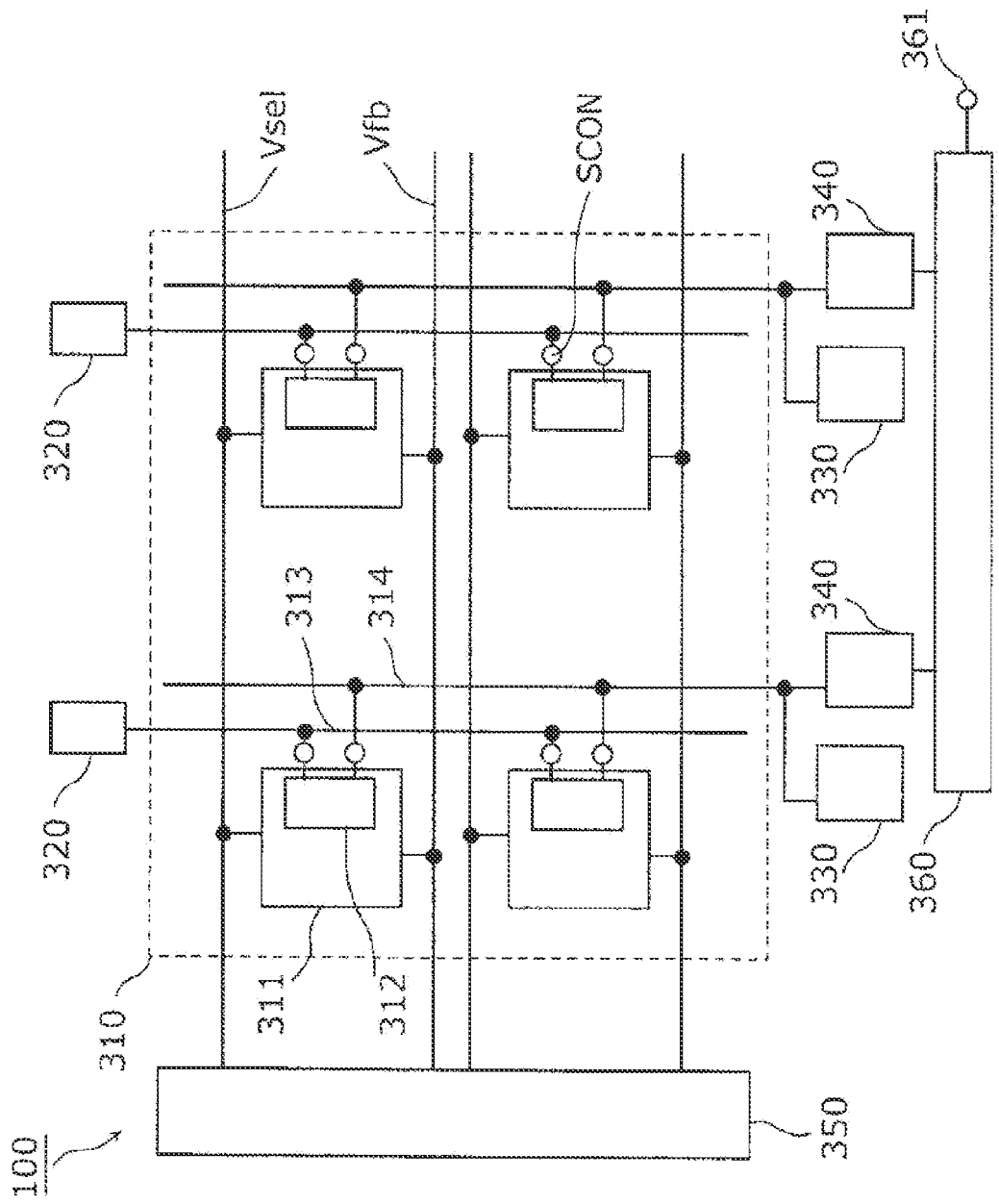
FIG. 1 is a schematic diagram illustrating an exemplary overall configuration of an imaging device according to a first embodiment.

An overview of one aspect of the present disclosure is as follows.

[Item 1]

An imaging device includes:
a first substrate; and
a second substrate stacked on the first substrate.
The first substrate includes
 a photoelectric converter that converts incident light into a signal charge, a first transistor that outputs a signal corresponding to the signal charge, a gate of the first transistor being connected to the photoelectric converter, and a second transistor, one of a source and a drain of the second transistor being connected to the photoelectric converter, the other of the source and the drain of the second transistor being connected to a source or a drain of the first transistor; and the second substrate includes a constant current source circuit that is connected to one of the source and the drain of the first transistor, and a bias circuit that is connected to the other of the source and the drain of the first transistor and that generates a first voltage and a second voltage different from the first voltage.

[Item 2]

In the imaging device according to item 1, the first substrate may include a first capacitor connected between the photoelectric converter and the one of the source and the drain of the second transistor; and the one of the source and the drain of the second transistor may be connected to the photoelectric converter via the first capacitor.

[Item 3]

In the imaging device according to item 1 or 2, the first substrate may include a second capacitor having one end connected to the one of the source and the drain of the second transistor and the other end to which a third voltage is applied.

[Item 4]

In the imaging device according to item 1 or 2, the second substrate may include a second capacitor having one end connected to the one of the source and the drain of the second transistor and the other end to which a third voltage is applied.

[Item 5]

In the imaging device according to item 1 or 2, the first substrate may further include a second capacitor having one end connected to the one of the source and the drain of the second transistor and the other end to which a third voltage is applied; and the second substrate may further include a third capacitor having one end connected to the one of the source and drain of the second transistor and the other end to which the third voltage is applied.

[Item 6]

In the imaging device according to one of items 1 to 5, the first substrate may include a third transistor, one of a source and a drain of the third transistor being connected to the one of the source and the drain of the first transistor, the other of the source and the drain of the third transistor being connected to the constant current source circuit.

[Item 7]

In the imaging device according to one of items 1 to 5, the second substrate may include a third transistor, one of a source and a drain of the third transistor being connected to the one of the source and the drain of the first transistor, the other of the source and the drain of the third transistor being connected to the constant current source circuit.

[Item 8]

In the imaging device according to one of items 1 to 5, the constant current source circuit may include a first constant current source and a second constant current source different from the first constant current source; and one of the first constant current source and the second constant current source may be selectively connected to the one of the source and the drain of the first transistor.

[Item 9]

In the imaging device according to item 8, the first substrate may include a third transistor, one of a source and a drain of the third transistor being connected to the one of the source and the drain of the first transistor, the other of the source and the drain of the third transistor being connected to the first constant current source.

[Item 10]

In the imaging device according to item 8, the second substrate may include a third transistor, one of a source and a drain of the third transistor being connected to the one of the source and the drain of the first transistor, the other of the source and the drain of the third transistor being connected to the first constant current source.

[Item 11]

In the imaging device according to one of items 1 to 5, the constant current source circuit may include a first constant current source and a voltage source that generates a third voltage; and one of the first constant current source and the voltage source may be selectively connected to the one of the source and the drain of the first transistor.

[Item 12]

In the imaging device according to item 11, the first substrate may include a third transistor, one of a source and a drain of the third transistor being connected to the one of the source and the drain of the first transistor, the other of the source and the drain of the third transistor being connected to the constant current source circuit.

[Item 13]

In the imaging device according to one of items 1 to 12, the first substrate may include a fourth transistor connected between the photoelectric converter and the first transistor.

[Item 14]

In the imaging device according to one of items 1 to 13, the other of the source and the drain of the second transistor may be connected to the one of the source and the drain of the first transistor.

[Item 15]

An imaging device includes:

a first substrate; and a second substrate stacked on the first substrate.

The first substrate includes a photoelectric converter that converts incident light into a signal charge, a first transistor that outputs a signal corresponding to the signal charge, a gate of the first transistor being connected to the photoelectric converter, and a second transistor, a gate and one of a source and a drain of the second transistor being connected to the photoelectric converter, and the second substrate includes a constant current source circuit that is connected to one of a source and a drain of the first transistor, and a signal generation circuit that is connected to the other of the source and the drain of the second transistor and that generates a signal.

[Item 16]

In the imaging device according to item 15, the first substrate may include a first capacitor connected between the photoelectric converter and the one of the source and the drain of the second transistor, and the one of the source and the drain of the second transistor may be connected to the photoelectric converter via the first capacitor.

Embodiments of the present disclosure will be described with reference to the accompanying drawings.

An overview of one aspect of the present disclosure is as follows.

An imaging device according to one aspect of the present disclosure includes a first substrate and a second substrate that is stacked on the first substrate and that is electrically connected to the first substrate. The first substrate has a pixel including a photoelectric converter that photoelectrically converts incident light to generate a charge and a detection circuit that detects the charge. The detection circuit has a first terminal that is connected to the photoelectric converter and a second terminal and a third terminal that are electrically connected to the second substrate.

According to this configuration, it is possible to enhance the degree of freedom of an element layout.

The detection circuit may have a first transistor that outputs a signal corresponding to the charge, and one of a source and a drain of the first transistor may be electrically connected to the second substrate via the second terminal, and the other of the source and the drain may be electrically connected to the second substrate via the third terminal.

This makes it possible to amplify a signal voltage corresponding to the amount of signal charge generated by the photoelectric converter.

The detection circuit may include a charge accumulation region that accumulates the charge generated by the photoelectric converter and a second transistor that resets the charge accumulation region, one of a source and a drain of the second transistor being electrically connected to the charge accumulation region. One of the source and the drain of the first transistor may be electrically connected to the other of the source and the drain of the second transistor.

This makes it possible to more effectively reduce reset noise.

The detection circuit may include a charge accumulation region that accumulates the charge generated by the photoelectric converter, a first transistor that outputs a signal corresponding to the charge, and a second transistor that resets the charge accumulation region. A gate of the second transistor may be electrically connected to the charge accumulation region, one of the source and the drain of the first transistor may be electrically connected to the second substrate via the second terminal, and one of the source and the drain of the second transistor may be electrically connected to the second substrate via the third terminal.

This makes it possible to perform accumulation and reset of the charge converted by the photoelectric converter.

The pixel may further have a third transistor. One of a source and a drain of the third transistor may be connected to the one of the source and the drain of the first transistor, and the other of the source and the drain of the third transistor may be electrically connected to the second substrate via the second terminal.

This allows an output of the first transistor to be selectively output to the second substrate.

The second substrate may have a current source electrically connected to the one of the source and the drain of the first transistor and a bias circuit electrically connected to the other of the source and the drain of the first transistor.

This allows the pixel to be arranged in a substrate that is different from a substrate in which the current source and the bias circuit are arranged.

The bias circuit may output a first voltage in a first period in which the signal is read and may output a second voltage, which is different from the first voltage, in a second period in which the charge accumulation region is reset, and the current source may output first current in the first period and may output second current, which is different from the first current, in the second period.

This allows the first transistor to operate in operation modes that differ between the first period and the second period.

Embodiments according to the present disclosure will be described below with reference to the accompanying drawings. The present disclosure is not limited to the embodiments below. Changes can be made as appropriate without departing from the scope in which effects of the present disclosure are obtained. In addition, one embodiment can also be combined with another embodiment. In the following description, the same or similar constituent elements are denoted by the same reference numerals. Redundant descriptions may be omitted below.

In first to eighth embodiments described below, in principle, transistors in a reading circuit, except for some transistors, are assumed to be n-channel metal-oxide semiconductor (NMOS) transistors. Naturally, p-channel metal-oxide semiconductor (PMOS) transistors may be used instead of the NMOS transistors. In such a case, the polarity of each control signal is reversed. NMOS transistors and PMOS transistors may be used in combination.

First Embodiment

FIG. 1 is a diagram schematically illustrating an overall configuration of an imaging device in a first embodiment of the present disclosure. An imaging device 100 includes a pixel array 310 and peripheral circuitry. The pixel array 310 is constituted by a plurality of pixels 311. In the illustrated example, the plurality of pixels 311 is arrayed in row directions and column directions. Herein, the "row directions" refers to directions in which a row extends, and the "column directions" refers to directions in which a column extends. That is, in the drawings, the vertical directions (up-and-down directions) correspond to the column directions, and the horizontal directions (left-and-right directions) correspond to the row directions.

In FIG. 1, the pixel array 310 in the imaging device in the present embodiment includes the pixels 311, detection circuits 312 arranged in the respective pixels 311, bias signal lines 313, and output signal lines 314.

The number of pixels 311 in the pixel array 310 may be, for example, a few millions to tens of millions. In FIG. 1, a group of a total of four pixels 311, with two being disposed along the row directions and two being disposed along the column directions, is illustrated as a representative in order to avoid the drawings becoming overly complicated.

FIG. 1 merely schematically illustrates the array of pixels 311, and the plurality of pixels 311 disposed along the column directions does not necessarily have to be strictly disposed in a straight line. For example, the center of one of two pixels 311 that are adjacent to each other along the column directions may be disposed about half a pixel pitch along the row directions relative to the center of the other pixel 311. The pixels 311 that are disposed along the row directions do not necessarily have to be strictly disposed in a straight line along the row directions.

The pixels 311 in FIG. 1 include the detection circuits 312, respectively. Each detection circuit 312 has two terminals that connect to outside of the corresponding pixel 311.

One of the terminals of the detection circuit 312 is connected to the corresponding output signal line 314. For example, this terminal corresponds to a third terminal 317 described below and illustrated in FIG. 2. The other terminal of the detection circuit 312 is connected to the corresponding bias signal line 313. For example, the other terminal corresponds to a second terminal 316 described below and illustrated in FIG. 2.

Although the pixels 311 belonging to the same column are illustrated in FIG. 1 as being connected to the same output signal line 314 and the same bias signal line 313, the connection is not limited thereto. For example, the pixels 311 may be connected to a different output signal line or bias signal line for each pixel array block.

The peripheral circuitry includes bias control circuits 320, constant current source circuits 330, column signal processing circuits 340, a vertical scanning circuit 350, and a horizontal signal reading circuit 360. The column signal processing circuits 340 are also called row signal accumulation circuits. The vertical scanning circuit 350 is also called a row scanning circuit. The horizontal signal reading circuit 360 is also called a column scanning circuit. The bias control circuits 320, the constant current source circuits 330, and the column signal processing circuits 340 may be arranged for the respective columns of the pixels 311 that are arrayed two-dimensionally.

One example of the configuration of the peripheral circuitry will be described below.

The vertical scanning circuit 350 is connected to selection control signal lines Vsel and band control signal lines Vfb. The vertical scanning circuit 350 selects the pixels 311, arranged in the rows, for each row by applying a predetermined voltage to the selection control signal line Vsel. Then, signal voltages of the pixels 311 that are selected are read, and the pixels 311 are reset, which is described below.

The pixels 311 arranged in each column are electrically connected to the corresponding column signal processing circuit 340 through the corresponding output signal line 314. The column signal processing circuits 340 perform noise-reduction signal processing, typified by correlated double sampling (CDS), and analog-to-digital conversion (AD conversion). The column signal processing circuits 340 are connected to the horizontal signal reading circuit 360. The horizontal signal reading circuit 360 reads signals from the column signal processing circuits 340 and outputs the signals to a horizontal common signal line 361. Although, in FIG. 1, the output signal lines 314 are connected to the respective column signal processing circuits 340, the present disclosure is not limited to this configuration. For example, the imaging device 100 may have a configuration in which two or more output signal lines 314 are connected to each column and are connected to respective different column signal processing circuits 340.

Also, although, in FIG. 1, the bias control circuits 320 are arranged at an upper side of the pixel array 310, and the constant current source circuits 330, the column signal processing circuits 340, and the horizontal signal reading circuit 360 are arranged at a lower side of the pixel array 310, this arrangement is one example for the illustration in the present disclosure and does not intend to define a physical arrangement in an actual configuration. All of these circuits may be arranged at either the upper side or the lower side of the pixel array 310 or may be arranged both the upper and lower sides of the pixel array 310. The arrangement of the vertical scanning circuit 350 is not limited to the arrangement at the left side of the pixel array 310 as illustrated in FIG. 1. The vertical scanning circuit 350 may be arranged at the right side of the pixel array 310, or vertical scanning circuits 350 may be arranged at both the left and right sides of the vertical scanning circuit 350.

In the present embodiment, the pixel array 310 is provided on a first substrate 101. The first substrate 101 is described below and illustrated in, for example, FIG. 2. The bias control circuits 320, the constant current source circuits 330, the column signal processing circuits 340, the vertical scanning circuit 350, and the horizontal signal reading circuit 360, which are included in the peripheral circuitry, are provided on a second substrate 102. The second substrate 102 is described below and illustrated in, for example, FIG. 2. The first and second substrates 101 and 102 may be semiconductor substrates. For example, the first and second substrates 101 and 102 may be silicon-on-insulator (SOI) substrates.

Although, in the configuration illustrated in FIG. 1, the bias control circuits 320, the constant current source circuits 330, and the column signal processing circuits 340 are arranged for the respective columns, they may be arranged on the second substrate 102 for each pixel or for every two or more pixels. With such a configuration, distances between the pixels 311 and blocks of the bias control circuits 320, the constant current source circuits 330, and the column signal processing circuits 340 are reduced. This makes it possible to reduce parasitic capacitances and resistances of wiring lines that provide connections between the bias control circuits 320, the constant current source circuits 330, and the column signal processing circuits 340 or to reduce the amount of current that flows therein.

The vertical scanning circuit 350 may also be provided in the second substrate 102.

Figure 2:
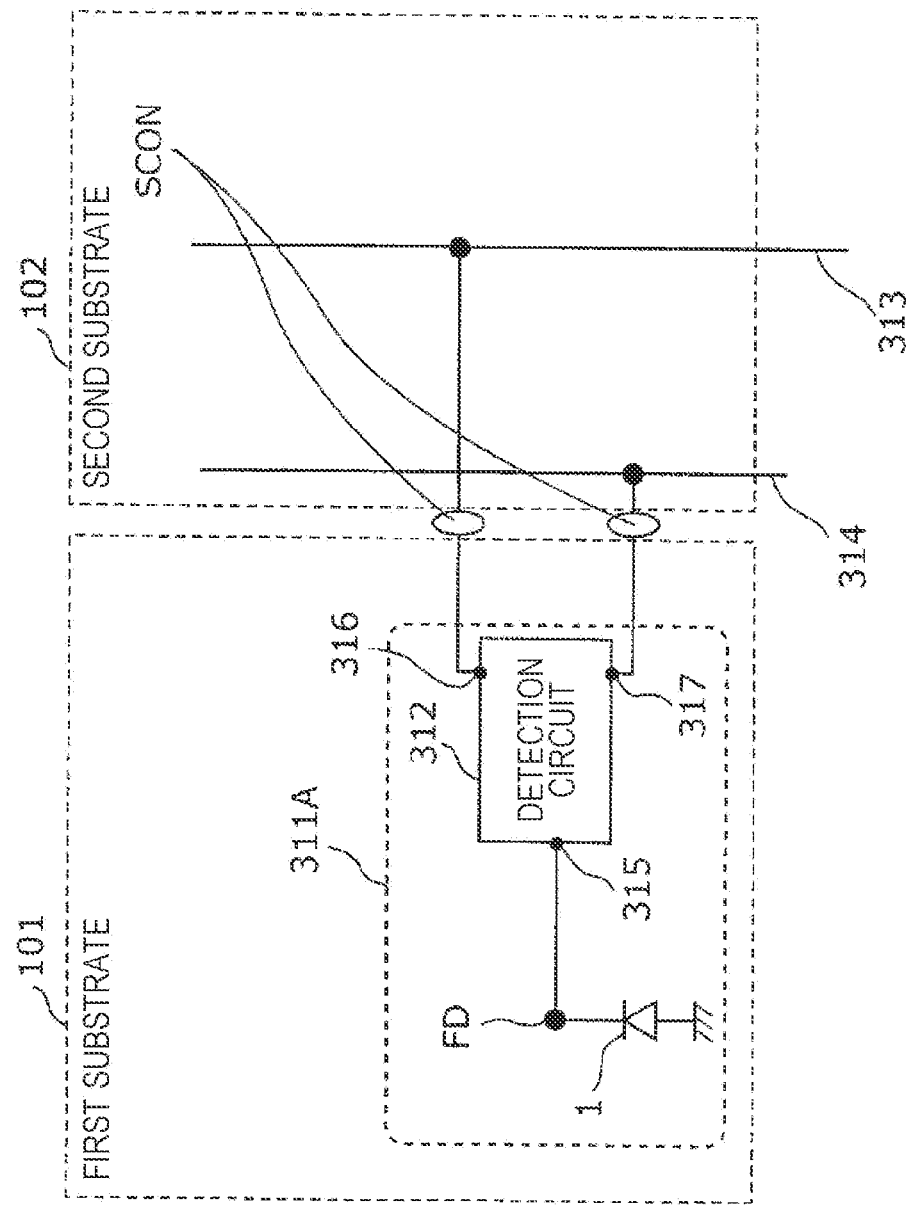
FIG. 2 is a schematic diagram illustrating an exemplary circuit configuration of one pixel according to the first embodiment.

FIG. 2 schematically illustrates an exemplary circuit configuration of the imaging device 100 according to the present embodiment. A pixel 311A has a photoelectric converter 1 and a detection circuit 312.

The photoelectric converter 1 photoelectrically converts incident light to generate charge.

The detection circuit 312 detects the charge generated by the photoelectric converter 1. That is, the charge generated by the photoelectric converter 1 is accumulated in a charge accumulation region FD and is read by the detection circuit 312. The detection circuit 312 is electrically connected to the second substrate 102 via substrate connection portions SCON provided on the first substrate 101. The substrate connection portions SCON in this case are provided in connection portions for the output signal lines 314 and the bias signal lines 313. That is, the detection circuit 312 has a first terminal 315, the aforementioned second terminal 316, and the aforementioned third terminal 317. The first terminal 315 is connected to the photoelectric converter 1, and the second terminal 316 and the third terminal 317 are electrically connected to the second substrate 102.

When the wiring resistances in the bias signal line 313, which serves as a voltage application path to the detection circuit 312, and the output signal line 314, which serves as a voltage reading path, increase, there is a possibility that an effective voltage range of signals to be read decreases or signal propagation is delayed owing to resistance-capacitance (RC) components.

With the configuration in the present embodiment, as illustrated in FIG. 2, the bias signal lines 313 and the output signal lines 314, which have been heretofore arranged in the pixels, can be arranged outside the pixels. This makes it possible to increase the widths of the bias signal lines 313 and the output signal lines 314. Thus, it is possible to reduce the resistances of the bias signal lines 313 and the output signal lines 314.

Also, when the bias signal lines 313 and the output signal lines 314, which have heretofore been arranged in the pixels, are arranged in the second substrate, which is different from the first substrate, it is possible to alleviate constraints in the layout of the imaging device. Also, when transistors used for reading signals from the pixel are arranged at positions close to the photoelectric converter 1, that is, are arranged in the first substrate 101, it is possible to reduce mixing of noise. The transistors used for reading signals from the pixel are, for example, an amplifying transistor and a transfer transistor. Meanwhile, a selecting transistor and a reset transistor, which have relatively small influences on pixel signals, may be arranged in the second substrate 102. The selecting transistor and the reset transistor are described later.

In the second substrate 102, for example, the bias signal lines 313 may be wired in a mesh form. When the bias signal lines 313 are wired in a mesh form, the number of paths through which current flow increases, thus reducing the values of the wiring resistances.

Figure 3:
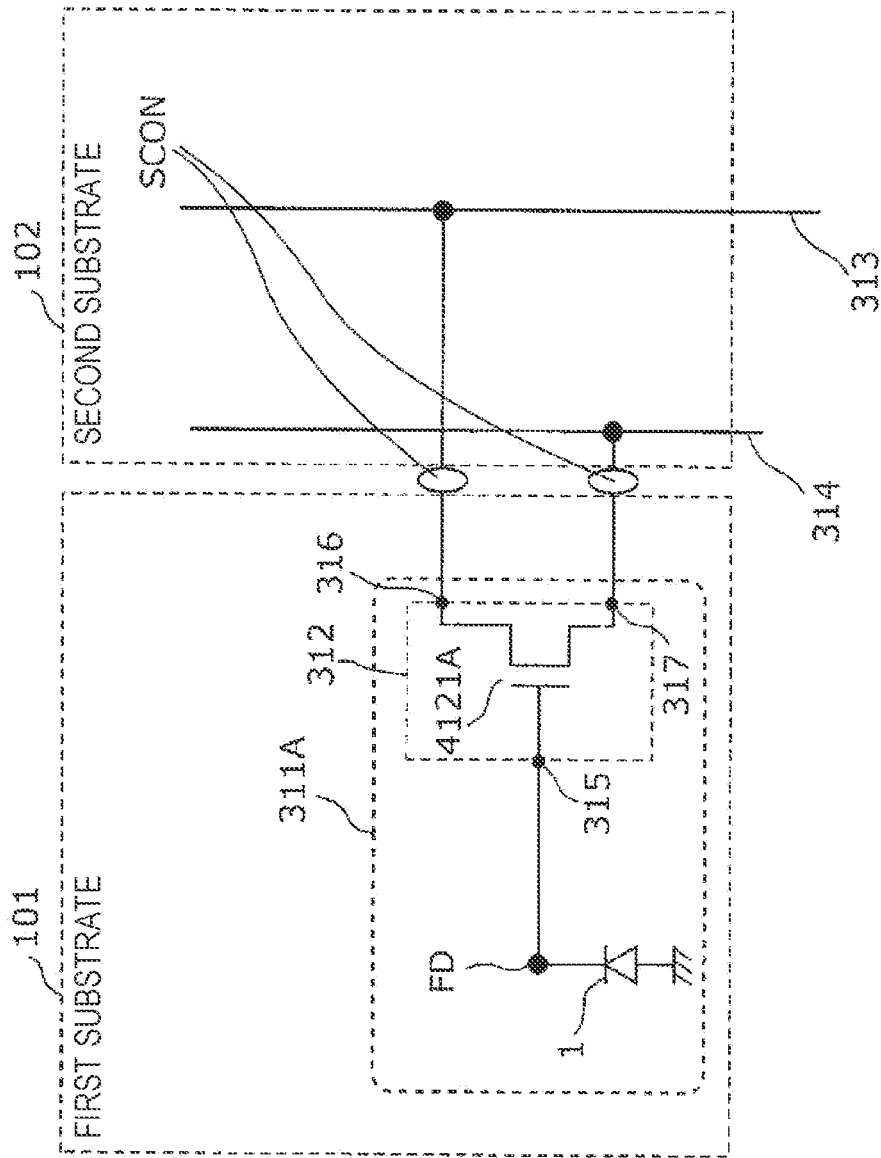
FIG. 3 is a schematic diagram illustrating a simplified configuration of the pixel according to the first embodiment.

As illustrated in FIG. 3, the detection circuit 312 may be implemented by an amplifying transistor 4121A.

Figure 4:
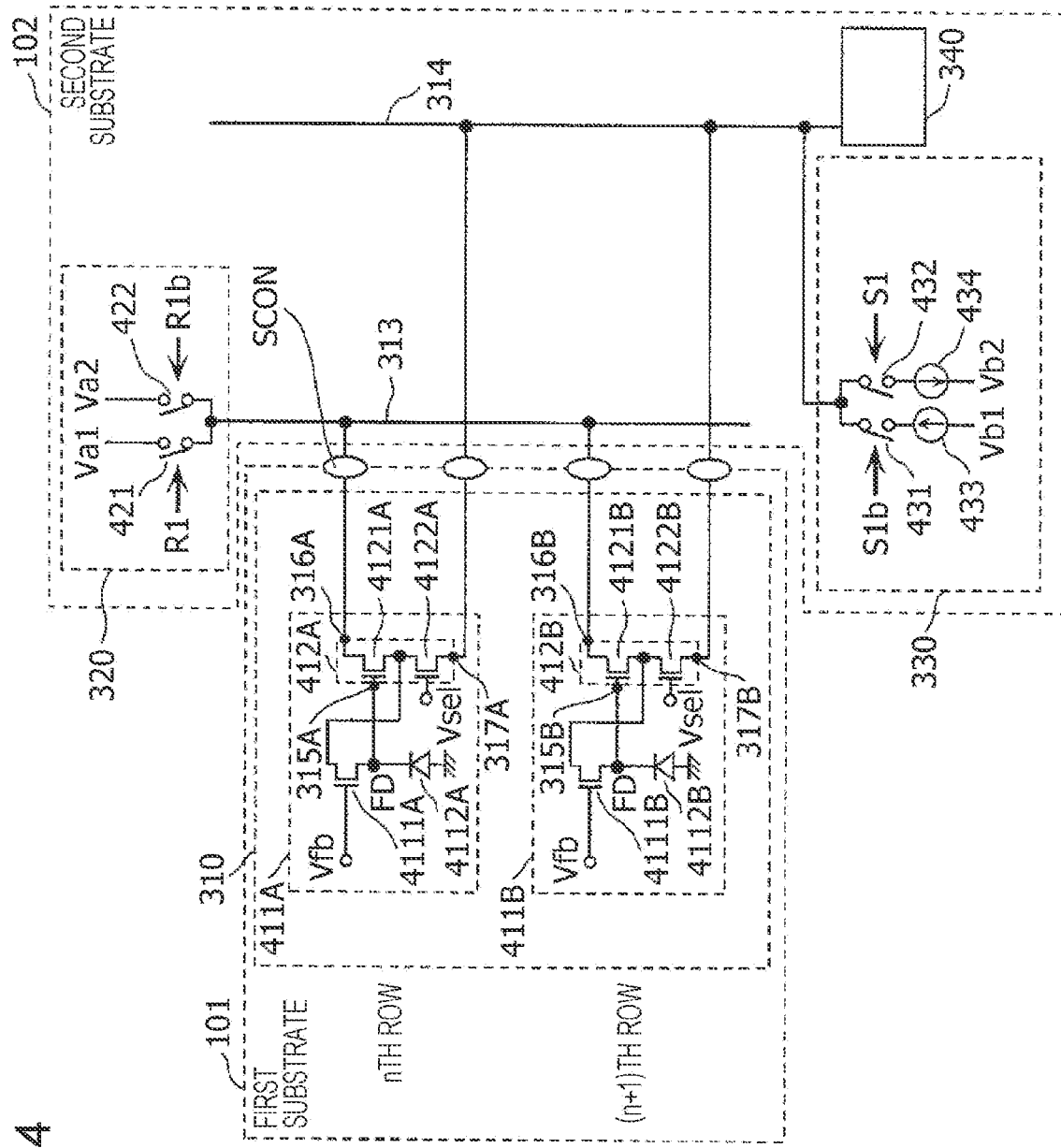
FIG. 4 is a schematic diagram illustrating a specific configuration of the imaging device according to the first embodiment.

FIG. 4 illustrates a more specific example of the pixel array 310, the bias control circuit 320, and the constant current source circuit 330 in the configuration illustrated in FIG. 1. The pixel 311A illustrated in FIG. 2 may have, for example, a circuit configuration of pixels 411A and 411B illustrated in FIG. 4.

The detection circuit 312 illustrated in FIG. 2 may be realized as a source follower transistor SF (e.g., an amplifying transistor 4121A), as illustrated in FIG. 4. A source and a drain of the amplifying transistor 4121A are electrically connected to the second substrate 102 via the corresponding substrate connection portions SCON. The output signal line 314 is connected to one of the source and the drain of the amplifying transistor 4121A, and the bias signal line 313 is connected to the other of the source and the drain. The bias control circuit 320 and the constant current source circuit 330 are arranged in the second substrate 102.

The bias control circuit 320 applies a bias voltage to the amplifying transistor 4121A through the bias signal line 313.

The constant current source circuit 330 supplies current to the amplifying transistor 4121A through the output signal line 314.

FIG. 4 illustrates the pixels 311 in two rows by one column, the pixels 311 being taken from the pixel array 310 illustrated in FIG. 1. The pixel 411A located in the nth row includes a band control transistor 4111A, a photoelectric converter 4112A, a detection circuit 412A, and a charge accumulation region FD.

The photoelectric converter 4112A detects light and generates charge. The photoelectric converter 4112A may be an element constituted by upper and lower electrodes and a light receiving layer sandwiched between the electrodes, like that disclosed in Japanese Unexamined Patent Application Publication No. 2010-129705, or may be a photodiode. The charge accumulation region FD accumulates signal charge generated by the photoelectric converter 4112A.

The detection circuit 412A includes the amplifying transistor 4121A and a selecting transistor 4122A. A gate of the amplifying transistor 4121A is connected to the charge accumulation region FD. The amplifying transistor 4121A outputs a signal corresponding to the charge generated by the photoelectric converter 4112A. The selecting transistor 4122A selectively outputs an output of the amplifying transistor 4121A to outside of the pixel 411A. One of the source and the drain of the amplifying transistor 4121A is connected to one of a source and a drain of the band control transistor 4111A and one of a source and a drain of the selecting transistor 4122A. In addition, the other of the source and the drain of the amplifying transistor 4121A is connected to the bias signal line 313. The other of the source and the drain of the selecting transistor 4122A is connected to the output signal line 314. Also, the other of the source and the drain of the band control transistor 4111A is connected to the charge accumulation region FD.

The band control signal line Vfb is connected to a gate of the band control transistor 4111A. The state of the band control transistor 4111A is determined according to a voltage in the band control signal line Vfb. For example, when the voltage in the band control signal line Vfb is at a high level, the band control transistor 4111A is turned on. As a result, the charge accumulation region FD, the amplifying transistor 4121A, and the band control transistor 4111A form a feedback path.

When the voltage in the band control signal line Vfb decreases, a resistance component in the band control transistor 4111A increases. Thus, the bandwidth of the band control transistor 4111A decreases, and the frequency range of a signal that is fed back becomes narrow. When the voltage in the band control signal line Vfb decreases further to reach a low level, the band control transistor 4111A is turned off. As a result, the feedback path is not formed.

The other of the source and the drain of the selecting transistor 4122A is connected to the output signal lines 314. The selection control signal line Vsel is connected to a gate of the selecting transistor 4122A. The state of the selecting transistor 4122A is determined according to a voltage in the selection control signal line Vsel. For example, when the voltage in the selection control signal line Vsel is at a high level, the selecting transistor 4122A is turned on. As a result, the amplifying transistor 4121A and the output signal line 314 are electrically connected to each other. When the voltage in the selection control signal line Vsel is at a low level, the selecting transistor 4122A is turned off. As a result, the amplifying transistor 4121A and the output signal line 314 are electrically separated from each other.

The voltage in the band control signal line Vfb and the voltage in the selection control signal line Vsel are supplied from, for example, the vertical scanning circuit 350 illustrated in FIG. 1.

The bias signal line 313 is connected to the other of the source and the drain of the amplifying transistor 4121A, and the bias control circuit 320 is connected to the other of the source and the drain of the amplifying transistor 4121A through the bias signal line 313. The internal configuration of the bias control circuit 320 will be described below in detail.

The other of the source and the drain of the amplifying transistor 4121A is connected to a voltage source Va1 through the bias signal lines 313 and a switching element 421. The other of the source and the drain of the amplifying transistor 4121A is connected to a voltage source Va2 through the bias signal lines 313 and a switching element 422. The switching element 421 is controlled according to a control signal R1, and the switching element 422 is controlled according to a control signal R1*b*. That is, the bias control circuit 320 is controlled according to the control signals R1 and R1*b* to thereby allow a voltage applied to the other of the source and the drain of the amplifying transistor 4121A to be switched to a voltage of the voltage source Va1 or a voltage of the voltage source Va2. The voltage of the voltage source Va1 is, for example, a ground voltage GND. The voltage of the voltage source Va2 is, for example, a power-supply voltage VDD.

The pixel 411B located in the (n+1)th row also has a configuration that is similar to the pixel 411A. That is, the pixel 411B includes a band control transistor 4111B, a photoelectric converter 4112B, and a detection circuit 412B. The detection circuit 412B includes an amplifying transistor 4121B and a selecting transistor 4122B.

The constant current source circuit 330 is connected to the output signal line 314. The constant current source circuit 330 includes a constant current source 433 in a direction in which current is fed to the selecting transistor 4122A in the detection circuit 412A (i.e., in an upper direction in the plane of the figure) and a constant current source 434 in a direction in which current is drawn (i.e., in a lower direction in the plane of the figure). The constant current source 433 is connected to the output signal line 314 through a switching element 431. The constant current source 434 is connected to the output signal line 314 via a switching element 432. When the selecting transistor 4122A, the switching element 422 in the bias control circuit 320, and the switching element 432 in the constant current source circuit 330 are in an on state, the selecting transistor 4122A, the amplifying transistor 4121A, and the constant current source 434 form a source follower circuit. At this point in time, a signal corresponding to the charge accumulated in the charge accumulation region FD is output to the output signal line 314 and is read to outside. On the other hand, when the selecting transistor 4122A, the switching element 421 in the bias control circuit 320, and the switching element 431 in the constant current source circuit 330 are in an on state, the selecting transistor 4122A, the amplifying transistor 4121A, and the constant current source 433 form a source-grounded amplifier circuit.

One constant current source circuit 330 may be provided for each output signal line 314, as in the configuration illustrated in FIG. 4, or one constant current source circuit 330 may be connected to two or more output signal lines 314. Such a configuration makes it possible to reduce the number of elements in the imaging device. Although a configuration in which both the bias control circuit 320 and the constant current source circuit 330 are arranged in the second substrate 102 is illustrated in FIG. 4, either one may be arranged in the second substrate 102, and the other may be provided in the first substrate 101. In such a case, current sources that are configured by transistors having the same polarity as that of the transistors that constitute the pixels may be provided in the first substrate 101, and transistors that exhibit an opposite polarity may be arranged in the second substrate 102. For example, the pixel circuits and the constant current sources 434 may be constituted by NMOS transistors and be arranged in the first substrate 101, and the constant current sources 433 may be constituted by PMOS transistors and be arranged in the second substrate 102.

Next, an operation flow of the imaging device 100 in the present embodiment will be described with reference to FIGS. 5A, 5B, and 6.

Figure 5A:
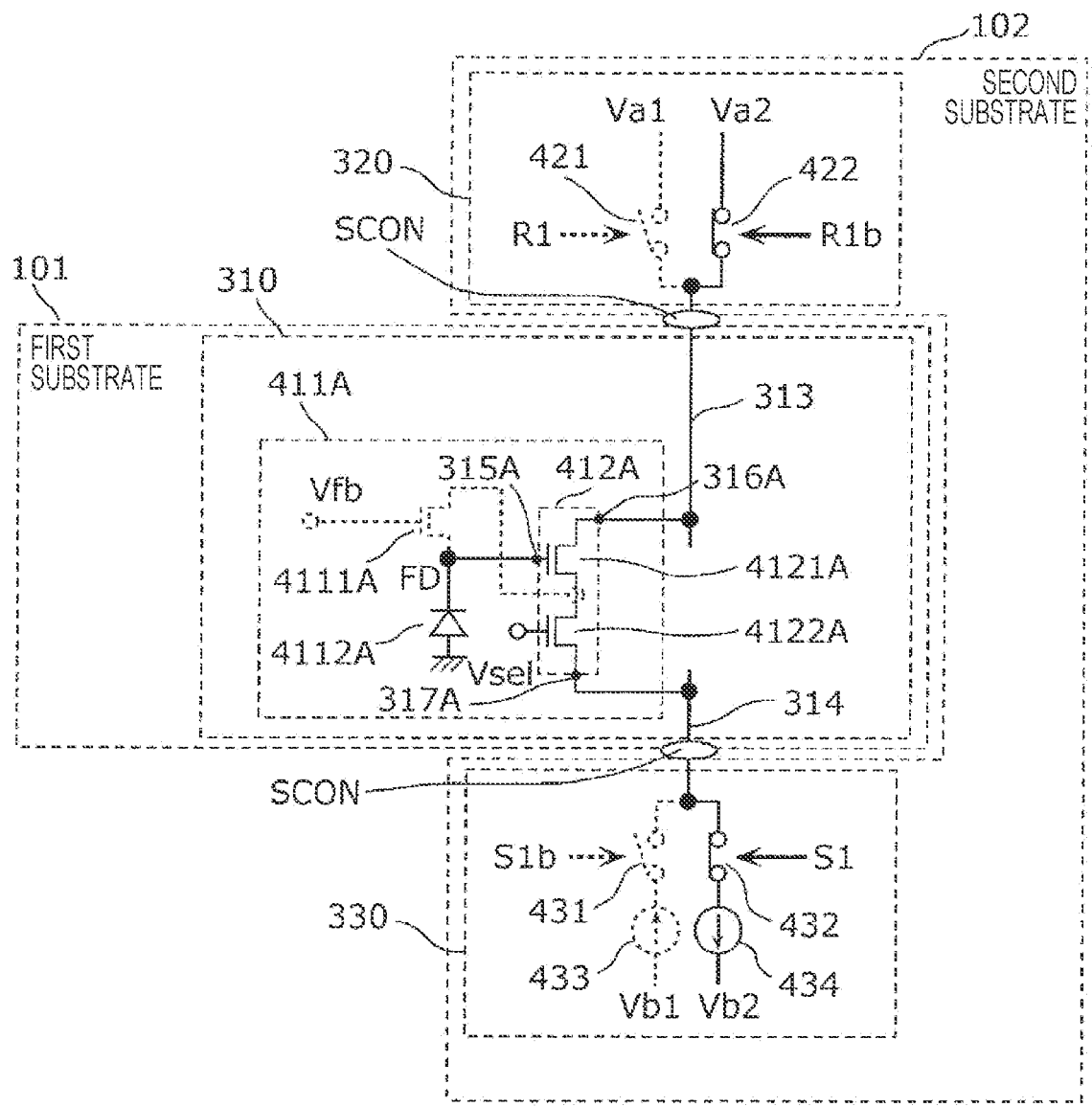
FIG. 5A is a schematic diagram illustrating one example of an operation of the imaging device according to the first embodiment.

During signal-charge reading, the amplifying transistor 4121A and the constant current source 434 operate as a source follower circuit, as illustrated in FIG. 5A, and for a gain of 1 or less, a signal voltage at the charge accumulation region FD is read to outside of the pixel.

Figure 5B:
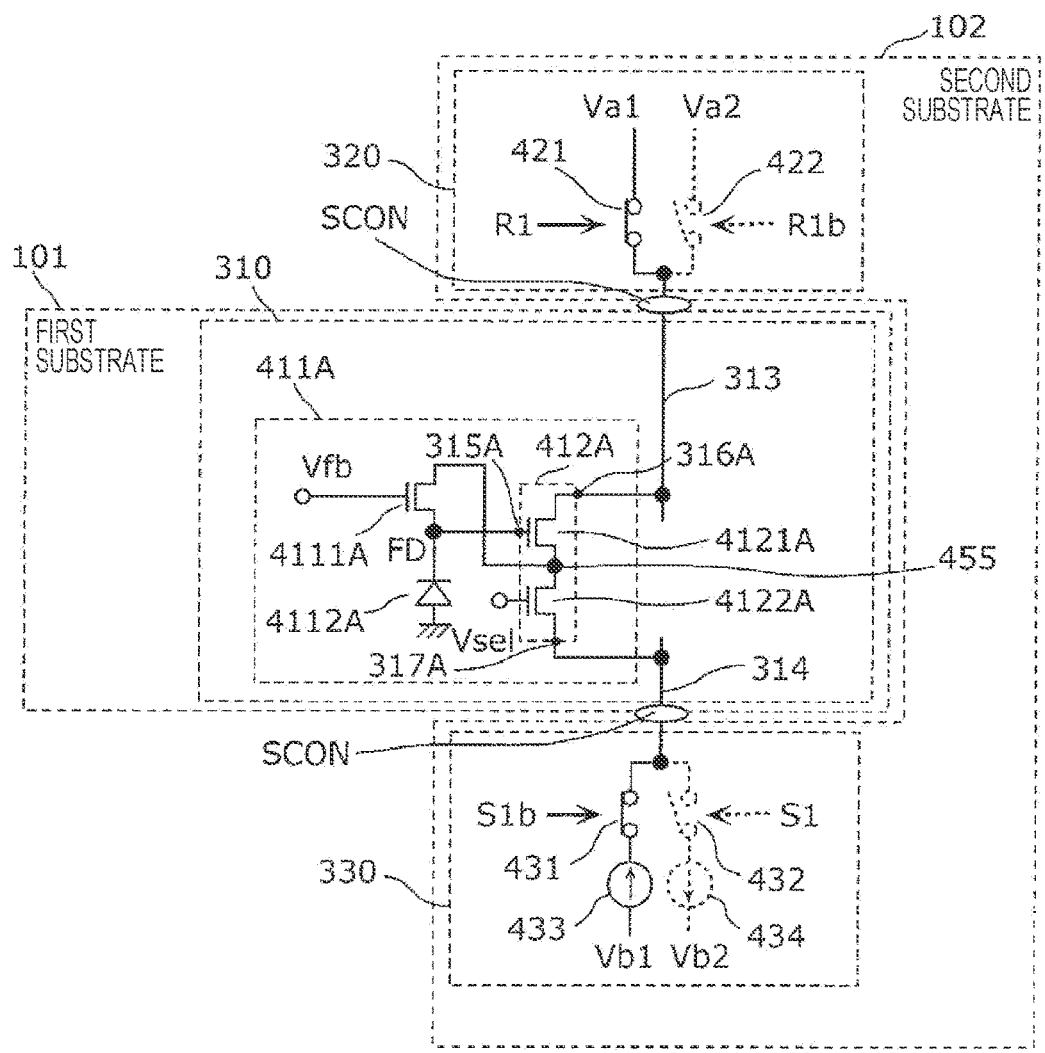
FIG. 5B is a schematic diagram illustrating one example of the operation of the imaging device according to the first embodiment.

Meanwhile, when the charge accumulation region FD is reset or when an electronic shutter operation is performed, the imaging device 100 enters a connection state as illustrated in FIG. 5B. Specifically, the amplifying transistor 4121A operates as an input transistor for a source-grounded amplifier, and the constant current source 433 operates as a load current source for the source-grounded amplifier, so that the amplifying transistor 4121A and the constant current source 433 operate as a source-grounded amplifier having a gain that is several tens of times larger. In this case, a node 455 between the selecting transistor 4122A and the amplifying transistor 4121A serves as an output of the source-grounded amplifier. The node 455 is connected to the charge accumulation region FD via the band control transistor 4111A to thereby form a negative feedback circuit. A feedback gain of the negative feedback circuit in this case corresponds to the gain of the source-grounded amplifier.

Details of this operation will be described below.

FIG. 6 is a timing chart illustrating one example of the operation of the imaging device 100. The horizontal axis in each graph represents time. In the vertical axis, Vsel(A) represents a voltage in a selection control signal line Vsel(A) which is supplied to the pixel 411A in the nth row. Vfb(A) represents a voltage in a band control signal line Vfb(A) which is supplied to the pixel 411A in the nth row. Vsel(B) represents a voltage in a selection control signal line Vsel(B) which is supplied to the pixel 411B in the (n+1)th row. Vfb(B) represents a voltage in a band control signal line Vfb(B) which is supplied to the pixel 411B in the (n+1)th row. R1 represents the control signal for the switching element 421 in the bias control circuit 320. R1*b* represents the control signal for the switching element 422. S1 represents a control signal for a switching element 432A in the constant current source circuit 330. S1*b* represents a control signal for the switching element 431. V313 represents a voltage in the bias signal line 313 which is controlled by the bias control circuit 320. VS(A) represents a voltage at the other of the source and the drain of the amplifying transistor 4121A in the pixel 411A. VS(B) represents a voltage at the other of the source and the drain of the amplifying transistor 4121B in the pixel 411B.

A detailed description will be given below using the reference numerals of the constituent elements in the pixel 411A.

(Signal-Charge Reading Period)

At time t1, the voltage in the selection control signal line Vsel(A) is set to a high level to turn on the selecting transistor 4122A. Also, the control signal R1*b* is set to a high level to turn on the switching element 422. As a result, the voltage of the voltage source Va2 is applied to the other of the source and the drain of the amplifying transistor 4121A. In addition, the control signal S1 is set to a high level to put the switching element 432 in the constant current source circuit 330 into an on state. On/off states of the switching elements and the transistors at this point in time are illustrated in FIG. 5A. In this state, the amplifying transistor 4121A and the constant current source 434 form a source follower circuit. The potential in the output signal line 314 reaches a voltage VSIG(A) corresponding to the signal charge accumulated in the charge accumulation region FD. The source follower circuit has an amplification factor of about 1.

The voltage at the charge accumulation region FD changes relative to a reset voltage VRST (described below) by an amount corresponding to the voltage corresponding to the signal charge generated by the photoelectric converter 4112A in the period from the reset operation in the pixel 411A to time t1.

(Reset Period)

At time t2 in FIG. 6, the voltage in the selection control signal line Vsel(A) remains at the high level. Accordingly, the selecting transistor 4122A is in the on state. Also, at time t2, the voltage in the band control signal line Vfb(A) is set to a high level to put the band control transistor 4111A into an on state. Also, at time t2, the control signal R1 is set to a high level. As a result, the switching element 421 in the bias control circuit 320 enters an on state, so that the voltage of the voltage source Va1 is applied to the other of the source and the drain of the amplifying transistor 4121A. In addition, at time t2, the control signal S1b is set to a high level. As a result, the switching element 431 in the constant current source circuit 330 enters an on state, so that the constant current source 433 is connected to the one of the source and the drain of the selecting transistor 4122A. At time t2, the selecting transistor 4122A, the amplifying transistor 4121A, and the constant current source 433 form a source-grounded amplifier circuit. In addition, since the band control transistor 4111A is in the on state, input/output ends of the source-grounded amplifier circuit enter a short-circuited state. The on/off states of the switching elements and the transistors at this point in time are illustrated in FIG. 5B. At time t2, the switching elements and the transistors in the imaging device 100 are put into the states as illustrated in FIG. 5B, so that the voltage at the charge accumulation region FD is reset to the reset voltage VRST.

At time t2, the voltage in the band control signal line Vfb(A) is set to the high level, so that the operating band of the band control transistor 4111A is set to a first band, which is a wide band. This allows the voltage at the charge accumulation region FD to reach the reset voltage VRST at high speed.

In the present embodiment, this reset period is provided in order to set the voltage at the charge accumulation region FD to the reset voltage VRST at high speed. However, if there is a plenty of time for the drive time, the operation for setting the voltage at the charge accumulation region FD to the reset voltage VRST in a noise reduction period (described below) may be performed without providing the reset period.

(Noise Reduction Period)

Next, at time t3 in FIG. 6, the voltage in the band control signal line Vfb(A) is set to a voltage between the high level and the low level. For example, the voltage in the band control signal line Vfb(A) is set to an intermediate voltage between the high level and the low level. In this case, the operating band of the band control transistor 4111A becomes a second band, which is narrower than the first band.

When the second band is made sufficiently narrower than the operating band of the amplifying transistor 4121A, the noise reduction effect increases. On the other hand, the time from time t3 to time t5, that is, the time taken for the noise reduction, increases. Even when the second band is wider than the operating band of the amplifying transistor 4121A, the noise reduction effect is obtained. Hence, a designer can arbitrarily design the second band in accordance with an allowable noise reduction time. The second band is described below as a band that is sufficiently narrower than the operating band of the amplifying transistor 4121A.

When the second band is narrower than the operating band of the amplifying transistor 4121A, thermal noise generated in the band control transistor 4111A is reduced by a feedback circuit. When the amplification factor of the source-grounded amplifier circuit formed by the selecting transistor 4122A, the amplifying transistor 4121A, and the constant current source 433 is assumed to be −A, the thermal noise is reduced to $1/(1+A)^{1/2}$ times. Typically, A is larger than 1 and may be set to a numeral value in the range of about a few tens to several hundred.

Next, at time t5, the voltage in the band control signal line Vfb(A) is set to the low level to turn off the band control transistor 4111A. Also, kTC noise that remains in the charge accumulation region FD when the band control transistor 4111A is turned off is reduced to $1/(1+A)^{1/2}$ times, compared with a case in which there is no feedback.

(Reset Voltage Reading Period)

After the reset operation and the noise reduction operation in the pixel 411A are completed, the control signal R1b and the control signal S1 are set to the high level again at time t5 in FIG. 6. That is, the switching element 422 in the bias control circuit 320 and the switching element 432 in the constant current source circuit 330 are put into the on state again to form the source follower circuit illustrated in FIG. 5A. In this state, the reset voltage VRST is read from the charge accumulation region FD.

Effects of the first embodiment will be described with reference to FIGS. 7 to 9.

Figure 7:
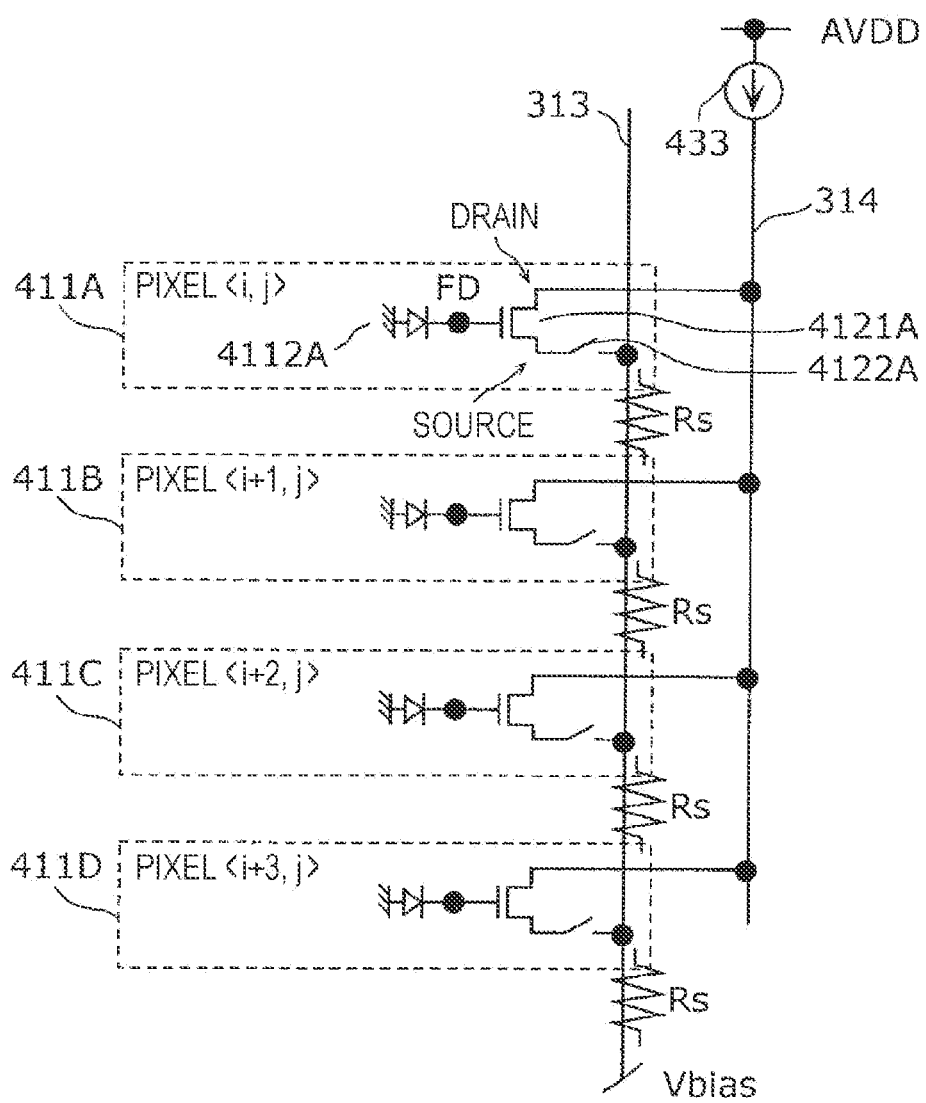
FIG. 7 is a schematic diagram illustrating a circuit configuration of an imaging device in a reference example during reset.

FIG. 7 schematically illustrates a circuit configuration of an imaging device in a reference example during a reset operation. In this circuit configuration, pixels and peripheral circuitry are provided in the same substrate.

In FIG. 7, four pixels, each being the same as the pixel illustrated in FIG. 3, are illustrated in one column. Pixels 411A to 411D are connected to the same bias signal line 313 and the same output signal line 314. A bias voltage Vbias is applied from a voltage source (not illustrated) to the bias signal line 313, and current is passed from the constant current source 433 to the output signal line 314.

In the imaging device 100 illustrated in FIG. 7, for resetting the pixel 411A, the selecting transistor 4122A is turned on to thereby form a source-grounded circuit in which the constant current source 433 serves as a load and the amplifying transistor 4121A serves as a transistor for amplifying a signal voltage.

In this case, however, this state is analogous to a state in which a wiring resistance Rs of the bias signal line 313 is connected to the source of the amplifying transistor 4121A. The wiring resistance Rs increases in the pixel 411A that is farther from the voltage source than in the pixel 411D.

Comparison of source-grounded circuit operations depending on the presence/absence of the above-described wiring resistance Rs will be made with reference to FIGS. 8A and 8B.

Figure 8A:
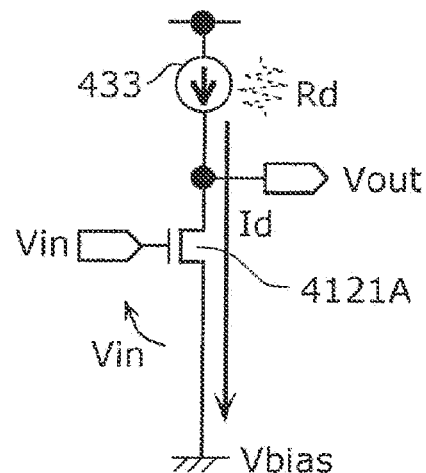
FIG. 8A is a schematic diagram illustrating an operation of a source-grounded circuit when no wiring resistance is added to a source.
Figure 8B:
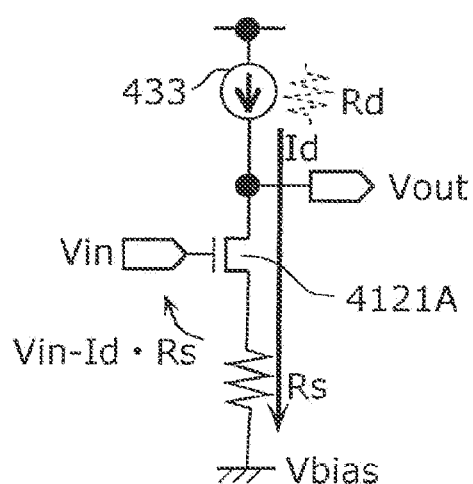
FIG. 8B is a schematic diagram illustrating an operation of the source-grounded circuit when a wiring resistance is added to the source.

In FIGS. 8A and 8B, Vin represents an input to the source-grounded circuit. The charge accumulation region FD is connected to the input Vin. Vout represents an output of the source-grounded circuit.

Using a load resistance Rd of the constant current source 433 and a mutual conductance gm of the amplifying transistor 4121A, a gain Av in the source-grounded circuit illustrated in FIG. 8A is given by $AV=-gm \times Rd$.

On the other hand, when the wiring resistance Rs is connected to the source of the amplifying transistor 4121A, as in FIG. 8B, current Id that flows through the source-grounded circuit flows to the wiring resistance Rs. Consequently, a gate-source voltage VGS input to the source-grounded circuit is attenuated from Vin by an amount given by Id×Rs. This phenomenon is called source degeneration. Owing to this phenomenon, the gain Av of the source-grounded circuit decreases to a gain given by $Av=(-gm \times Rd)/(1+gm \times Rs)$. Thus, in the source-grounded circuit, it is desirable to reduce the wiring resistance Rs connected to the source of the amplifying transistor 4121A.

Figure 9:
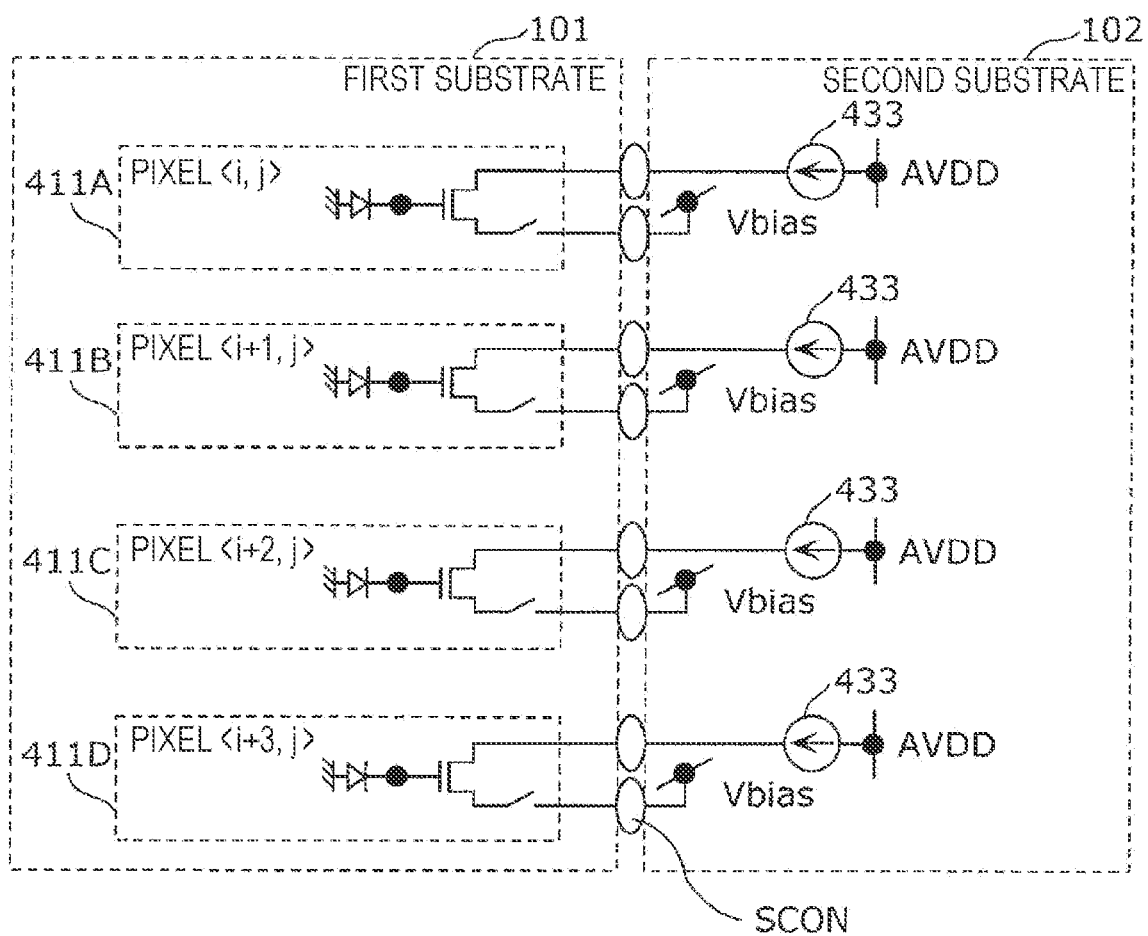
FIG. 9 is a schematic diagram illustrating one example of source degeneration countermeasures according to the first embodiment.

FIG. 9 illustrates the configuration of the imaging device in the first embodiment. In FIG. 9, bias signal lines, output signal lines, the constant current sources 433, and voltage sources for applying the bias voltages Vbias are provided for respective pixels. The constant current sources 433 and the voltage sources are arranged in a substrate that is different from a substrate in which the pixels are arranged, and are brought close to the pixels. For example, a first substrate 101 in which the pixels are provided and a second substrate 102 in which the constant current sources 433 and the voltage sources are provided can be arranged one above another, and the constant current sources 433 and voltage sources may be arranged at positions in the second substrate and directly below the corresponding pixels. This makes it possible to reduce the distance between the pixels and the constant current sources 433 and the distance between the pixels and the voltage sources. Such a configuration makes it possible to reduce the wiring resistances Rs. In addition, since the lengths of the bias signal lines 313 and the output signal lines 314 that extend from the pixels to outside of the pixel array can be reduced, parasitic capacitances that accompany the bias signal lines 313 and the output signal lines 314 can be reduced. This makes it possible to reduce the amount of current that flows to the bias signal lines 313 and the output signal lines 314.

Figure 10A:
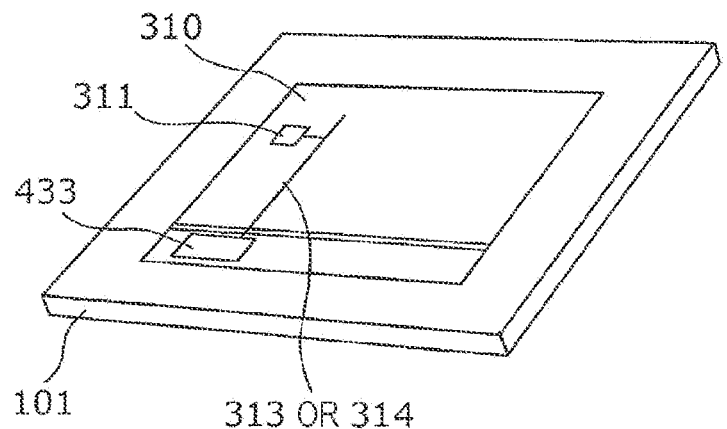
FIG. 10A is a schematic view illustrating a relationship between the pixels and a voltage source and a constant current source when the constant current source and the voltage source are formed in a first substrate.
Figure 10B:
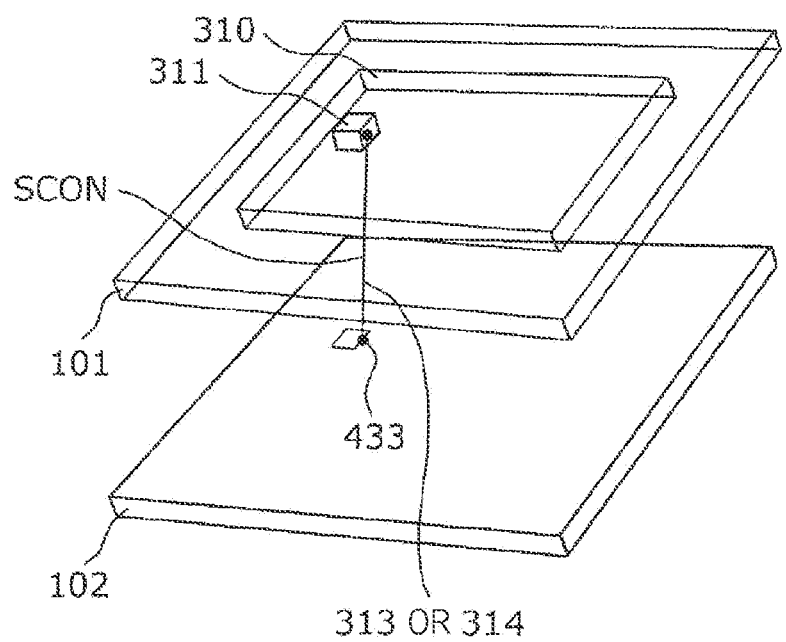
FIG. 10B is a schematic view illustrating a relationship between the pixels and the constant current source and the voltage source when the constant current source and the voltage source are formed in a second substrate.

The distance between the pixels and the constant current source 433 and the voltage source will be described with reference to FIGS. 10A and 10B. FIG. 10B depicts the first substrate 101 in a perspective view in order to help viewing. FIG. 10A is a view illustrating one example of the positional relationship between the pixels and one constant current source 433 in the reference example. FIG. 10B illustrates one example of the positional relationship between the pixels and one constant current source 433 in the present embodiment.

In the configuration illustrated in FIG. 10A, all pixels belonging to the same column are connected to the same output signal line 314 and the same bias signal line 313. In this case, the distance between the pixel that is the farthest from the constant current source 433 and the constant current source 433 increases, as the size of the pixel array 310 increases. For example, when the constant current source 433 is provided only at the lower side of the pixel array 310, the size of the pixel array 310 in the row directions directly corresponds to the length of the output signal line 314 and the bias signal line 313. Thus, the wiring resistances in the output signal line 314 and the bias signal line 313 increase. Also, the output signal line 314 and the bias signal line 313 pass through all the pixels arranged in the same column. In this case, it is difficult to make the thickness of the output signal line 313 and the bias signal line 313 larger than a certain thickness. There is also a possibility that parasitic capacitances occur between the signal lines. Thus, in the configuration in the reference example, there is a possibility that the wiring resistances increase.

On the other hand, in FIG. 10B, each pixel can be connected to the corresponding constant current source 433 that is provided in the second substrate and directly below the pixel. Thus, the distance of the output signal line 314 and the bias signal line 313 does not depend on the size of the pixel array 310. In addition, since the output signal line 314 and the bias signal line 313 do not need to be designed so as to pass through the pixels, the thickness of the output signal line 314 and the bias signal line 313 can be made larger than a certain thickness.

This configuration makes it possible to allow for pixel parallel reading and pixel block parallel reading that further increase the data rate.

In the configuration in the present embodiment, even when the size of the pixel array 310 is large, it is possible to reduce the connection distance from the detection circuit 312 in each pixel to a column circuit, such as the constant current source 433. Also, for example, when the thickness of each substrate connection portion SCON is increased, the wiring resistances can be further reduced.

In the configuration in the present embodiment, the number of circuits connected to each pixel can also be increased compared with the reference example. In the configuration in the reference example, for example, a column circuit, such as an AD conversion circuit, is connected to all the pixels belonging to the same column. For example, when the pixel size is about a few micrometers, the number of column circuits connected to each column is 1 or 2. This is because the width of column circuits connected to each column needs to be smaller than the width of the pixels, and the area in which the column circuits can be arranged is limited to the periphery of the pixel array. On the other hand, in the present embodiment, the column circuits can be arranged in the second substrate 102. Also, the column circuits, which are arranged for each column in the reference example, can also be arranged for each pixel. Thus, in the present embodiment, the number of circuits connected to the pixels can be increased to a number that is equivalent or close to the number of pixels.

Although, in the configuration illustrated in FIG. 9, one constant current source 433 and one voltage source are provided for each pixel, the constant current source 433 and the voltage source may be provided for every two or more pixels.

Figure 11:
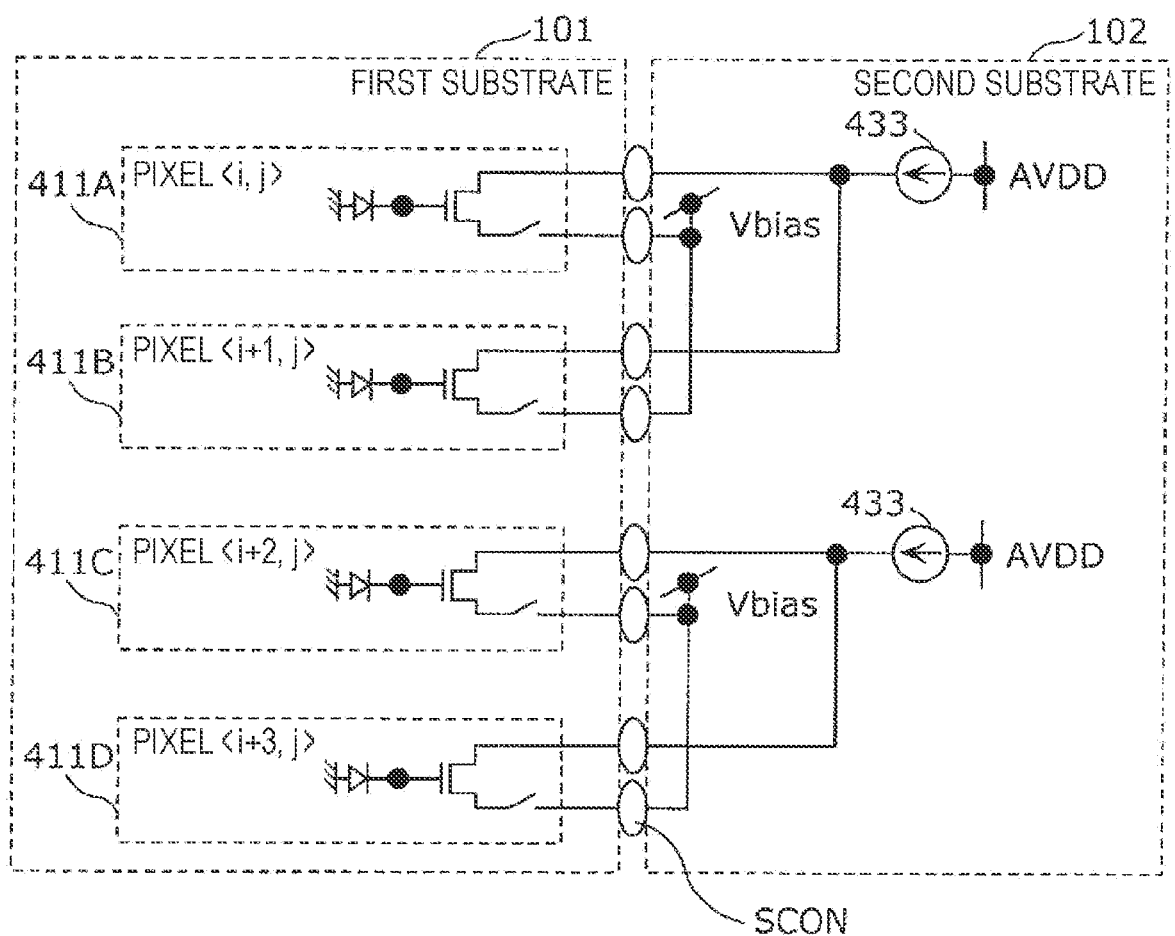
FIG. 11 is a schematic diagram illustrating another example of the source degeneration countermeasures according to the first embodiment.
Figure 12:
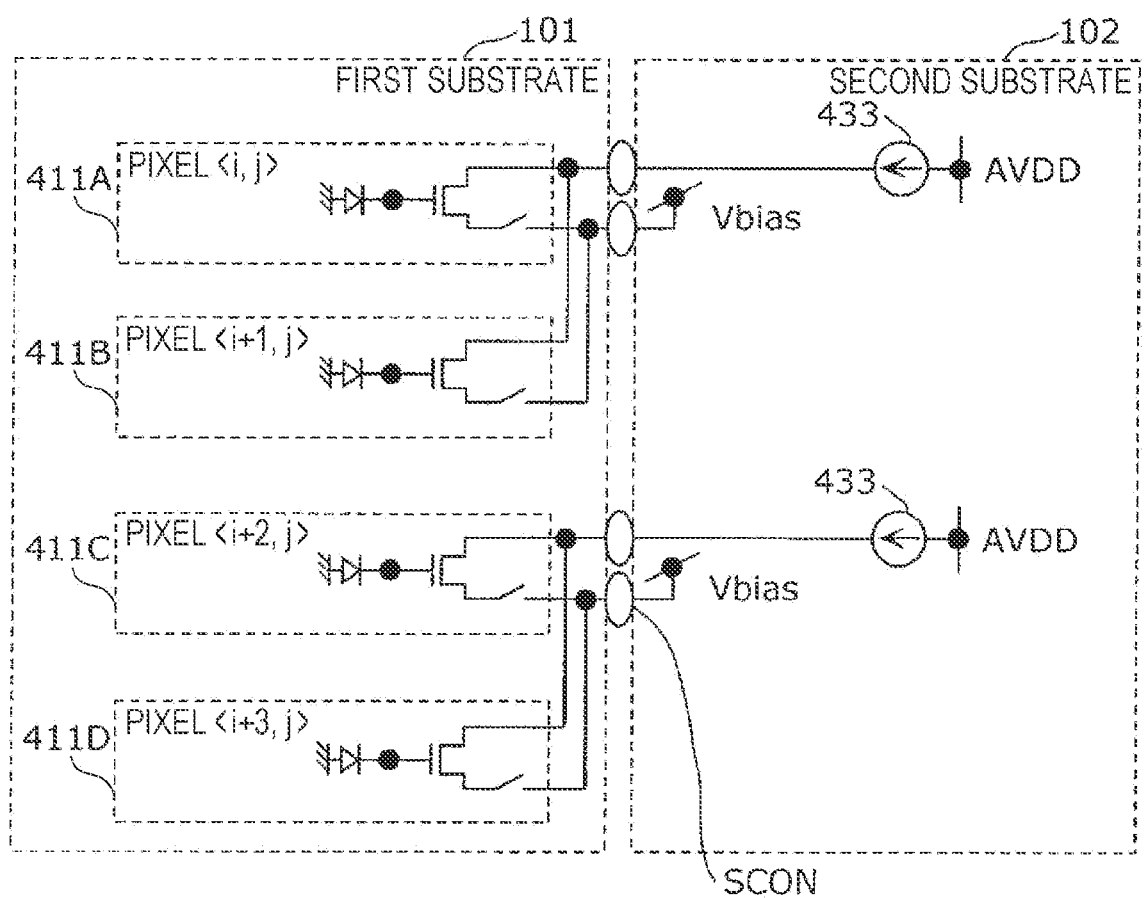
FIG. 12 is a schematic diagram illustrating still another example of the source degeneration countermeasures according to the first embodiment.

FIGS. 11 and 12 illustrate modifications of the present embodiment.

FIG. 11 illustrates a configuration in which the constant current source 433 and the voltage source are provided for every two pixels.

In FIG. 12, the sources of amplifying transistors in every two pixels are connected to each other on a first substrate 101, the drains of the amplifying transistors therein are connected to each other, and the connected sources and the connected drains are connected to a second substrate. This reduces the number of substrate connection portions SCON. This makes it possible to reduce the possibility that a failure occurs in the connection between the substrates. This also makes it possible to increase the gap between the substrate connection portions SCON. In other words, the connection pitch can be relaxed. Thus, for example, the sizes of the substrate connection portions SCON can be increased, thus making it possible to reduce the possibility that a failure occurs in the connection between the substrates. Accordingly, a reduction in the number of substrate connection portions SCON can reduce a yield decline due to a failure in the connection between the substrates.

Figure 13:
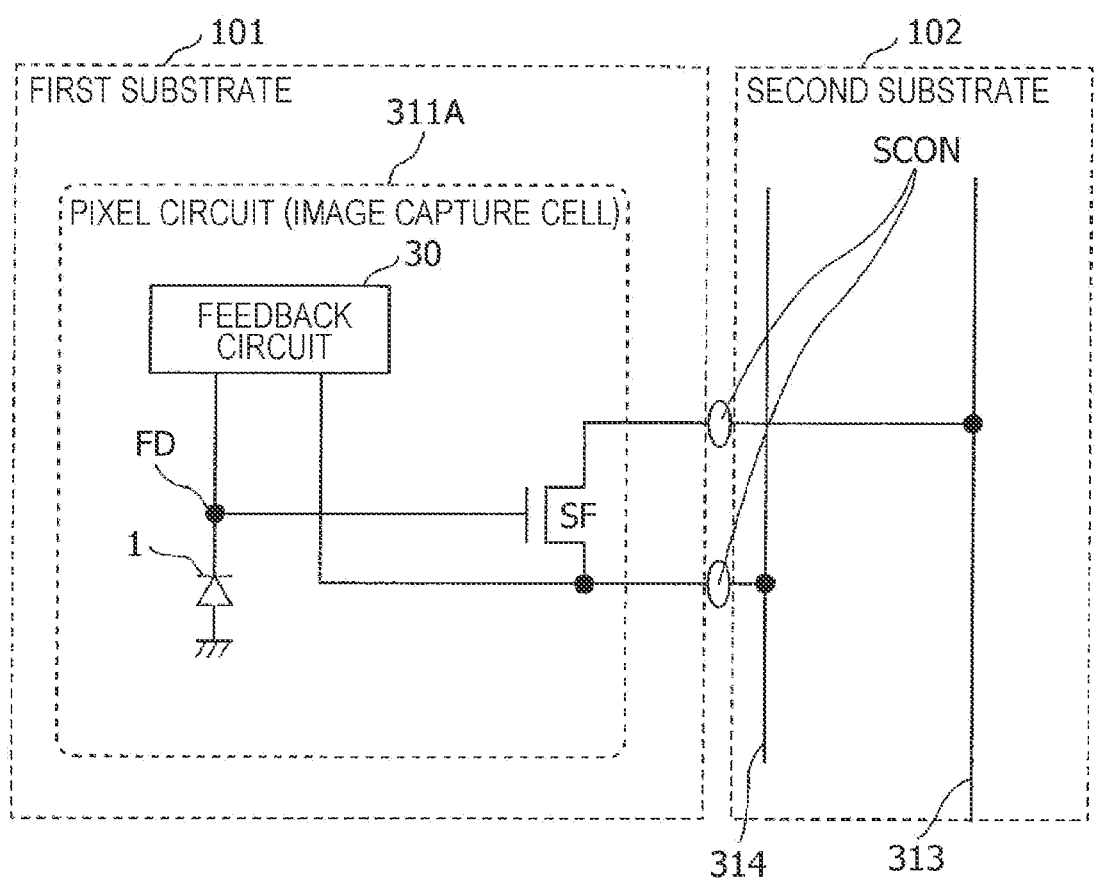
FIG. 13 is a schematic diagram schematically illustrating substrate connection portions according to the first embodiment.
Figure 14:
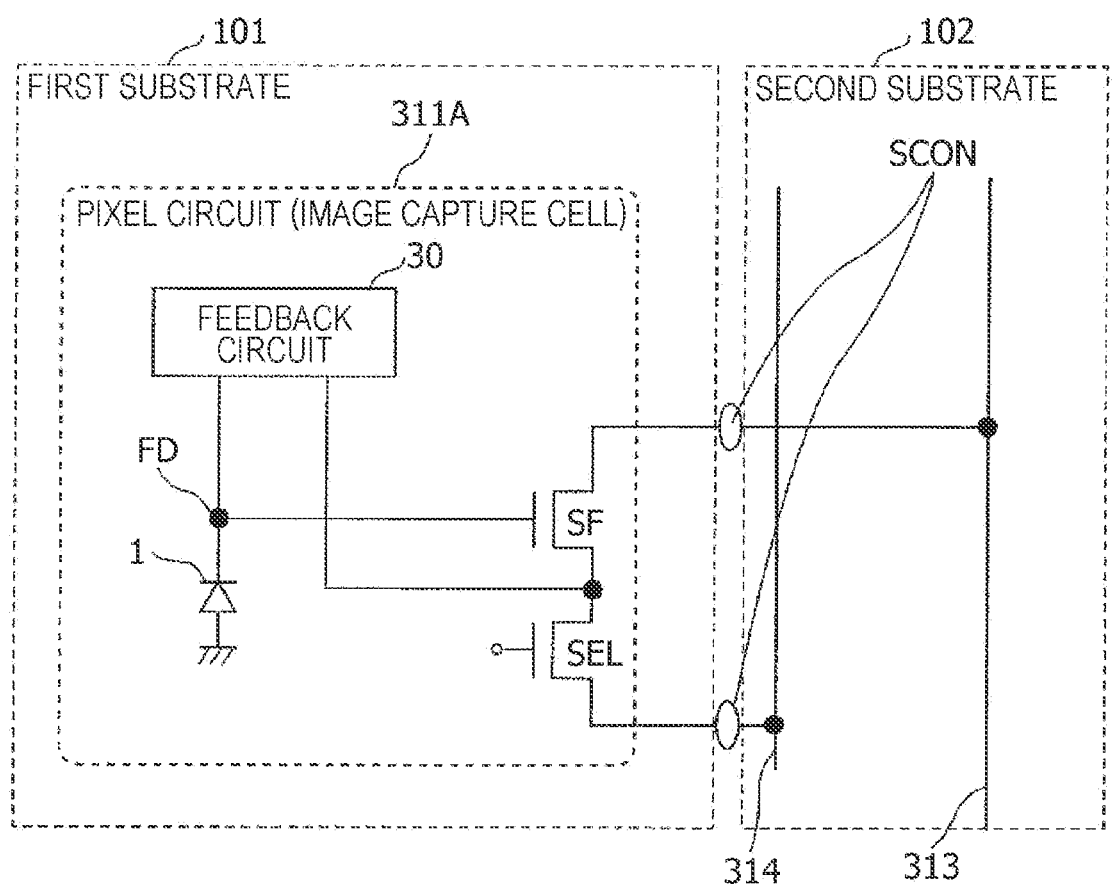
FIG. 14 is a schematic diagram schematically illustrating the substrate connection portions according to the first embodiment.

FIGS. 13 and 14 are schematic diagrams each illustrating a configuration having a feedback configuration in each pixel in the first embodiment. As illustrated in FIG. 13, a pixel 311A provided in the first substrate 101 has a feedback circuit 30 in its pixel circuit. A bias voltage is applied to the pixel 311A from the second substrate 102 through the bias signal line 313, so that the feedback circuit 30 in the pixel circuit operates. The voltage applied to the bias signal lines 313 may have a potential that differs among a signal-charge reading period, the reset period, and the noise reduction period. As illustrated in FIG. 14, a selecting transistor SEL (the selecting transistor 4122A) may also be arranged in each pixel 311A. When the selecting transistor SEL is arranged in the first substrate 101, electrical connection with the second substrate 102 can be switched in the first substrate 101. Although, in FIG. 14, the selecting transistor SEL (the selecting transistor 4122A) is connected to one of the source and the drain of the amplifying transistor 4121A, the selecting transistor SEL may be connected to both.

Figure 15:
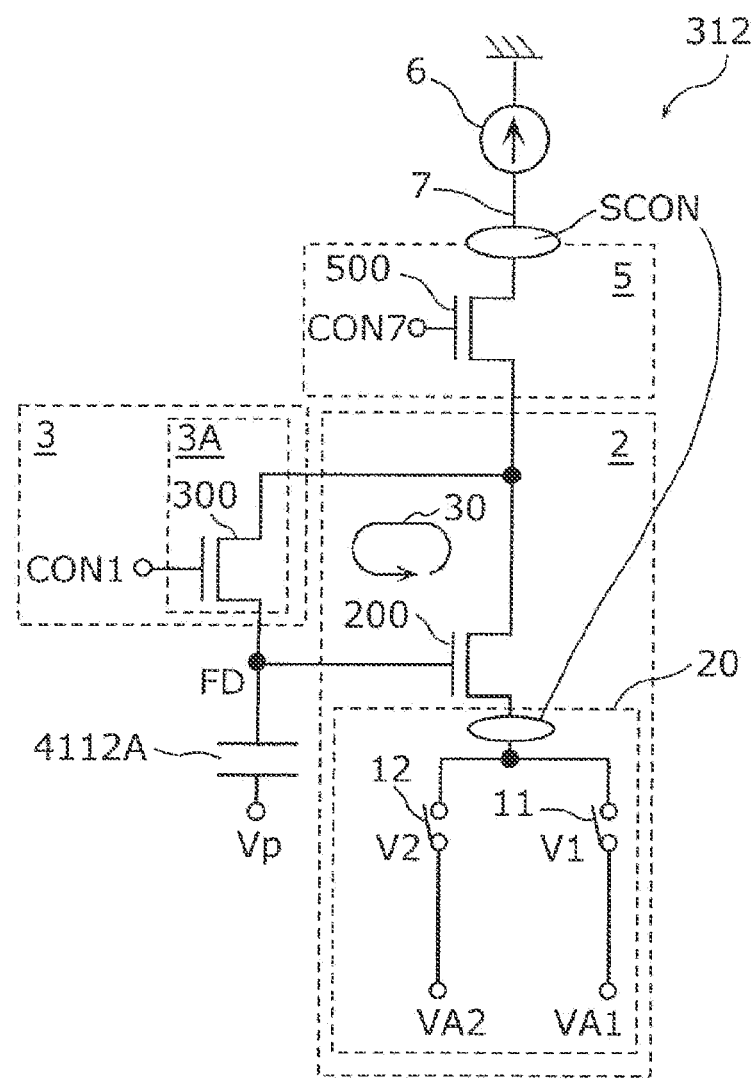
FIG. 15 is a schematic diagram illustrating an exemplary circuit configuration of a detection circuit according to the first embodiment.

FIG. 15 schematically illustrates a circuit configuration of the detection circuit 312. The feedback circuit 30 forms a feedback path through which a signal voltage corresponding to the signal charge generated in the photoelectric converter 4112A is negatively fed back via an amplifying transistor 200.

An amplifier 2 has the amplifying transistor 200 and a switching circuit 20 including switching elements 11 and 12. The transistors in the detection circuit 312 are assumed to be NMOS transistors. A relationship of electrical connections in the detection circuit 312 will be described below.

A charge accumulation region FD is connected to a gate of the amplifying transistor 200. A band controller 3 includes a band control transistor 300. An output selector 5 includes a selecting transistor 500. One of a source and a drain of the amplifying transistor 200 is connected to one of a source and a drain of the band control transistor 300 and one of a source and a drain of the selecting transistor 500. The other of the source and the drain of the band control transistor 300 is connected to the charge accumulation region FD. The band control transistor 300 and a capacitance component that is parasitic in the charge accumulation region FD form an RC filter circuit.

A band control signal line CON1 is connected to a gate of the band control transistor 300. The state of the band control transistor 300 is determined according to a voltage in the band control signal line CON1. For example, when the voltage in the band control signal line CON1 is at a high level, the band control transistor 300 is turned on. As a result, the charge accumulation region FD, the amplifying transistor 200, and the band control transistor 300 form a feedback path.

When the voltage in the band control signal line CON1 decreases, the resistance component in the band control transistor 300 increases. Thus, the bandwidth of the band control transistor 300 decreases, and the frequency range of a signal that is fed back decreases. When the voltage in the band control signal line CON1 decreases further to reach a low level, the band control transistor 300 is turned off. As a result, the feedback path is not formed.

The other of the source and the drain of the selecting transistor 500 is connected to a signal reading line 7. The signal reading line 7 corresponds to the above-described output signal line 314. A gate of the selecting transistor 500 is controlled through a selection control signal line CON7. The state of the selecting transistor 500 is determined according to a voltage in the selection control signal line CON7. For example, when the voltage in the selection control signal line CON7 is at a high level, the selecting transistor 500 is turned on. As a result, the amplifying transistor 200 and the signal reading line 7 are electrically connected to each other. When the voltage in the selection control signal line CON7 is at a low level, the selecting transistor 500 is turned off. As a result, the amplifying transistor 200 and the signal reading line 7 are electrically separated from each other.

The switching circuit 20 is connected to the other of the source and the drain of the amplifying transistor 200. Specifically, the other of the source and the drain of the amplifying transistor 200 is connected to a voltage source VA1 via the switching element 11. The other of the source and the drain of the amplifying transistor 200 is also connected to a voltage source VA2 via the switching element 12. The switching circuit 20 is controlled according to control signals V1 and V2, to thereby switch a voltage to be applied to the other of the source and the drain of the amplifying transistor 200 to a voltage Va1 of the voltage source VA1 or a voltage Va2 of the voltage source VA2. The voltage Va1 of the voltage source VA1 is, for example, a ground voltage GND. The voltage Va2 of the voltage source VA2 is, for example, a power-supply voltage VDD. The switching circuit 20 may be provided for each pixel or may be shared by two or more pixels in order to reduce the number of elements per pixel.

A constant current source 6 is connected to the signal reading line 7. When the selecting transistor 500 is in the on state, the selecting transistor 500, the amplifying transistor 200, and the constant current source 6 form a source follower circuit. The signal corresponding to the signal charge accumulated in the charge accumulation region FD is output to the signal reading line 7 and is read to outside. The constant current source 6 may be provided for each pixel or may be shared by two or more pixels in order to reduce the number of elements per pixel.

Figure 16:
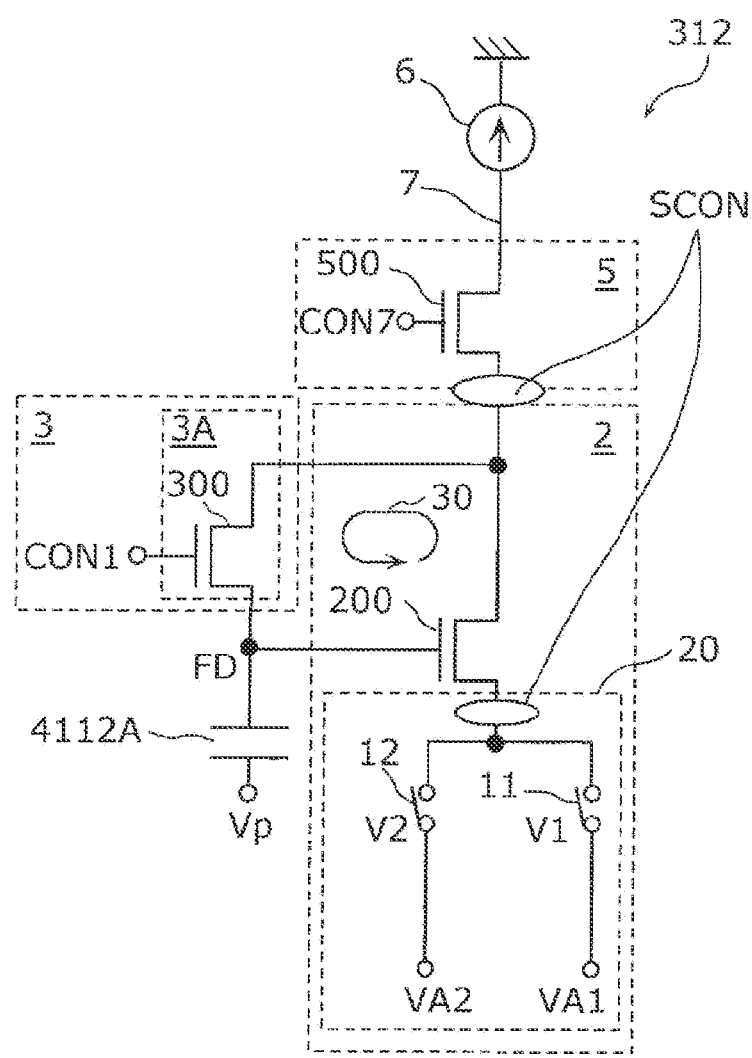
FIG. 16 is a schematic diagram illustrating an exemplary circuit configuration of the detection circuit according to the first embodiment.

FIG. 16 schematically illustrates another circuit configuration of the detection circuit 312. As illustrated in FIG. 16, the position of one of the substrate connection portions SCON may be located between the amplifier 2 and the output selector 5.

(Operation of Imaging Device 100)

Next, an operation flow of the detection circuit 312 will be described with reference to FIG. 17.

Figure 17:
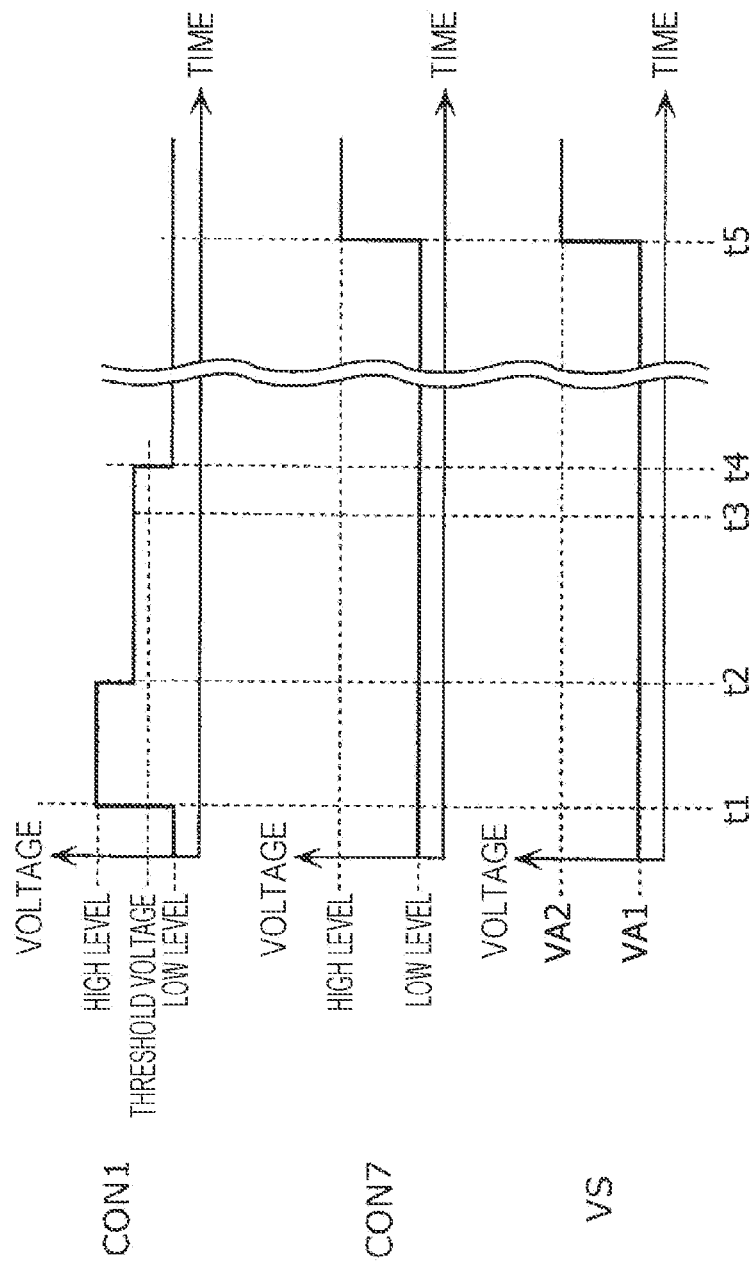
FIG. 17 is a timing chart illustrating one example of an operation of the detection circuit according to the first embodiment.

FIG. 17 is a timing chart illustrating one example of the operation of the detection circuit 312. The horizontal axis in each graph represents time. In the vertical axis, CON1 represents a voltage in the band control signal line CON1. CON7 represents a voltage in the selection control signal line CON7, and VS represents a voltage at the other of the source and the drain of the amplifying transistor 200.

(Reset Period)

At time t1, the voltage in the selection control signal line CON7 is at the low level. Accordingly, the selecting transistor 500 is in an off state, so that the amplifying transistor 200 and the signal reading line 7 are electrically separated from each other. Also, at time t1, the voltage in the band control signal line CON1 is set to the high level to put the band control transistor 300 into an on state. Also, at time t1, the switching element 11 in the switching circuit 20 is in an on state, so that the voltage Va1 (e.g., GND) is applied to the other of the source and the drain of the amplifying transistor 200. Thus, the voltage at the charge accumulation region FD becomes equal to the reset voltage VRST.

In this case, the voltage in the band control signal line CON1 is set so that the operating band of the band control transistor 300 becomes a first band, which is a wide band. Thus, the voltage at the charge accumulation region FD can be set to the reset voltage VRST at high speed. The first band refers to the operating band of the band control transistor 300 which corresponds to the gate voltage at the high level.

In the present embodiment, the reset period is provided in order to set the voltage at the charge accumulation region FD to the reset voltage VRST at high speed. However, if there is a plenty of time for the drive time, the operation for setting the charge accumulation region FD to the reset voltage VRST in a noise reduction period (described below) may be performed without providing the reset period.

(Noise Reduction Period)

Next, in the period from time t2 to time t4, the voltage in the band control signal line CON1 is set to a voltage between the high level and the low level, for example, to an intermediate voltage therebetween. In this case, the operating band of the band control transistor 300 becomes a second band, which is narrower than the first band. The second band refers to the operating band of the band control transistor 300 when the gate voltage is the intermediate voltage.

When the second band is made sufficiently narrower than the operating band of the amplifying transistor 200, the noise reduction effect increases. However, the time from time t2 to time t4 increases. Even when the second band is wider than the operating band of the amplifying transistor 200, the noise reduction effect is obtained. Hence, a designer can arbitrarily design the second band in accordance with an allowable time from time t2 to time t4. The second band will be described below as a band that is sufficiently narrower than the operating band of the amplifying transistor 200.

When the second band is narrower than the operating band of the amplifying transistor 200, thermal noise that is generated in the band control transistor 300 is reduced by the feedback circuit. When the amplification factor of the amplifier 2 is −A, the thermal noise is reduced to $1/(1+A)^{1/2}$ times.

The switching circuit 20 is set so that the voltage at the other of the source and the drain of the amplifying transistor 200 reaches GND. A designer can design the amplification factor of the amplifier 2 so that it has an optimum value for the circuit system. Typically, A is larger than 1 and may be set to a numeral value in the range of about a few tens to several hundred.

Next, at time t4, when the voltage in the band control signal line CON1 is set to the low level to turn off the band control transistor 300, kTC noise that remains in the charge accumulation region FD when it is turned off is also reduced to $1/(1+A)^{1/2}$ times, compared with a case in which there is no feedback.

(Exposure/Reading Period)

At time t5, the voltage in the selection control signal line CON7 is set to the high level to turn on the selecting transistor 500. Also, the switching circuit 20 is controlled so that the voltage at the other of the source and the drain of the amplifying transistor 200 reaches the voltage Va2 (e.g., VDD). That is, the switching element 12 is turned on, so that the voltage Va2 is applied to the other of the source and the drain of the amplifying transistor 200. In this state, the amplifying transistor 200 and the constant current source 6 form a source follower circuit. A voltage in the signal reading line 7 then reaches the voltage corresponding to the signal charge accumulated in the charge accumulation region FD. At this point in time, the amplification factor of the source floor circuit is about 1.

At time t5, the voltage at the charge accumulation region FD changes relative to the reset voltage VRST by an amount corresponding to the voltage corresponding to the signal charge generated in the photoelectric converter 4112A in the period from time t4 to time t5. The amplifier 2 amplifies the voltage at the charge accumulation region FD with an amplification factor of about 1 and outputs the amplified voltage to the signal reading line 7.

Random noise means fluctuation of an output when the signal charge generated by the photoelectric converter 4112A is 0, that is, means kTC noise. The kTC noise is reduced to $1/(1+A)^{1/2}$ times in the noise reduction period and is further output to the signal reading line 7 with an amplification factor of about 1 in an exposure/reading period. Accordingly, in the present embodiment, it is possible to obtain favorable image data in which the random noise is reduced.

Also, according to the present embodiment, CDS can also be performed in order to cancel variations in the peripheral circuitry. Specifically, after the source follower circuit reads the signal voltage at the charge accumulation region FD, the above-described reset operation is performed again. After the reset operation is completed, the source follower circuit performs the reading operation again before the photoelectric converter 4112A performs light detection. This makes it possible to read the reset voltage VRST. The CDS can be performed by determining a difference between the signal voltage at the charge accumulation region FD and the reset voltage VRST.

Also, in the present embodiment, in the exposure period, since the signal voltage at the charge accumulation region FD is read by the source follower circuit, the amplification factor is about 1. However, the present disclosure is not limited to this example, and a designer may vary the amplification factor in accordance with a signal-to-noise (S/N) ratio or a circuit range required for the system.

According to the present embodiment, the feedback for noise cancelling is performed in each of the pixels 311. Thus, the noise cancelling can be performed at high speed without being affected by the time constant of the signal reading line 7.

Lastly, another control method for the band control signal line CON1 will be described with reference to FIG. 18.

Figure 18:
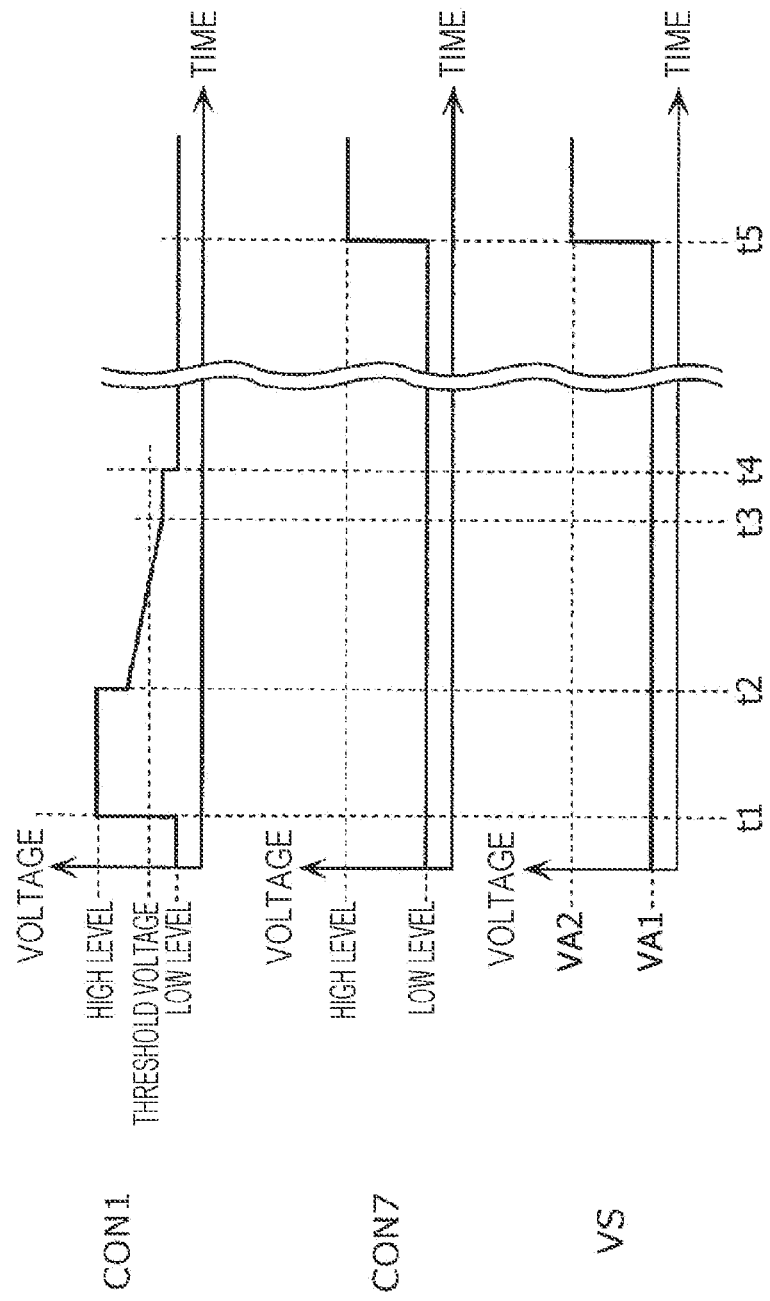
FIG. 18 is a timing chart illustrating another example of the operation of the detection circuit according to the first embodiment.

FIG. 18 is a timing chart illustrating another example of the operation of the detection circuit 312. As illustrated in FIG. 18, the band control signal line CON1 may be controlled so that the band control transistor 300 changes gradually from the on state to the off state across a threshold voltage of the band control transistor 300. Such reset control is herein referred to as "tapered reset".

This makes it possible to effectively reduce noise that is generated in all pixels even when the threshold voltage of the band control transistor 300 varies between two or more pixels 311 included in the imaging device 100. The range of changes in the voltage applied to the band control signal line CON1 in the tapered reset may be limited to the range of variations in the threshold voltage of the band control transistor 300 in each pixel. This makes it possible to reduce the time taken for the tapered reset and makes it possible to perform the noise reduction at high speed.

In the present embodiment, the photoelectric converter 4112A is arranged in the first substrate 101, and the constant current source circuit 330 and so on are provided in the second substrate 102. The first substrate 101 and the second substrate 102 may be connected at portions of the substrate connection portions SCON, as in FIGS. 15 and 16. In FIG. 15, the selecting transistor 500 is arranged in the first substrate 101, and in FIG. 16, the selecting transistor 500 is arranged in the second substrate 102. The selecting transistors 500 may be prepared in both the first and second substrates 101 and 102. Also, the selecting transistor 500 allows the constant current source circuit 330 and the substrate connection portion SCON to be shared for each pixel, and when the selecting transistors 500 are provided in both the first and second substrates 101 and 102, the number of elements to be shared can also be changed in each of the first and second substrates 101 and 102.

One feature in the present disclosure relates to nodes when the first substrate 101 and the second substrate 102 are stacked. One feature in the present disclosure lies in that the first substrate 101 and the second substrate 102 are connected through the bias signal lines 313 and the output signal lines 314 by using the substrate connection portions SCON. The substrate in which the constant current sources 433 for supplying current to the detection circuits 312 and the voltage sources are arranged and the substrate in which the detection circuits 312 are arranged are separated from each other to thereby offer advantages.

The potentials in the bias signal lines 313 may be power-supply voltages. However, the advantages are large when the voltage applied to each bias signal line 313 varies depending on time, as in the first embodiment. In the first embodiment, each detection circuit 312 has a reconfigurable configuration in which it operates as a source-grounded circuit during the feedback resetting in FIG. 5B and operates as a source follower circuit during the signal reading in FIG. 5A. The imaging device 100 has a feature that the constant current sources provided in the second substrate 102 control the gains of the detection circuits 312 provided in the pixels.

In general, the constant current source 433 and the constant current source 434 illustrated in each of FIGS. 5A and 5B are often implemented by a PMOS transistor and an NMOS transistor, respectively. When such transistors having different polarities are arranged in the second substrate 102 and are positioned directly below the pixels provided in the first substrate 101, the length of electrical-current supply paths can be reduced. This stack configuration is effective for arranging the constant current sources as close as possible to the pixels and arranging the constant current sources at a high density that is approximately the same degree as the density of the pixels in the pixel array 310. Naturally, the same applies to the voltage sources described above.

In the first embodiment illustrated in FIGS. 5A and 5B, the direction of current that flows in the amplifying transistor 4121A in the pixel differs between the signal reading in FIG. 5A and the feedback resetting in FIG. 5B.

The detection circuit 312 may be operated as the source-grounded circuit not only in the reset operation period but also in the reading period. That is, the imaging device 100 may have two image-capture modes. For example, a first image-capture mode may be a normal mode in which the detection circuit 312 operates as the source-grounded circuit in the reset operation period and operates as the source follower circuit in the reading period. A second image-capture mode may be a high sensitivity mode in which the detection circuit 312 operates as the source-grounded circuit in both the reset operation and the reading operation. When the detection circuit 312 operates as the source-grounded circuit during the reading operation, the gain for the reading can be increased. For example, the second image-capture mode in which the gain for the reading can be increased is desirable for an application for dark-time signal reading or single-photon detection.

Second Embodiment

A structure, a function, and a drive method of an imaging device 100 according to a second embodiment will be described with reference to FIGS. 19 to 33. The imaging device 100 according to the present embodiment differs from the imaging device 100 according to the first embodiment in that a detection circuit 312 including four transistors is provided.

(Structure of Imaging Device 100)

The imaging device 100 according to the present embodiment includes a plurality of pixels 311, which is two-dimensionally arrayed, and peripheral circuitry, as in the first embodiment. The pixels 311 are connected to the peripheral circuitry through various control lines.

Figure 19:
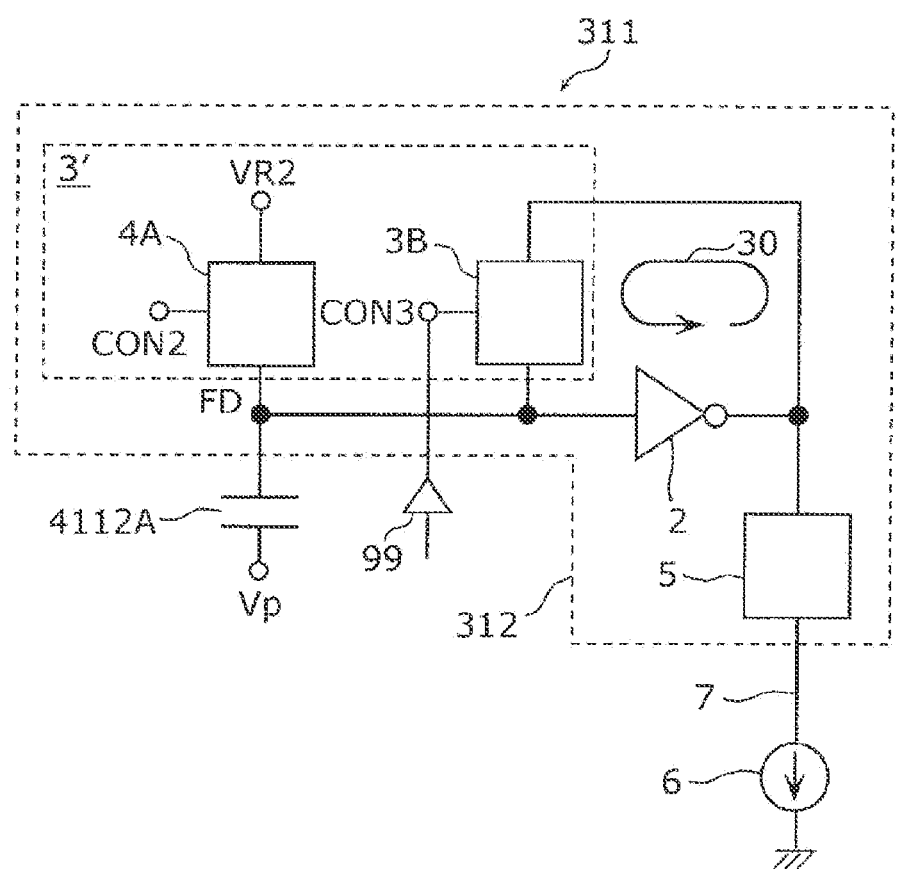
FIG. 19 is a schematic diagram illustrating an exemplary circuit configuration of one pixel according to a second embodiment.

FIG. 19 schematically illustrates an exemplary circuit configuration of one pixel 311 in the imaging device 100 according to the present embodiment. The pixel 311 includes a photoelectric converter 4112A and a detection circuit 312. The detection circuit 312 includes an amplifier 2, a band controller 3', a charge accumulation region FD, and an output selector 5. The detection circuit 312 reads signal charge generated by the photoelectric converter 4112A.

The charge accumulation region FD is connected to the photoelectric converter 4112A via a wiring layer. The charge accumulation region FD is further connected to an input of the amplifier 2. The amplifier 2 amplifies a signal corresponding to signal charge accumulated in the charge accumulation region FD and outputs the amplified signal to the band controller 3' and the output selector 5.

The band controller 3' includes a reset circuit 4A, which resets the charge accumulation region FD, and a band control circuit 3B. At least three voltages that are different from each other are supplied from a voltage control circuit 99 to the band control circuit 3B. Since such voltages are supplied, the band control circuit 3B has a band control function. The band control circuit 3B applies band limitation to the signal output from the amplifier 2 and outputs the resulting signal to the charge accumulation region FD. The reset circuit 4A resets the signal charge accumulated in the charge accumulation region FD. The amplifier 2 amplifies the signal read from the charge accumulation region FD. The amplified signal is subjected to the band limitation by the band control circuit 3B and is then fed back to the charge accumulation region FD.

The output selector 5 is connected to a signal reading line 7. The signal reading line 7 is shared by at least two pixels. The signal amplified by the amplifier 2 is output to the signal reading line 7 via the output selector 5.

Figure 20:
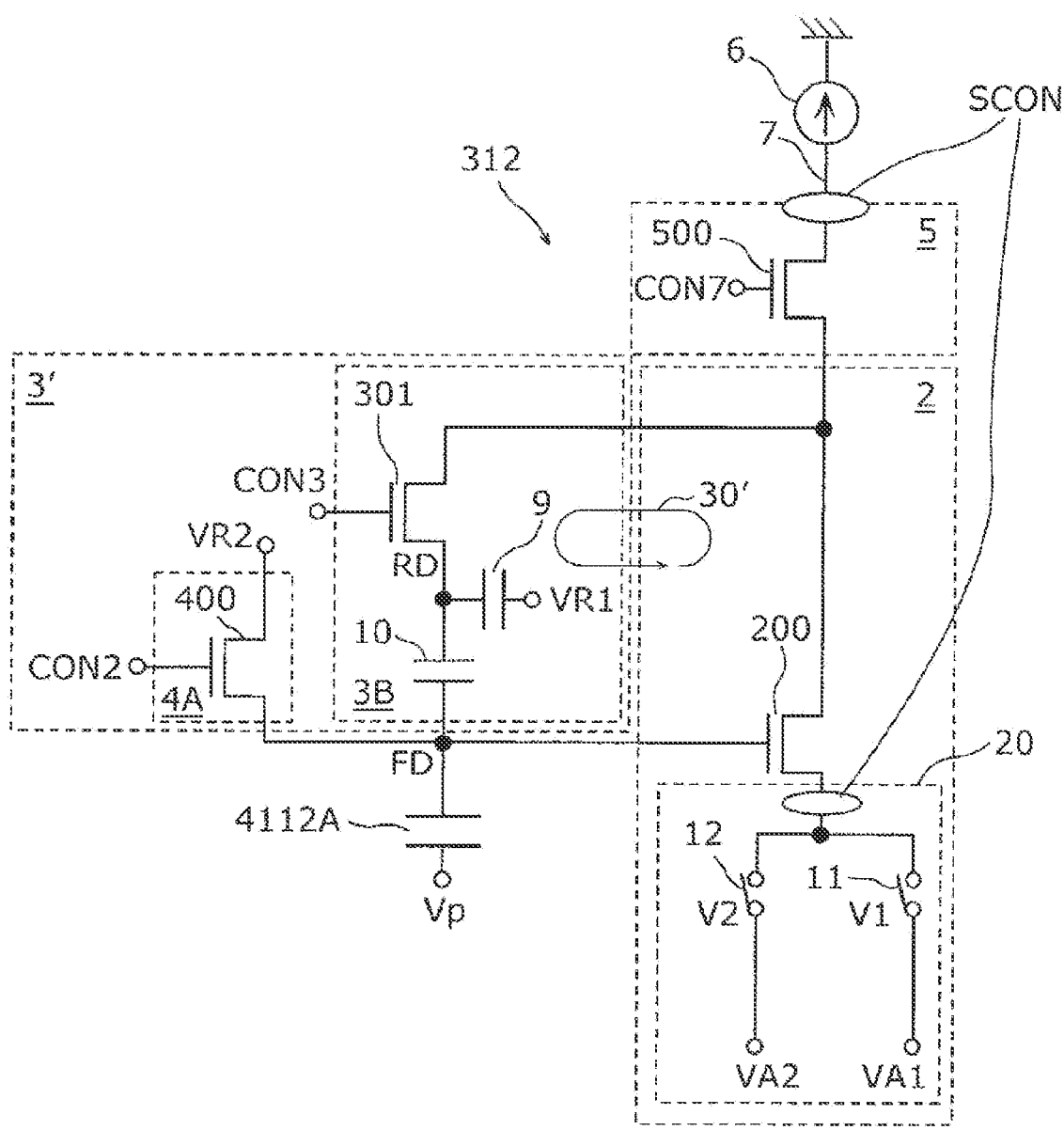
FIG. 20 is a schematic diagram illustrating an exemplary circuit configuration of a detection circuit according to the second embodiment.
Figure 21:
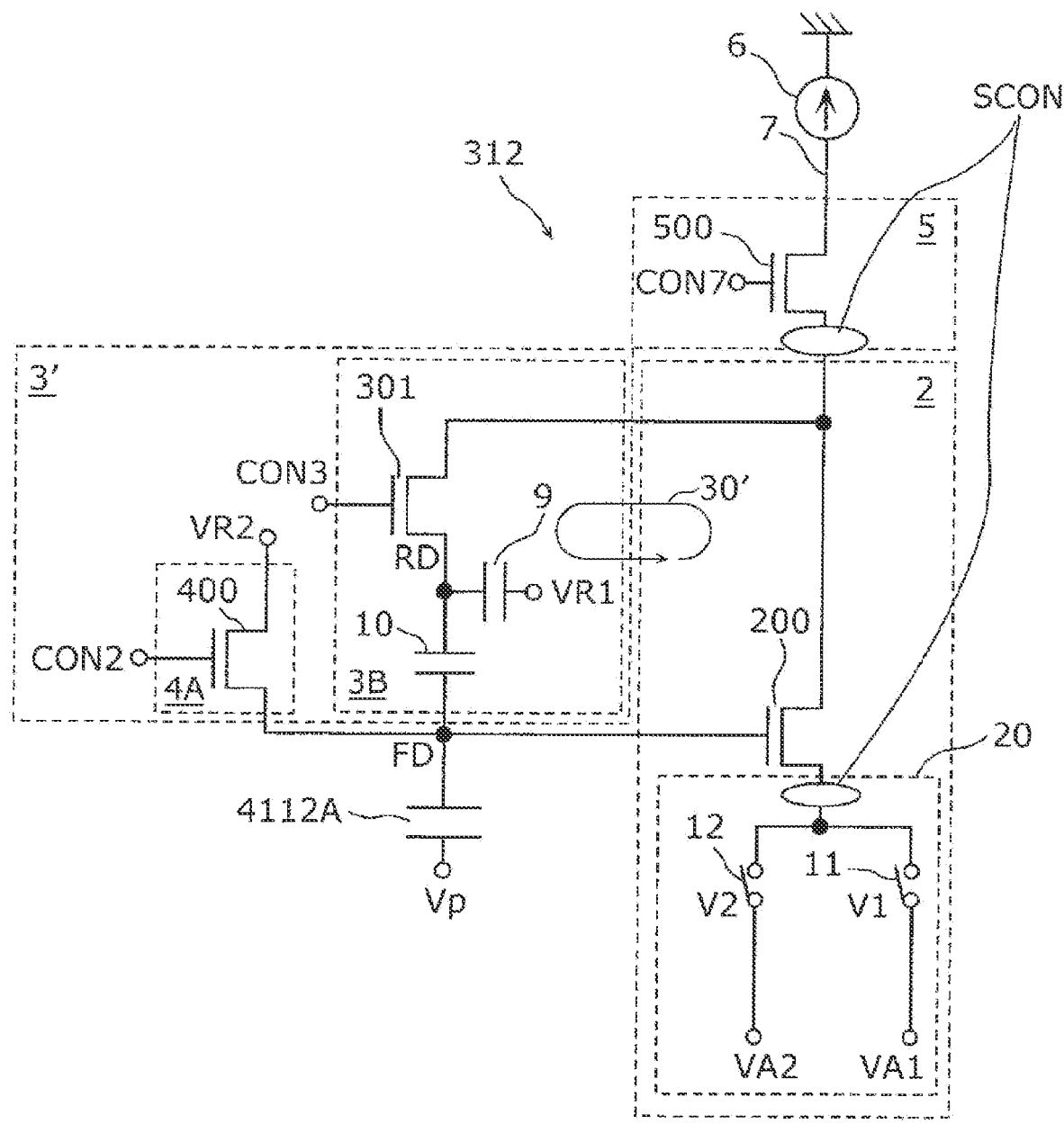
FIG. 21 is a schematic diagram illustrating an exemplary circuit configuration of the detection circuit according to the second embodiment.

FIGS. 20 and 21 each schematically illustrate one example of a circuit configuration of the detection circuit 312. A feedback circuit 30' negatively feeds back the signal from the photoelectric converter 4112A to the charge accumulation region FD via an amplifying transistor 200.

The reset circuit 4A in the band controller 3' includes a reset transistor 400. The band control circuit 3B includes a band control transistor 301 and capacitors 9 and 10. Herein, the term "capacitor" refers to a structure in which a dielectric, such as an insulating film, is provided between electrodes. The "electrodes" are not limited to electrodes formed of metal and are construed to widely include a polysilicon layer and so on. The electrodes may be part of a semiconductor substrate. The capacitors 9 and 10 may be, for example, metal-insulator-metal (MIM) capacitances or metal-insulator-semiconductor (MIS) capacitances.

The amplifier 2 includes the amplifying transistor 200 and a switching circuit 20. The switching circuit 20 includes switching elements 11 and 12. The output selector 5 includes a selecting transistor 500. A relationship of electrical connections in the detection circuit 312 will be described below.

A gate of the amplifying transistor 200 is connected to the charge accumulation region FD. One of a source and a drain of the amplifying transistor 200 is connected to one of a source and a drain of the band control transistor 301. The one of the source and the drain of the amplifying transistor 200 is also connected to one of the source and the drain of the selecting transistor 500. The other of the source and the drain of the band control transistor 301 is connected to one end of the capacitor 9. A reference voltage VR1 is applied to another end of the capacitor 9. Thus, the band control transistor 301 and the capacitor 9 form an RC filter circuit. The other of the source and the drain of the band control transistor 301 is also connected to one end of the capacitor 10. Another end of the capacitor 10 is connected to the charge accumulation region FD. Herein, a node formed among the band control transistor 301 and the capacitors 9 and 10 is referred to as a "node RD".

A gate of the band control transistor 301 is connected to a band control signal line CON3. The state of the band control transistor 301 is determined according to a voltage in the band control signal line CON3. For example, when the voltage in the band control signal line CON3 is at a high level, the band control transistor 301 is turned on. At this point in time, the charge accumulation region FD, the amplifying transistor 200, the band control transistor 301, and the capacitor 10 form a feedback path (i.e., the feedback circuit 30').

When the voltage in the band control signal line CON3 decreases, a resistance component in the band control transistor 301 increases. Thus, the bandwidth of the band control transistor 301 decreases, and a frequency region of a signal to be fed back becomes small.

When the feedback path is formed, the signal output by the band control transistor 301 is attenuated by an attenuation circuit formed by the capacitor 10 and a parasitic capacitance of the charge accumulation region FD and is fed back to the charge accumulation region FD. When the capacitance of the capacitor 10 is represented by Cc, and the parasitic capacitance of the charge accumulation region FD is represented by Cfd, an attenuation rate B is given by Cc/(Cc+Cfd).

When the voltage in the band control signal line CON3 decreases further to reach a low level, the band control transistor 301 is turned off, so that the feedback path is not formed.

The charge accumulation region FD is connected to one of a source and a drain of the reset transistor 400. A reference voltage VR2 is applied to the other of the source and the drain of the reset transistor 400. A gate of the reset transistor 400 is connected to a reset control signal line CON2, and the state of the reset transistor 400 is determined according to a voltage in the reset control signal line CON2. For example, when the voltage in the reset control signal line CON2 is at a high level, the reset transistor 400 is turned on, so that the voltage at the charge accumulation region FD is reset to the reference voltage VR2.

The other of the source and the drain of the selecting transistor 500 is connected to the signal reading line 7. A gate of the selecting transistor 500 is connected to a selection control signal line CON7, and the state of the selecting transistor 500 is determined according to a voltage in the selection control signal line CON7. For example, when the voltage in the selection control signal line CON7 is at a high level, the selecting transistor 500 is turned on, so that the amplifying transistor 200 and the signal reading line 7 are electrically connected to each other. When the voltage in the selection control signal line CON7 is at a low level, the selecting transistor 500 is turned off. As a result, the amplifying transistor 200 and the signal reading line 7 are electrically separated from each other.

The switching circuit 20 is connected to the other of the source and the drain of the amplifying transistor 200. Specifically, the other of the source and the drain of the amplifying transistor 200 is connected to a voltage source VA1 via the switching element 11. The other of the source and the drain of the amplifying transistor 200 is also connected to a voltage source VA2 via the switching element 12. The switching circuit 20 is controlled according to control signals V1 and V2, to thereby switch a voltage to be applied to the other of the source and the drain of the amplifying transistor 200 to a voltage Va1 of the voltage source VA1 or a voltage Va2 of the voltage source VA2. The voltage Va1 of the voltage source VA1 is, for example, GND. The voltage Va2 of the voltage source VA2 is, for example, VDD. The switching circuit 20 may be provided for each pixel or may be shared by two or more pixels in order to reduce the number of elements per pixel.

A constant current source 6 is connected to the signal reading line 7. When the selecting transistor 500 is in the on state, the selecting transistor 500, the amplifying transistor 200, and the constant current source 6 form a source follower circuit. The signal corresponding to the signal charge accumulated in the charge accumulation region FD is output to the signal reading line 7 and is read to outside. The constant current source 6 may be provided for each pixel or may be shared by two or more pixels in order to reduce the number of elements per pixel.

Next, an operation flow of the detection circuit 312 will be described with reference to FIG. 22.

Figure 22:
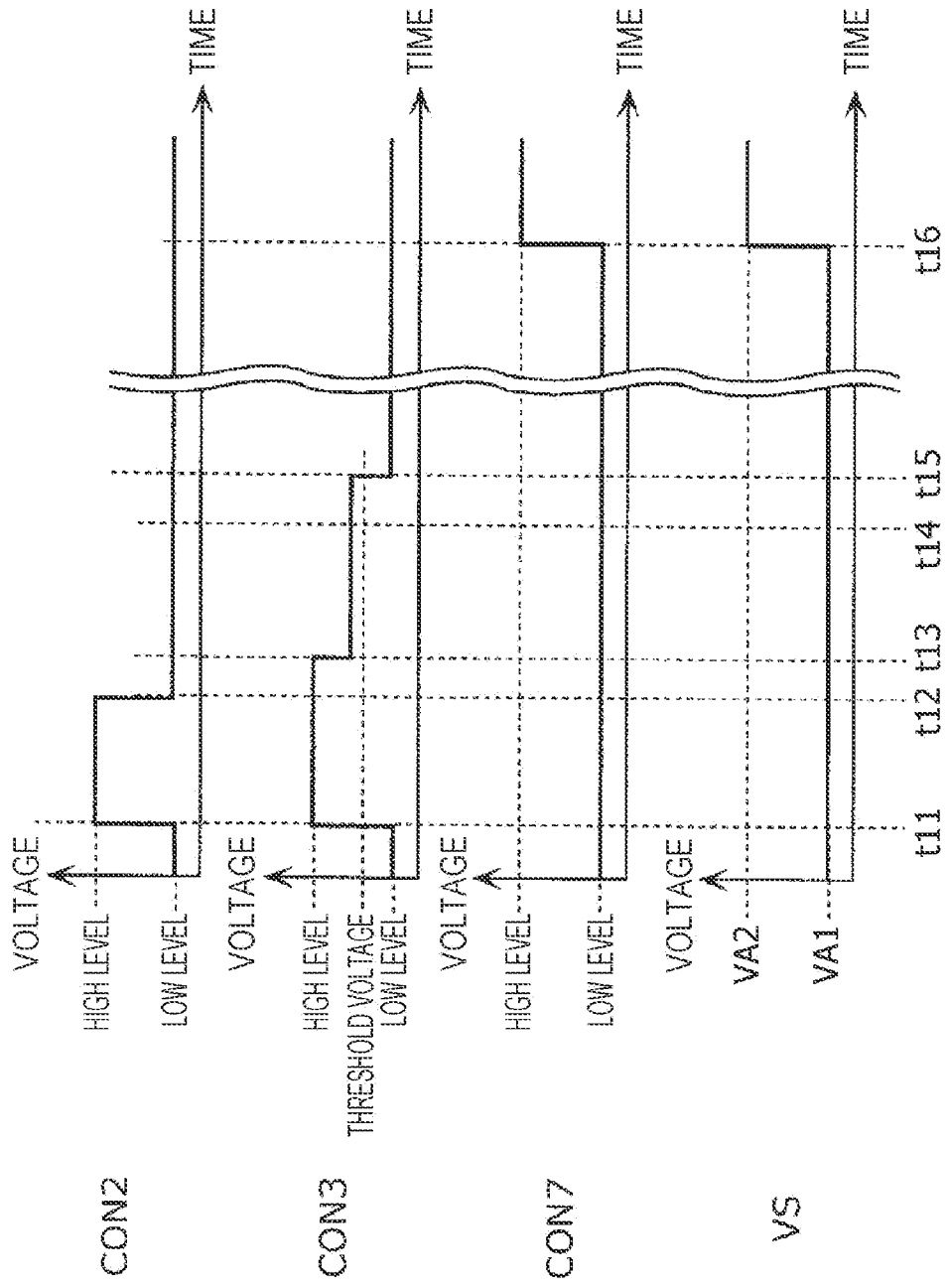
FIG. 22 is a timing chart illustrating one example of an operation of the detection circuit according to the second embodiment.
Figure 23:
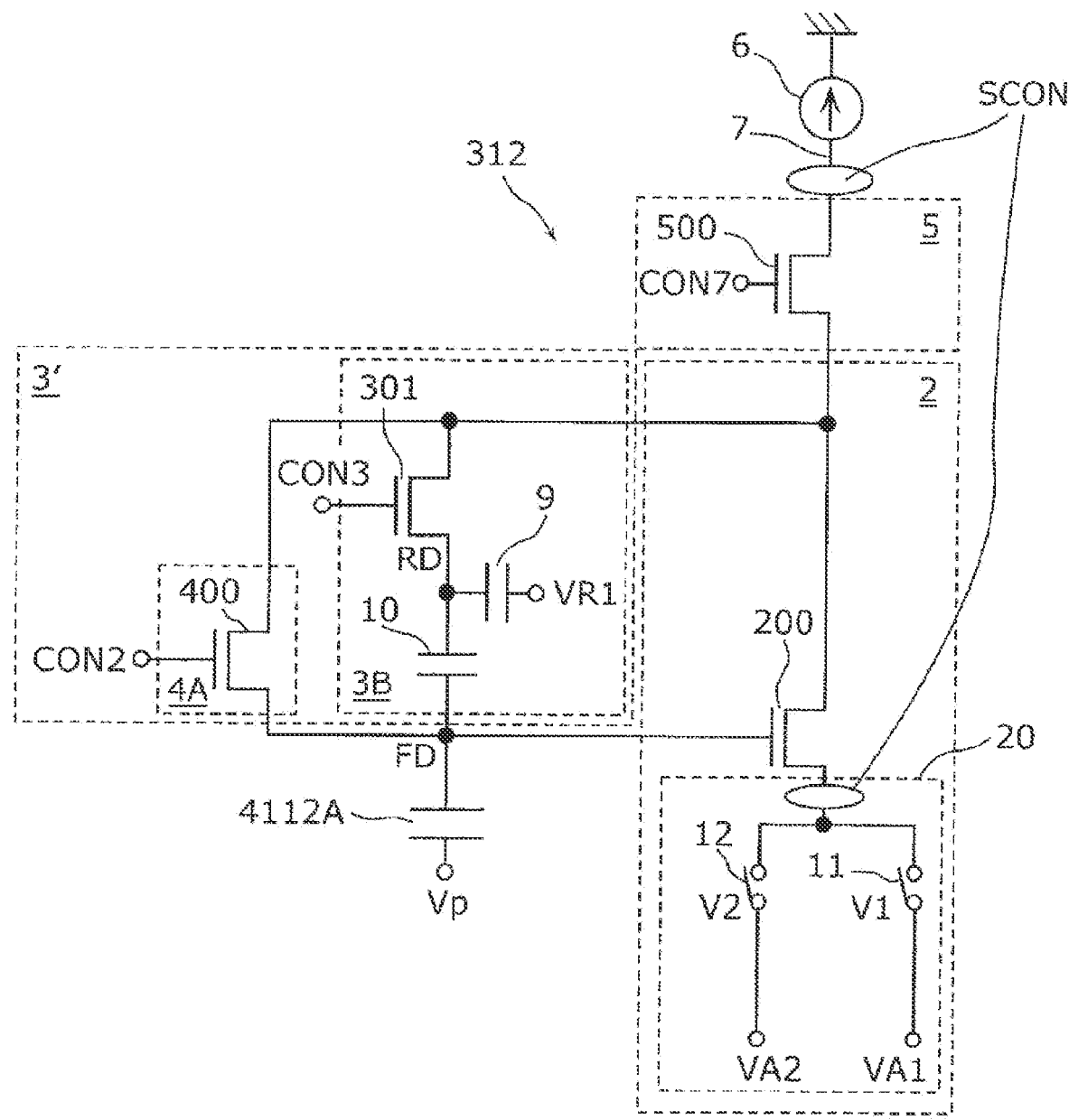
FIG. 23 is a schematic diagram illustrating another exemplary circuit configuration of the detection circuit according to the second embodiment.
Figure 24:
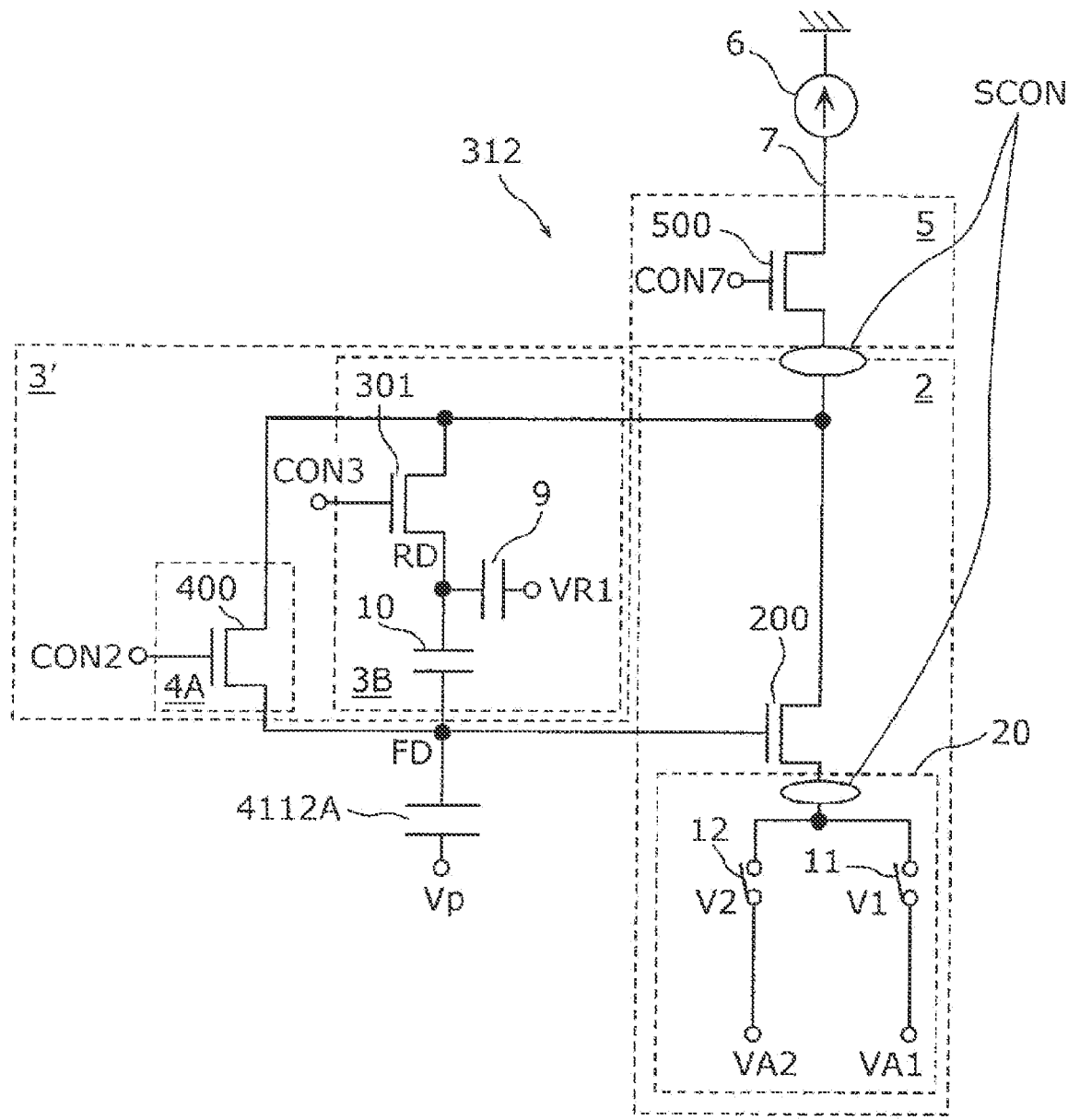
FIG. 24 is a schematic diagram illustrating another exemplary circuit configuration of the detection circuit according to the second embodiment.
Figure 25:
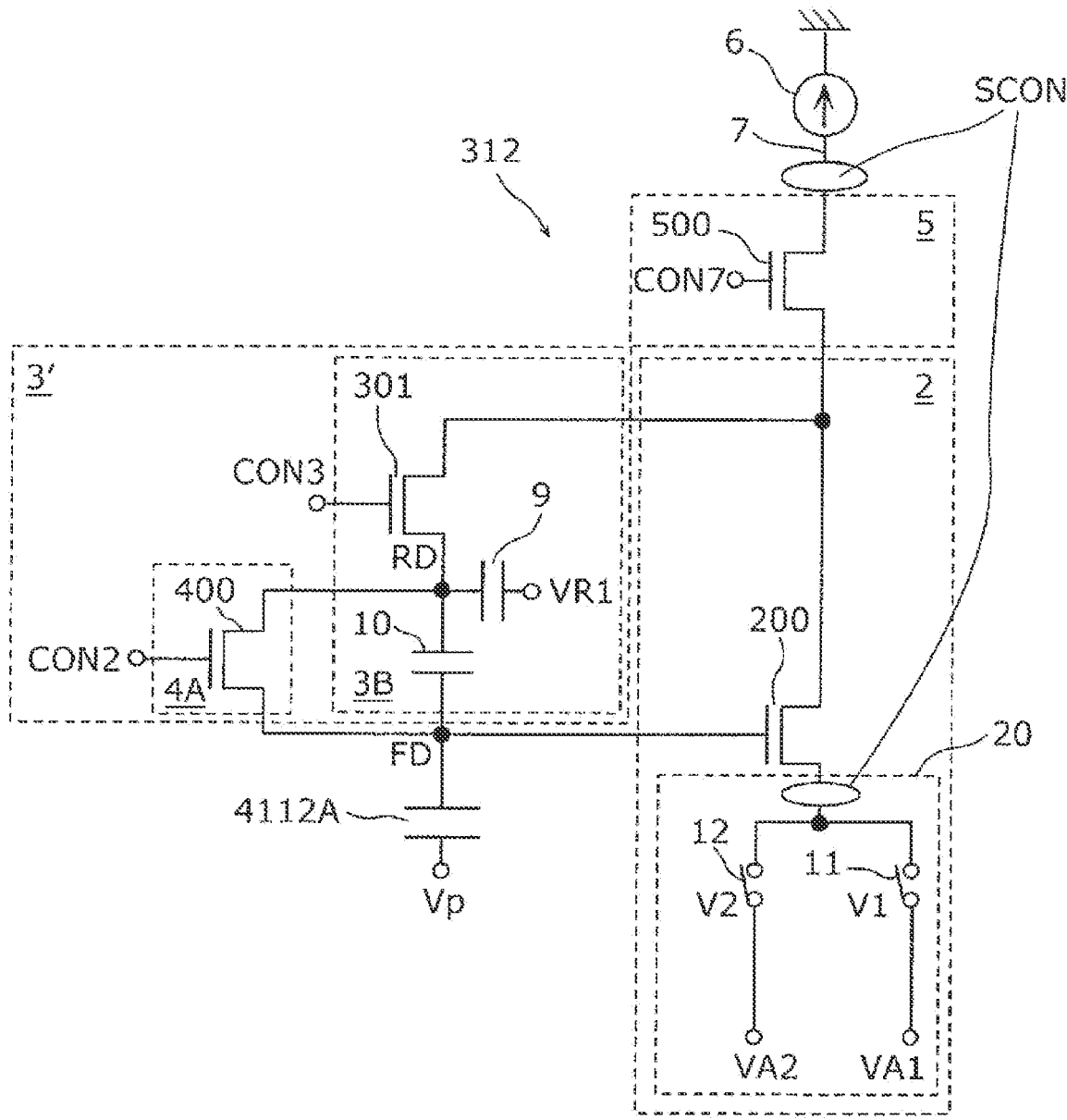
FIG. 25 is a schematic diagram illustrating another exemplary circuit configuration of the detection circuit according to the second embodiment.
Figure 26:
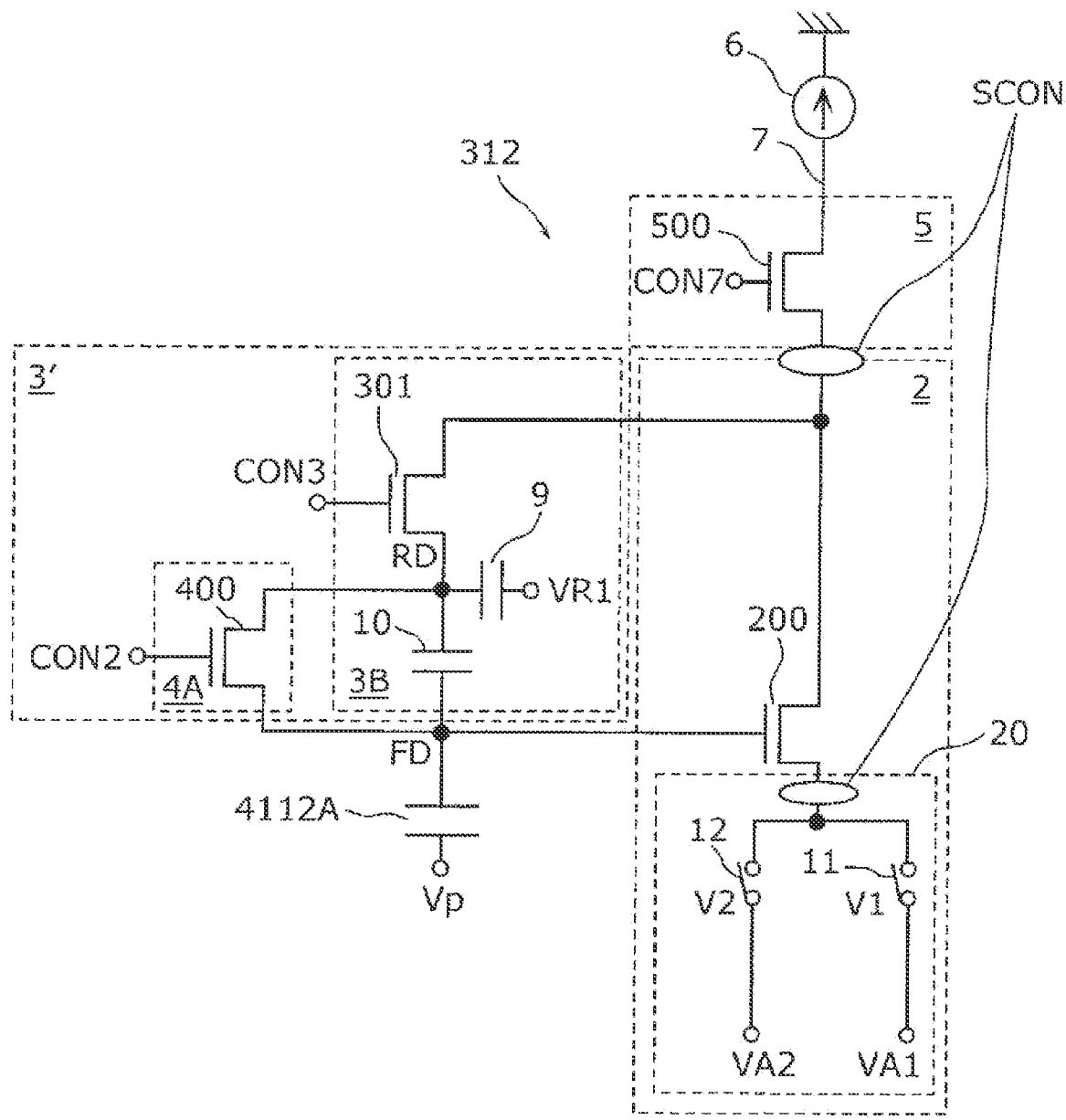
FIG. 26 is a schematic diagram illustrating another exemplary circuit configuration of the detection circuit according to the second embodiment.
Figure 27:
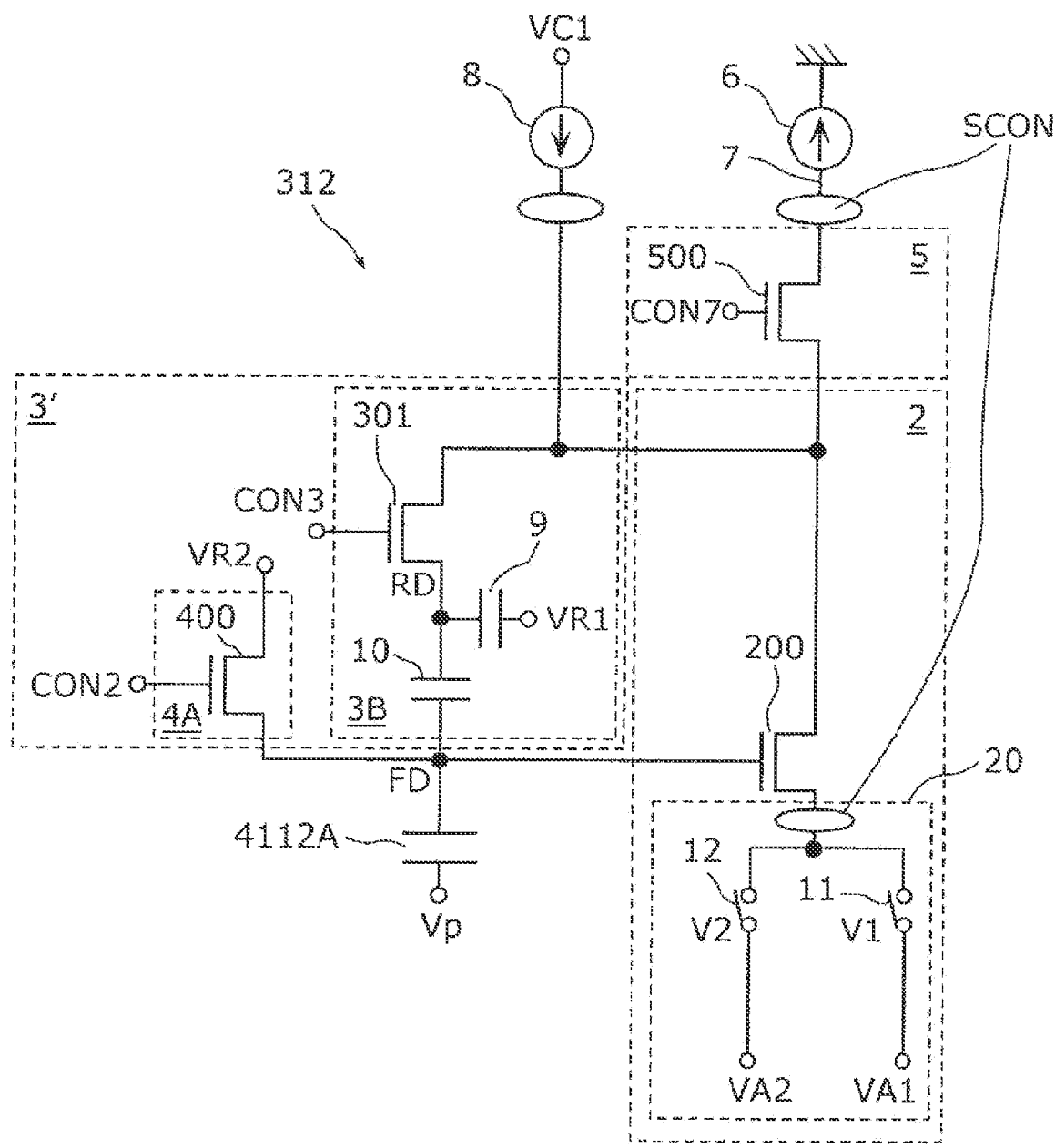
FIG. 27 is a schematic diagram illustrating another exemplary circuit configuration of the detection circuit according to the second embodiment.
Figure 28:
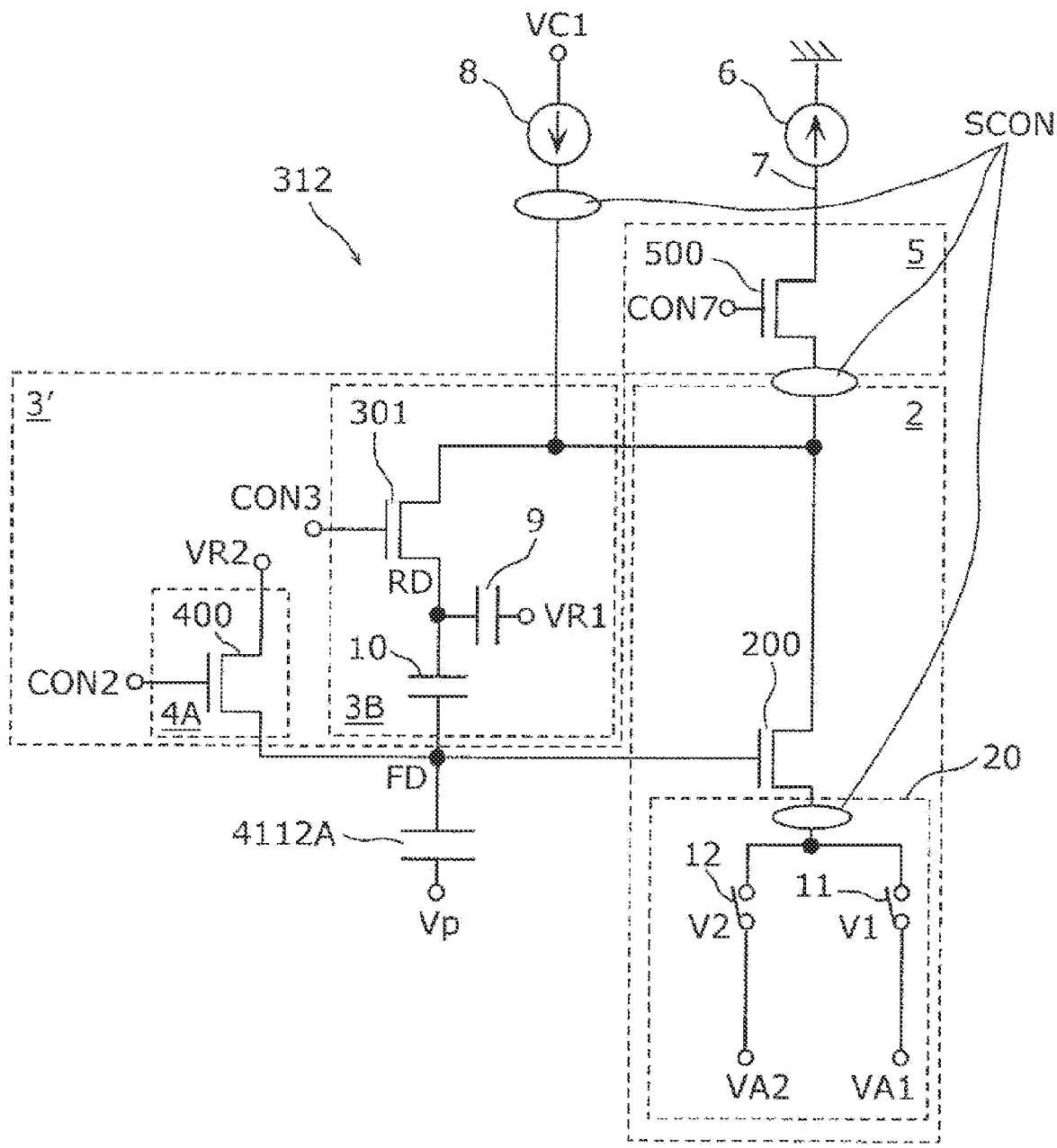
FIG. 28 is a schematic diagram illustrating another exemplary circuit configuration of the detection circuit according to the second embodiment.
Figure 29:
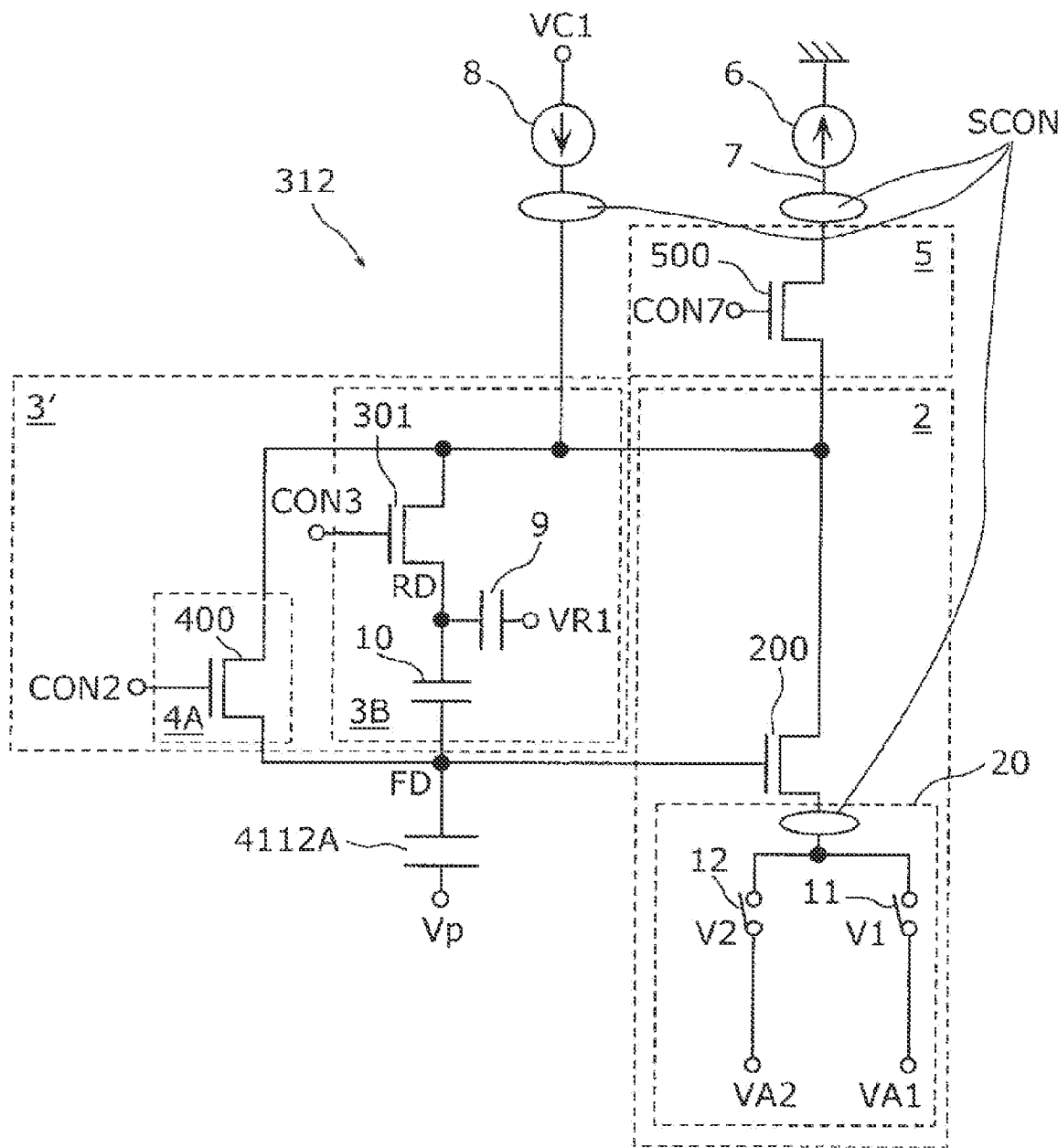
FIG. 29 is a schematic diagram illustrating another exemplary circuit configuration of the detection circuit according to the second embodiment.
Figure 30:
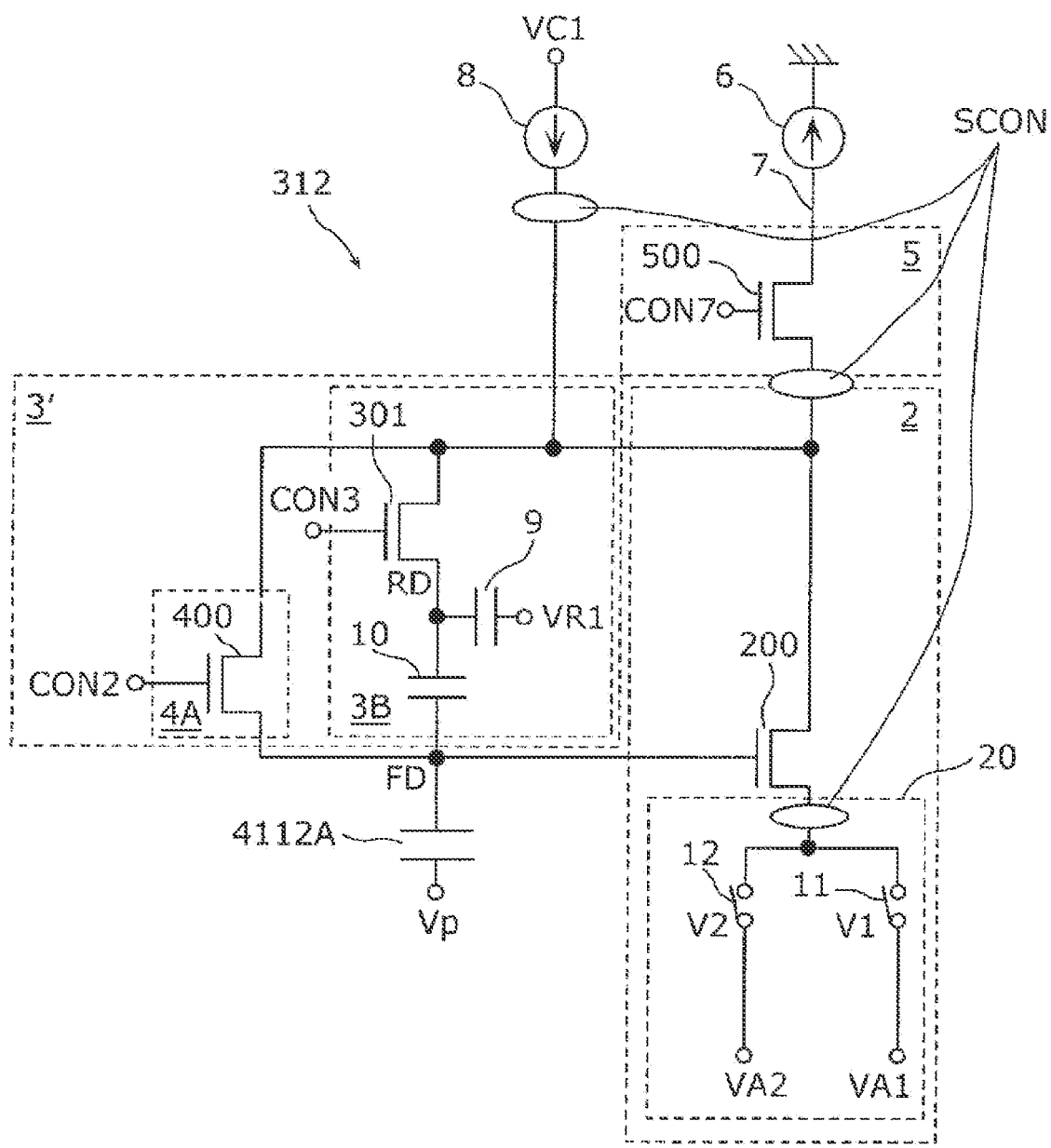
FIG. 30 is a schematic diagram illustrating another exemplary circuit configuration of the detection circuit according to the second embodiment.
Figure 31:
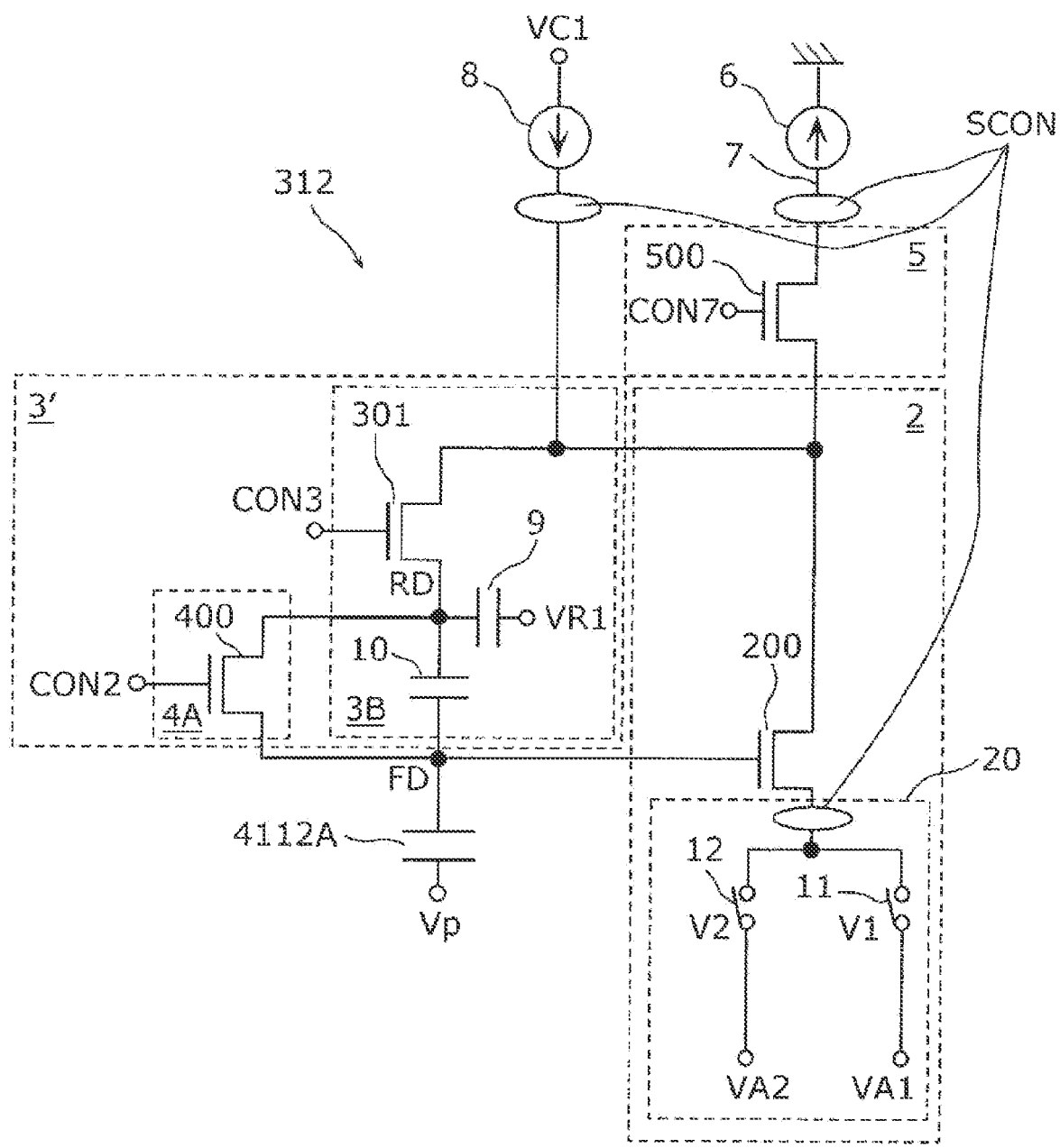
FIG. 31 is a schematic diagram illustrating another exemplary circuit configuration of the detection circuit according to the second embodiment.
Figure 32:
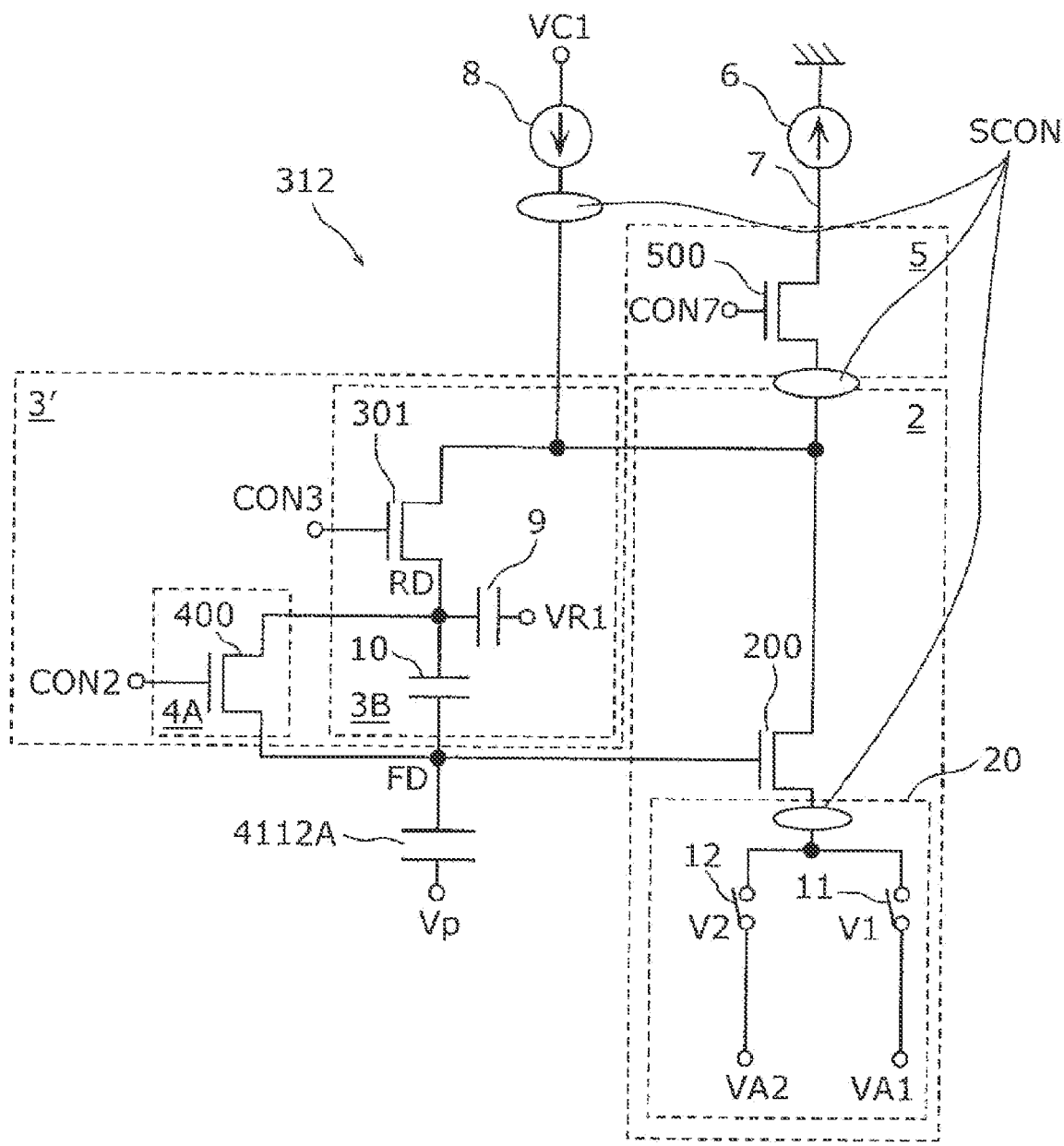
FIG. 32 is a schematic diagram illustrating another exemplary circuit configuration of the detection circuit according to the second embodiment.

FIG. 22 is a timing chart illustrating one example of the operation of the detection circuit 312. The horizontal axis in each graph represents time. In the vertical axis, CON2 represents a voltage in the reset control signal line CON2. CON3 represents a voltage in the band control signal line CON3. CON7 represents a voltage in the selection control signal line CON7. VS represents a voltage at the other of the source and the drain of the amplifying transistor 200.

(Reset Period)

At time t11, the voltage in the selection control signal line CON7 is at the low level. Accordingly, the selecting transistor 500 is in the off state, so that the amplifying transistor 200 and the signal reading line 7 are electrically separated from each other. Also, at time t11, the voltage in the band control signal line CON3 is set to the high level to put the band control transistor 301 into the on state. Also, at time t11, the switching element 11 in the switching circuit 20 is in an on state, so that the voltage Va1 (e.g., GND) is applied to the other of the source and the drain of the amplifying transistor 200. In addition, at time t11, the voltage in the reset control signal line CON2 is set to the high level to turn on the reset transistor 400, so that the charge accumulation region FD is reset, and the voltage at the charge accumulation region FD reaches the reference voltage VR2.

At time t12, the voltage in the reset control signal line CON2 is set to a low level to turn off the reset transistor 400. At this point in time, the detection circuit 312 forms a feedback circuit in which the amplification factor is −A×B times. Thus, kTC noise that is generated in the charge accumulation region FD when the reset transistor 400 is turned off is reduced to 1/(1+A×B) times. When the voltage in the band control signal line CON3 is set to the high level so that the operating band of the band control transistor 301 becomes a wide band, the kTC noise can be reduced at high speed.

(Noise Reduction Period)

In the period from time t13 to time t15, the voltage in the band control signal line CON3 is set to a voltage between the high level and the low level, for example, to an intermediate voltage therebetween. In this case, the operating band of the band control transistor 301 becomes the second band, which is narrower than the first band.

When the second band is made sufficiently narrower than the operating band of the amplifying transistor 200, the noise reduction effect increases, but the time from t13 to t15 also increases. Even when the second band is wider than the operating band of the amplifying transistor 200, the noise reduction effect is obtained. A designer can arbitrarily design the second band in accordance with an allowable time from time t13 to time t15. In the following description, the second band is assumed to be sufficiently narrower than the operating band of the amplifying transistor 200.

When the second band is narrower than the operating band of the amplifying transistor 200, thermal noise that is generated in the band control transistor 301 is reduced to $1/(1+A\times B)^{1/2}$ times by the feedback circuit 30'. In this state, at time t15, when the voltage in the band control signal line CON3 is set to the low level to turn off the band control transistor 301, kTC noise that remains in the charge accumulation region FD when the band control transistor 301 is turned off reaches a value obtained by the sum of squares of kTC noise due to the reset transistor 400 and kTC noise due to the band control transistor 301.

When the capacitance of the capacitor 9 is represented by Cs, the kTC noise that is generated in the band control transistor 301 when there is no noise reduction due to the feedback is $(Cfd/Cs)^{1/2}$ times, compared with the kTC noise that is generated in the reset transistor 400 when there is no noise reduction due to the feedback. When this point is considered to perform comparison with a case in which there is no feedback, the kTC noise when there is feedback is reduced to $\{1+(1+A\times B)\times Cfd/Cs\}^{1/2}/(1+A\times B)$ times.
(Exposure/Reading Period)

At time t16, the voltage in the selection control signal line CON7 is set to the high level to turn on the selecting transistor 500, and the switching circuit 20 is controlled so that the voltage at the other of the source and the drain of the amplifying transistor 200 reaches Va2 (e.g., VDD). In this state, the amplifying transistor 200 and the constant current source 6 form a source follower circuit. The voltage in the signal reading line 7 becomes a voltage corresponding to the signal charge accumulated in the charge accumulation region FD. At this point in time, the amplification factor of the source floor circuit is about 1.

At time t16, the voltage at the charge accumulation region FD changes relative to the reset voltage (VR2) by an amount corresponding to the signal charge generated in the photoelectric converter 4112A in the period from time t15 to time t16. The amplifier 2 amplifies the voltage at the charge accumulation region FD with an amplification factor of about 1 and outputs the amplified voltage to the signal reading line 7.

Random noise means fluctuation of an output when the signal charge generated by the photoelectric converter 4112A is 0, that is, means kTC noise. The kTC noise is reduced to $\{1+(1+A\times B)\times Cfd/Cs\}^{1/2}/(1+A\times B)$ times in the noise reduction period and is further output to the signal reading line 7 with an amplification factor of about 1 in the exposure/reading period. As a result, it is possible to obtain favorable image data in which the random noise is reduced.

It is desirable that the capacitance Cs of the capacitor 9 be larger than the capacitance Cc of the capacitor 10. In the present embodiment, when Cs is increased as far as the area permits, the random noise can be reduced. Typically, when the capacitance Cs of the capacitor 9 is increased, the random noise is reduced. However, when the charge signal in the charge accumulation region FD is converted into a voltage signal, the signal level decreases, and consequently, the S/N ratio is not improved. In the present embodiment, however, since the charge accumulation region FD and the node RD are separated from each other by the capacitor 10, a reduction in the signal level is less likely to occur even when the capacitance of the capacitor 9 is increased. As a result, since only the random noise is reduced, there is an advantage in that the S/N ratio is improved.

In the present embodiment, CDS can also be performed in order to cancel variations in the peripheral circuitry, as in the first embodiment. Specifically, after the source follower circuit reads the signal voltage at the charge accumulation region FD, the above-described reset operation is performed again. After the reset operation is completed, the source follower circuit performs the reading operation again before the photoelectric converter 4112A performs light detection. This makes it possible to read the reset voltage VRST. The CDS can be performed by determining a difference between the signal voltage at the charge accumulation region FD and the reset voltage VRST.

Also, in the present embodiment, in the exposure period, since the signal voltage at the charge accumulation region FD is read by the source follower circuit, the amplification factor is about 1. However, the present disclosure is not limited to this amplification factor, and a designer may vary the amplification factor in accordance with an S/N ratio or a circuit range required for the system.

In the present embodiment, the feedback for the noise cancelling is performed in each of the pixels 311. Thus, the noise cancelling can be performed at high speed without being affected by the time constant of the signal reading line 7. In addition, an increase in the capacitances of the capacitors arranged in the pixels 311 makes it possible to obtain a greater noise reduction effect.

The following description will be given of a modification of the configuration and the operation of the detection circuit 312 according to the present embodiment.

FIGS. 23 to 32 schematically illustrate other examples of the circuit configuration of the detection circuit 312. The detection circuit 312 illustrated in FIGS. 23 to 26 differs from the detection circuit 312 in FIGS. 19 and 20 in that the voltage at one of the source and the drain of the amplifying transistor 200 (i.e., the output voltage of the amplifier 2), instead of the reference voltage VR2, is applied to the reset transistor 400. The reset transistor 400 negatively feeds back the signal of the photoelectric converter 4112A to the charge accumulation region FD via the amplifying transistor 200. Herein, such a transistor may be referred to as a "negative-feedback transistor". Such a configuration makes it possible to reduce changes in the voltage at the charge accumulation region FD before and after the reset transistor 400 is turned off, thus making it possible to perform higher-speed noise reduction.

A constant current source 8 may be further provided, as illustrated in FIGS. 27 to 32. Such a configuration makes it possible to increase the operating bandwidth of the amplifying transistor 200, thus making it possible to also increase the bandwidth of the band control transistor 301. Accordingly, the random noise can be reduced at higher speed in a state in which the band of the band control transistor 301 is wider.

Lastly, another control method for the band control signal line CON3 will be described with reference to FIG. 33.

Figure 33:
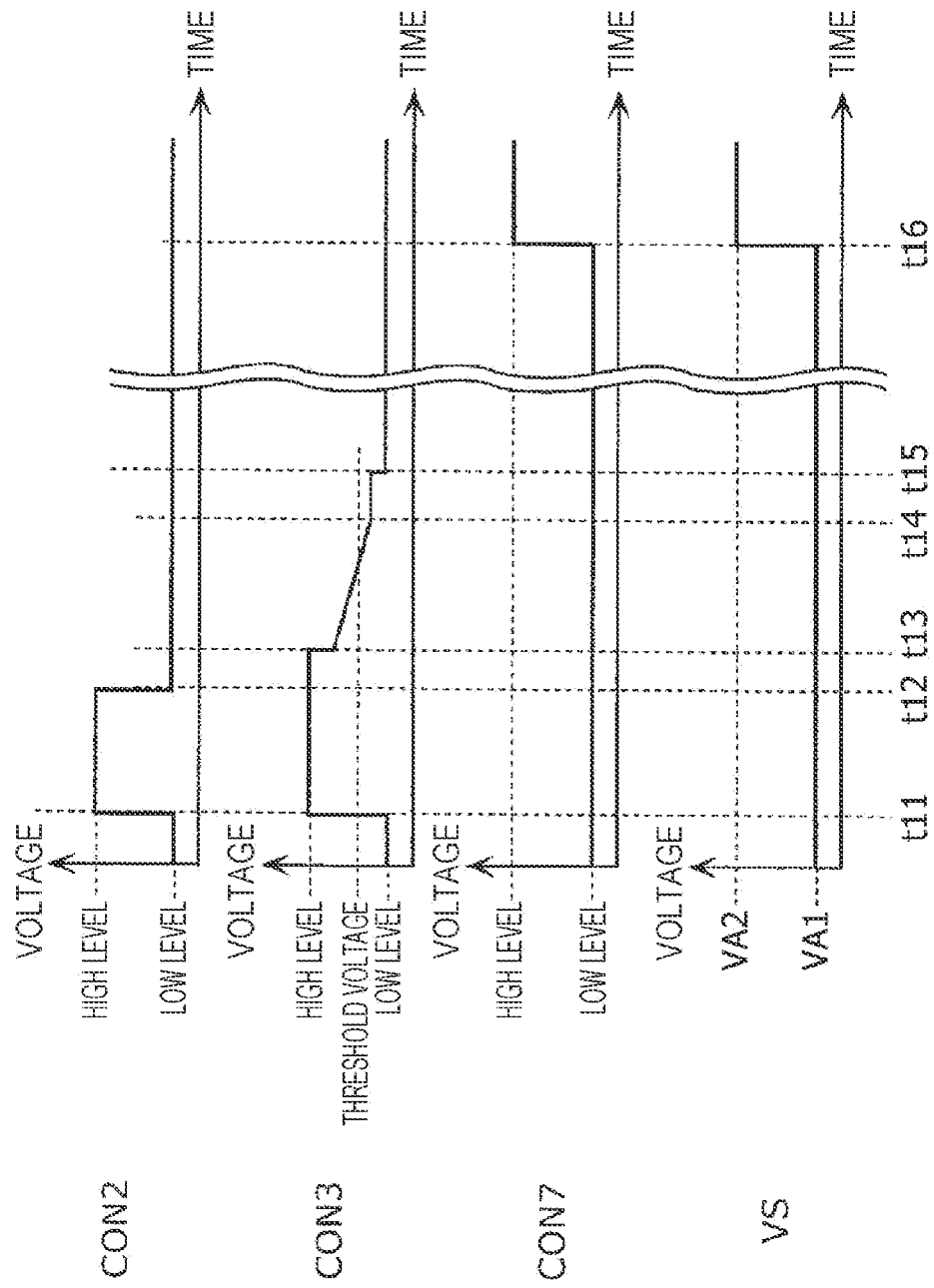
FIG. 33 is a timing chart illustrating another example of the operation of the detection circuit according to the second embodiment.

FIG. 33 is a timing chart illustrating another example of the operation of the detection circuit 312. As illustrated in FIG. 33, the tapered reset may be applied, as in the first embodiment. That is, the band control signal line CON3 may be controlled so that the band control transistor 301 changes gradually from the on state to the off state across a threshold voltage of the band control transistor 301.

This makes it possible to effectively reduce noise that is generated in all pixels even when the threshold voltage of the band control transistor 301 varies between two or more pixels 311 included in the imaging device 100. The range of changes in the voltage applied to the band control signal line CON3 in the tapered reset may be limited to the range of variations in the threshold voltage of the band control transistor 301 in each pixel. This makes it possible to reduce the time taken for the tapered reset and makes it possible to perform the noise reduction at high speed.

Third Embodiment

A structure, a function, and a drive method of an imaging device 100 according to a third embodiment will be described with reference to FIGS. 34 to 38. The imaging device 100 according to the present embodiment differs from the imaging device 100 according to the second embodiment in that an output selector 5C in a detection circuit 312 includes a PMOS transistor as a selecting transistor, and the output selector 5C is connected to a switching circuit 40. Points that differ from the second embodiment are mainly described below.

Figure 34:
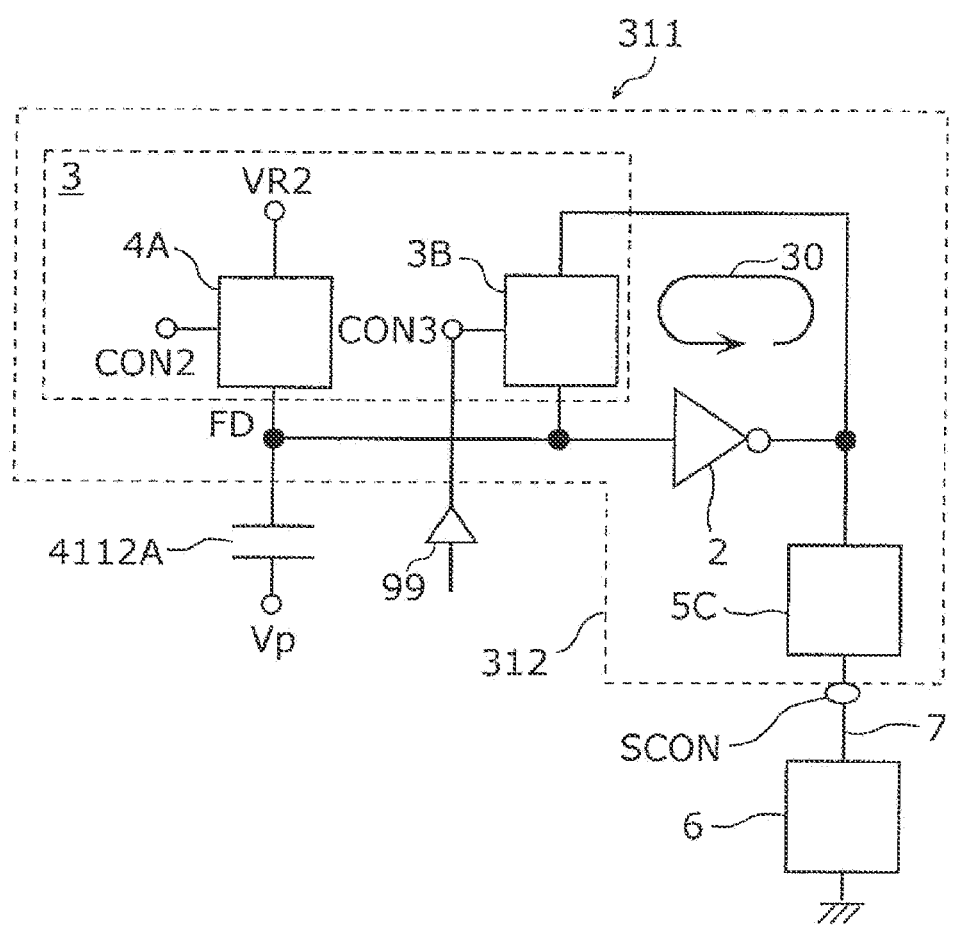
FIG. 34 is a schematic diagram illustrating an exemplary circuit configuration of one pixel according to a third embodiment.

FIG. 34 schematically illustrates an exemplary circuit configuration of one pixel 311 in the imaging device 100 according to the present embodiment. The pixel 311 includes a photoelectric converter 4112A and the detection circuit 312. The detection circuit 312 includes an amplifier 2, a band controller 3, a charge accumulation region FD, and the output selector 5C. The output selector 5C is connected to a signal reading line 7.

The signal reading line 7 to which the output selector 5C is connected is shared by at least two pixels. The output selector 5C has a function of outputting a signal amplified by the amplifier 2 to the signal reading line 7 and a function of supplying current to the amplifier 2. These functions can be switched therebetween.

Figure 35A:
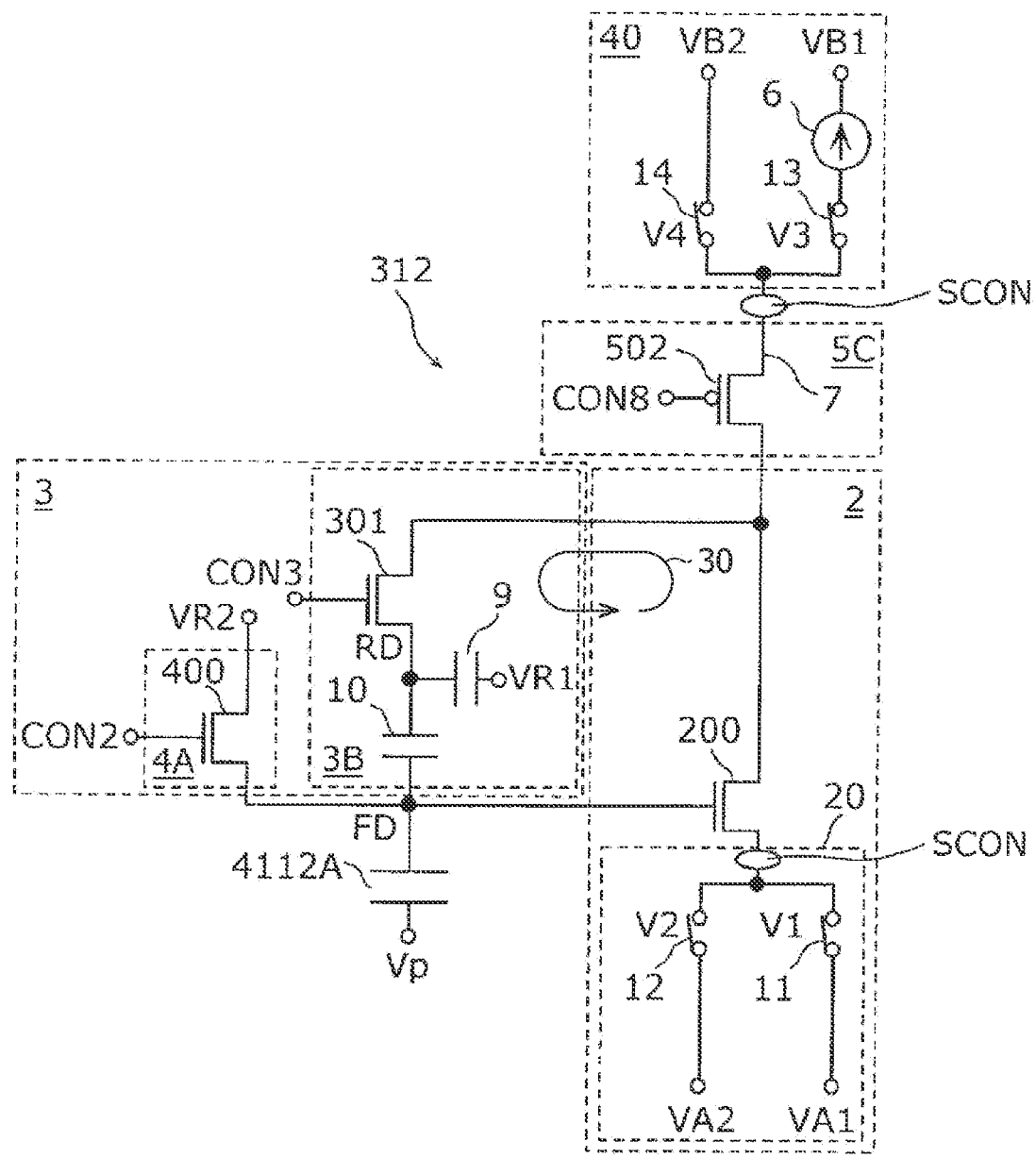
FIG. 35A is a schematic diagram illustrating an exemplary circuit configuration of a detection circuit according to the third embodiment.

FIG. 35A schematically illustrates a circuit configuration of the detection circuit 312. A feedback circuit 30 negatively feeds back a signal of the photoelectric converter 4112A to the charge accumulation region FD via an amplifying transistor 200. One of a source and a drain of a selecting transistor 502 is connected to one of the source and the drain of the amplifying transistor 200. The other of the source and the drain of the selecting transistor 502 is connected to the signal reading line 7. In the present embodiment, the selecting transistor 502 has a polarity that is opposite to the polarity of the amplifying transistor 200. The amplifying transistor 200 is an NMOS transistor, and the selecting transistor 502 is a PMOS transistor.

A gate of the selecting transistor 502 is connected to a selection control signal line CON8. The state of the selecting transistor 502 is determined according to a voltage in the selection control signal line CON8. For example, when the voltage in the selection control signal line CON8 is at a low level, the selecting transistor 502 is turned on, so that the amplifying transistor 200 and the signal reading line 7 are electrically connected to each other. When the voltage in the selection control signal line CON8 is at a high level, the selecting transistor 502 is turned off, so that the amplifying transistor 200 and the signal reading line 7 are electrically separated from each other.

When the voltage in the selection control signal line CON8 is a voltage between the low level and the high level, for example, is an intermediate voltage therebetween, the selecting transistor 502 operates as a current source to supply current to the amplifying transistor 200. The amount of the current is determined by the voltage in the selection control signal line CON8. A designer can design the detection circuit 312 so that the amount of the current reaches a desired amount.

The switching circuit 40 is connected to the signal reading line 7. The switching circuit 40 includes switching elements 13 and 14, voltage sources VB1 and VB2, and a constant current source 6. One terminal of the constant current source 6 is connected to the signal reading line 7 via the switching element 13. The voltage source VB2 is connected to the signal reading line 7 via the switching element 14. The voltage source VB1 is connected to another terminal of the constant current source 6.

With control signals V3 and V4, it is possible to switch between the voltage source VB2 and the constant current source 6 (the voltage source VB1) to be switched to the signal reading line 7. For example, a voltage Vb1 of the voltage source VB1 is GND, and a voltage Vb2 of the voltage source VB2 is VDD.

When the voltage source VB2 is connected to the signal reading line 7, and the voltage in the selection control signal line CON8 is a voltage between the low level and the high level, for example, is an intermediate voltage therebetween, the selecting transistor 502 operates as a current source. In this case, the selecting transistor 502 and the amplifying transistor 200 form an inverting amplifier circuit.

When the constant current source 6 is connected to the signal reading line 7, and the voltage in the selection control signal line CON8 is at the low level, the amplifying transistor 200 and the constant current source 6 form a source follower circuit. In this case, the signal voltage at the charge accumulation region FD is output to the signal reading line 7.

In the present embodiment, although the transistors that constitute the detection circuit 312, except for the selecting transistor 502, are NMOS transistors, the polarities of the transistors may be reversed. That is, the selecting transistor 502 may be an NMOS transistor, and the other transistors may be PMOS transistors. Also, all the transistors in the detection circuit 312 may be either NMOS transistors or PMOS transistors.

Figure 35B:
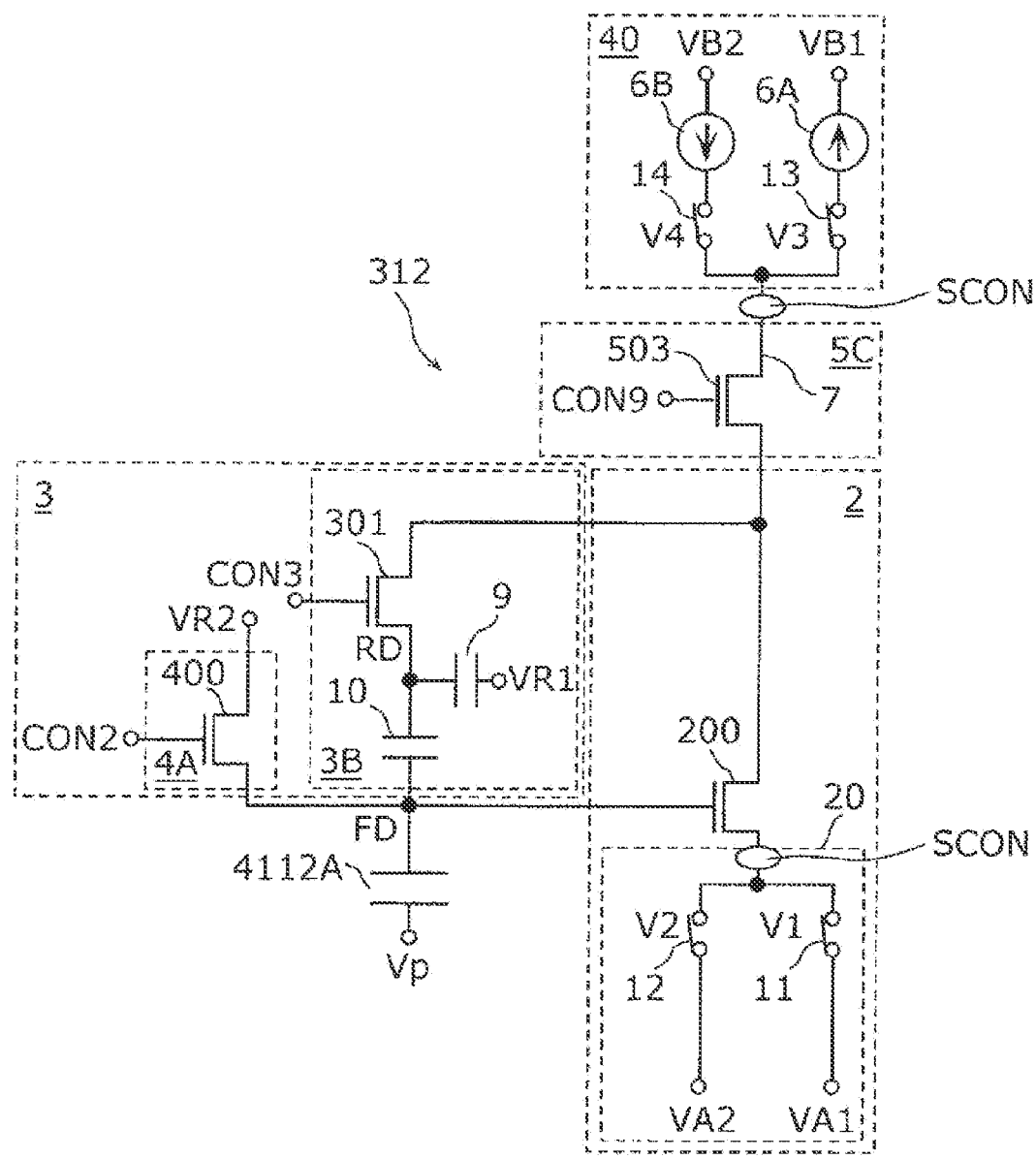
FIG. 35B is a schematic diagram illustrating another exemplary circuit configuration of the detection circuit according to the third embodiment.

Reference is made to FIG. 35B. FIG. 35B illustrates a modification of the configuration illustrated in FIG. 35A. In this modification, the switching circuit 40 has constant current sources 6A and 6B. The output selector 5C has a selecting transistor 503. The polarity of the selecting transistor 503 is the same as the polarity of the amplifying transistor 200 and so on. That is, the selecting transistor 503 is an NMOS transistor.

A gate of the selecting transistor 503 is connected to a selection control signal line CON9. The state of the selecting transistor 503 is determined according to a voltage in the selection control signal line CON9. For example, when the voltage in the selection control signal line CON9 is at a high level, the selecting transistor 503 is turned on, so that the amplifying transistor 200 and the signal reading line 7 are electrically connected to each other. When the voltage in the selection control signal line CON9 is at a low level, the selecting transistor 503 is turned off, so that the amplifying transistor 200 and the signal reading line 7 are electrically separated from each other.

In the above-described configuration illustrated in FIG. 35A, the voltage in the selection control signal line CON8 is set to a voltage between the low level and the high level, for example, to an intermediate voltage therebetween, to thereby cause the selecting transistor 502 to operate as a current source. In contrast, in this modification, the switching element 14 and the selecting transistor 503 are turned on to thereby supply current from the constant current source 6B to the amplifying transistor 200.

Next, an operation flow of the detection circuit 312 in FIG. 35A will be described with reference to FIG. 36.

FIG. 36 is a timing chart illustrating one example of the operation of the detection circuit 312. The horizontal axis in each graph represents time. In the vertical axis, CON2 represents a voltage in the reset control signal line CON2. CON3 represents a voltage in the band control signal line CON3. CON8 represents a voltage in the selection control signal line CON8. VS represents the voltage at the other of the source and the drain of the amplifying transistor 200, that is, the voltage at either the source or the drain of the amplifying transistor 200 which is connected to the switching circuit 20.

(Reset Period)

At time t21, the voltage in the selection control signal line CON8 is set to a voltage between the low level and the high level, for example, to an intermediate voltage therebetween. Also, the switching circuit 40 is controlled so that the voltage source VB2 is connected to the signal reading line 7. Also, the voltage in the band control signal line CON3 is set to a high level to turn on a band control transistor 301. At time t21, the other of the source and the drain of the amplifying transistor 200 is connected to the voltage source VA1. A voltage Va1 of the voltage source VA1 is, for example, GND. In addition, at time t21, the voltage in the reset control signal line CON2 is set to a high level to turn on the reset transistor 400 to thereby reset the charge accumulation region FD. As a result, the voltage at the charge accumulation region FD reaches a reference voltage VR2.

At time t22, the voltage in the reset control signal line CON2 is set to a low level to turn off the reset transistor 400. At this point in time, the detection circuit 312 forms a feedback loop with an amplification factor of $-A \times B$. Thus, kTC noise in the charge accumulation region FD when the reset transistor 400 is turned off is reduced to $1/(1+A \times B)$ times. The voltage in the band control signal line CON3 is set so that the operating band of the band control transistor 301 becomes the first band, which is a wide band. This allows noise to be reduced at high speed.

(Noise Reduction Period)

In the period from time t23 to time t25, the voltage in the band control signal line CON3 is set to a voltage between the high level and the low level, for example, to an intermediate voltage therebetween. In this case, the operating band of the band control transistor 301 becomes the second band, which is narrower than the first band.

When the second band is made sufficiently narrower than the operating band of the amplifying transistor 200, the noise reduction effect increases, but the time from t23 to t25 also increases. Even when the second band is higher than the operating band of the amplifying transistor 200, the noise reduction effect is obtained. Hence, a designer can arbitrarily design the second band in accordance with an allowable time from time t23 to time t25. The second band will be described below as a band that is sufficiently narrower than the operating band of the amplifying transistor 200.

When the second band is narrower than the operating band of the amplifying transistor 200, thermal noise that is generated in the band control transistor 301 is reduced to $1/(1+A \times B)^{1/2}$ times by the feedback circuit 30. In this state, at time t25, when the voltage in the band control signal line CON3 is set to the low level to turn off the band control transistor 301, kTC noise that remains in the charge accumulation region FD when the band control transistor 301 is turned off reaches a value obtained by the sum of squares of kTC noise due to the reset transistor 400 and kTC noise due to the band control transistor 301.

When the capacitance of the capacitor 9 is represented by Cs, the kTC noise that is generated in the band control transistor 301 when there is no noise reduction due to the feedback is $(Cfd/Cs)^{1/2}$ times compared with the kTC noise that is generated in the reset transistor 400 when there is no noise reduction due to the feedback. When this point is considered to perform comparison with a case in which there is no feedback, the kTC noise in a case in which there is feedback is reduced to $\{1+(1+A \times B) \times Cfd/Cs\}^{1/2}/(1+A \times B)$ times. Also, at time t25, the voltage in the selection control signal line CON8 is set to the high level to turn off the selecting transistor 502. Thus, the amplifying transistor 200 and the signal reading line 7 are electrically separated from each other.

The tapered reset may be applied, as in the operation flow illustrated in FIG. 33 according to the second embodiment. That is, in the period from time t23 to time t24, the band control signal line CON3 may be controlled so that the band control transistor 301 changes gradually from the on state to the off state across a threshold voltage of the band control transistor 301.

This makes it possible to effectively reduce noise that is generated in all pixels even when the threshold voltage of the band control transistor 301 varies between two or more pixels 311 included in the imaging device 100. The range of changes in the voltage applied to the band control signal line CON3 in the tapered reset may be limited to the range of variations in the threshold voltage of the band control transistor 301 in each pixel. This makes it possible to reduce the time taken for the tapered reset and makes it possible to perform noise reduction at high speed.

(Exposure/Reading Period)

At time t26, the voltage in the selection control signal line CON8 is set to the low level to turn on the selecting transistor 502, and the switching circuit 20 is controlled so that the voltage at the other of the source and the drain of the amplifying transistor 200 reaches Va2 (e.g., VDD). Also, the switching circuit 40 is controlled so that the constant current source 6 is connected to the signal reading line 7. In this state, the amplifying transistor 200 and the constant current source 6 form a source follower circuit. The voltage in the signal reading line 7 becomes a voltage corresponding to the signal charge accumulated in the charge accumulation region FD. In this case, the amplification factor of the source floor circuit is about 1.

At time t26, the voltage at the charge accumulation region FD changes relative to a reset voltage (VR2) by an amount corresponding to a voltage corresponding to signal charge generated in the photoelectric converter 4112A in the period from time t25 to time t26. The amplifier 2 amplifies the voltage at the charge accumulation region FD with an amplification factor of about 1 and outputs the amplified voltage to the signal reading line 7.

The kTC noise is reduced to $\{1+(1+A \times B) \times Cfd/Cs\}^{1/2}/(1+A \times B)$ times in the noise reduction period and is further output to the signal reading line 7 in the exposure/reading period with an amplification factor of about 1. This makes it possible to obtain favorable image data in which the random noise is reduced.

In the present embodiment, increasing Cs as far as the area permits can reduce the random noise, as in the second embodiment. Typically, when the capacitance of the capacitor 9 is increased, the random noise is reduced. However, the signal level decreases when the charge signal in the charge accumulation region FD is converted into a voltage signal, and consequently, the S/N ratio is not improved. However, according to the present embodiment, since the charge accumulation region FD and the node RD are separated by the capacitor 10, the signal level does not decrease even when the capacitance of the capacitor 9 is increased. As a result, since only the random noise is reduced, there is an advantage that the S/N ratio is improved.

Also, according to the present embodiment, CDS can also be performed in order to cancel variations in the peripheral circuitry, as in the second embodiment. Specifically, after the source follower circuit reads the signal voltage at the charge accumulation region FD, the above-described reset operation is performed again. After the reset operation is completed, the source follower circuit performs the reading operation again before the photoelectric converter 4112A performs light detection. This makes it possible to read the reset voltage VRST. The CDS can be performed by determining a difference between the signal voltage at the charge accumulation region FD and the reset voltage VRST.

Also, the feedback for the noise cancelling is performed in each of the pixels 311. Thus, the noise cancelling can be performed at high speed without being affected by the time constant of the signal reading line 7. In addition, an increase in the capacitances of the capacitors arranged in the pixels 311 can obtain a greater noise reduction effect.

In the present embodiment, in the exposure period, since the signal voltage in the charge accumulation region FD is read by the source follower circuit, the amplification factor is about 1. However, the present disclosure is not limited to this amplification factor, and a designer may vary the amplification factor in accordance with an S/N ratio or a circuit range required for the system.

The following description will be given of modifications of the configuration and the operation of the detection circuit 312 according to the present embodiment.

Figure 37A:
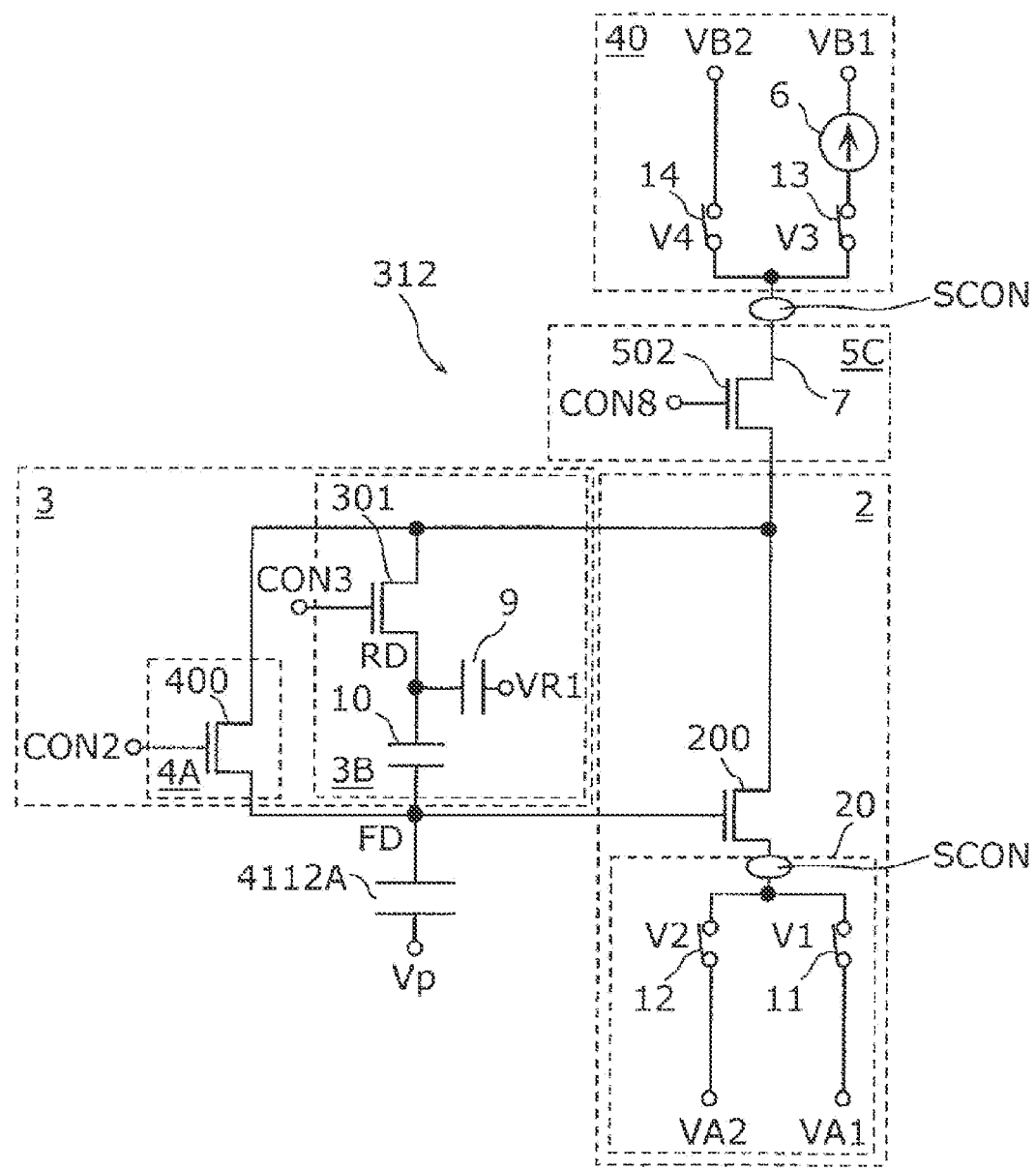
FIG. 37A is a schematic diagram illustrating still another exemplary circuit configuration of the detection circuit according to the third embodiment.
Figure 38A:
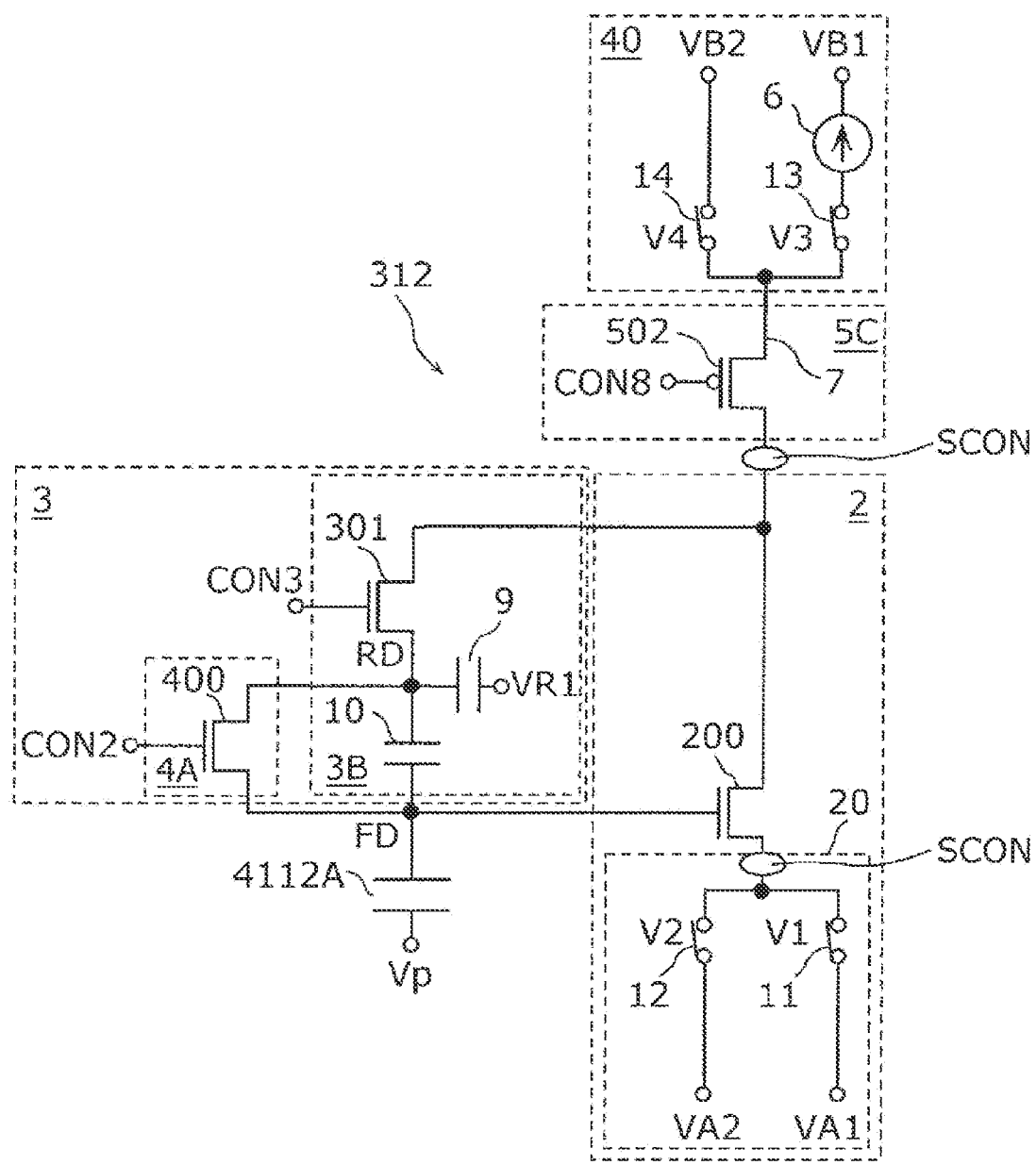
FIG. 38A is a schematic diagram illustrating a yet further exemplary circuit configuration of the detection circuit according to the third embodiment.

FIGS. 37A and 38A schematically illustrate other circuit configurations of the detection circuit 312. In a detection circuit 312 illustrated in each of FIGS. 37A and 38A, a voltage (i.e., an output voltage of the amplifier 2) of the source and the drain of the amplifying transistor 200, instead of the reference voltage VR2, is applied to the reset transistor 400. In this respect, the detection circuit 312 illustrated in each of FIGS. 37A and 38A differs from the detection circuit 312 illustrated in FIG. 35A. The configurations illustrated in FIGS. 37A and 38A make it possible to reduce changes in the voltage at the charge accumulation region FD before and after the reset transistor 400 is turned off, thus making it possible to perform higher-speed noise reduction.

Figure 37B:
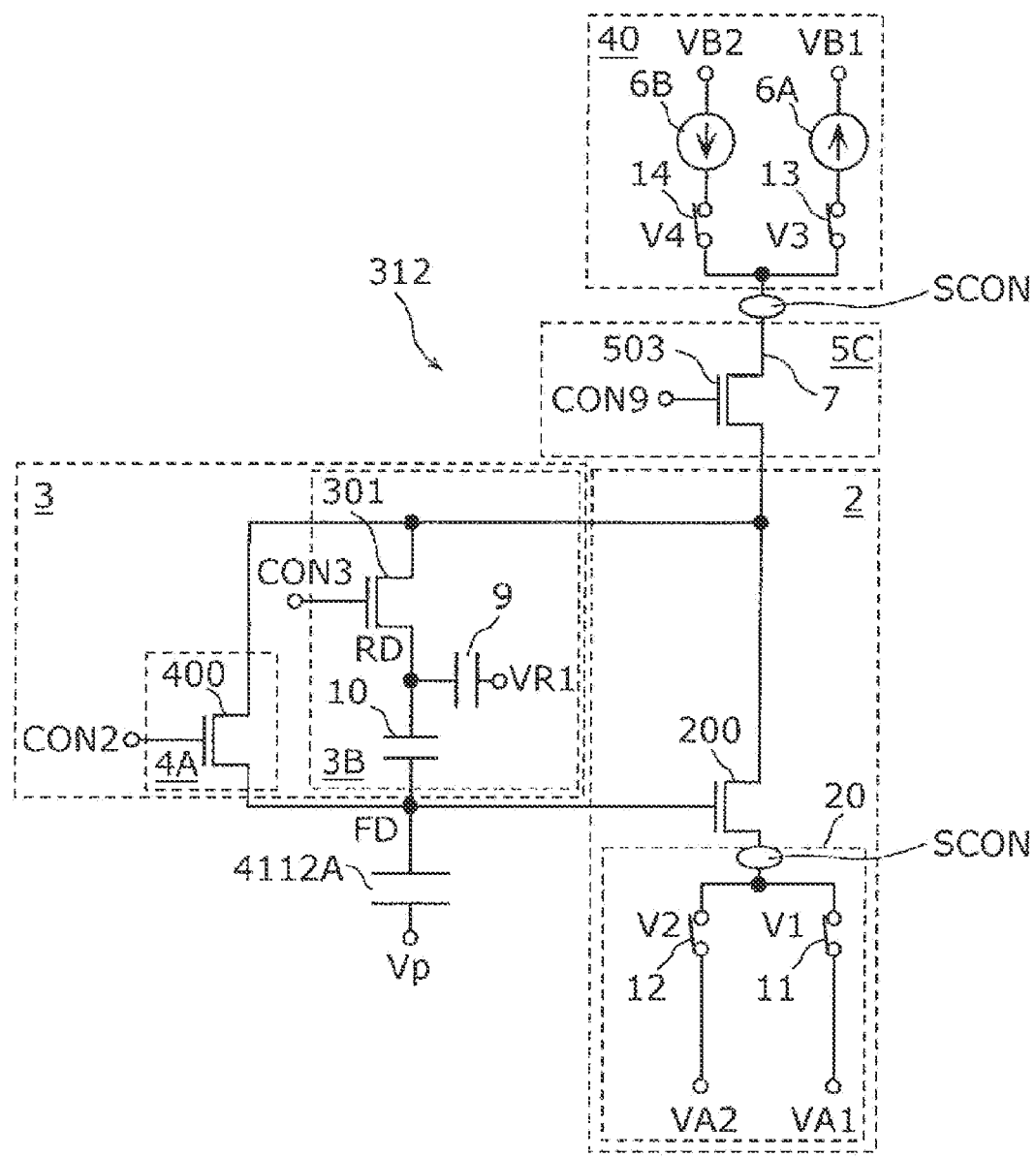
FIG. 37B is a schematic diagram illustrating a further exemplary circuit configuration of the detection circuit according to the third embodiment.
Figure 38B:
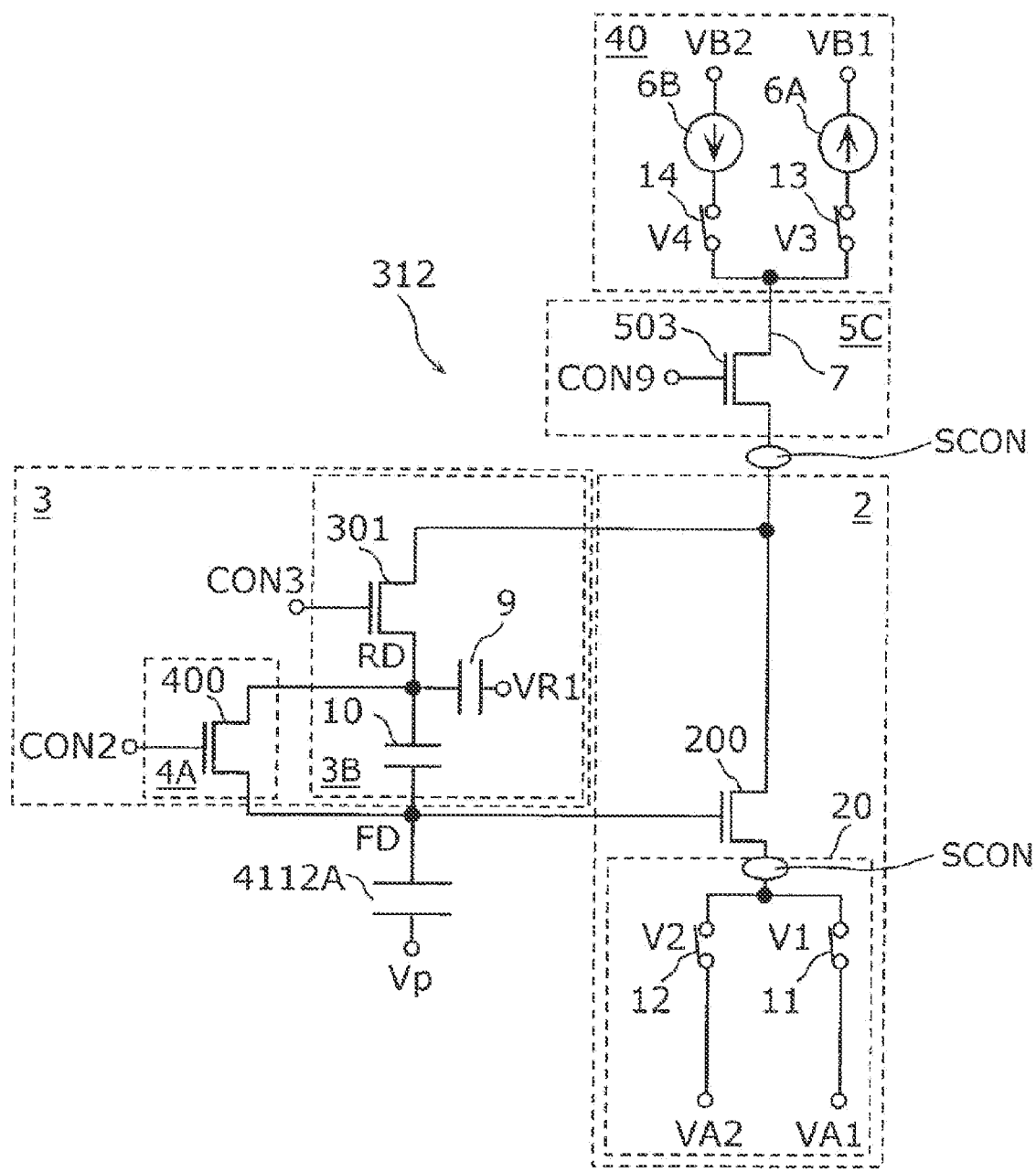
FIG. 38B is a schematic diagram illustrating yet another exemplary circuit configuration of the detection circuit according to the third embodiment.

The configuration in which the switching circuit 40 includes the constant current source 6B, the configuration being described above with reference to FIG. 35B, can also be applied to the configurations illustrated in FIGS. 37A and 38A. FIG. 37B illustrates a modification of the configuration illustrated in FIG. 37A, and FIG. 38B illustrates a modification of the configuration illustrated in FIG. 38A. In each of the modifications, the switching circuit 40 has a constant current source 6B in addition to the constant current source 6A. Also, the output selector 5C has a selecting transistor 503, which is an NMOS transistor. In each of the configurations illustrated in FIGS. 37B and 38B, when the switching element 14 and the selecting transistor 503 are turned on, current can be supplied from the constant current source 6B to the amplifying transistor 200, as in the configuration illustrated in FIG. 35B.

Fourth Embodiment

A structure, a function, and a drive method of an imaging device 100 according to a fourth embodiment will be described with reference to FIGS. 39 to 43. The imaging device 100 according to the present embodiment differs from the imaging device 100 according to the first to third embodiments in the following points. Firstly, an amplifier 2A in a detection circuit 312 has an amplification function and a band control function. Secondly, by returning an output of the amplifier 2A to an input thereof, the amplifier 2A applies a negative feedback with its amplification function (an amplification factor: −A) while performing band control, to thereby reduce the reset noise to $1/(1+A)^{1/2}$.

Figure 39:
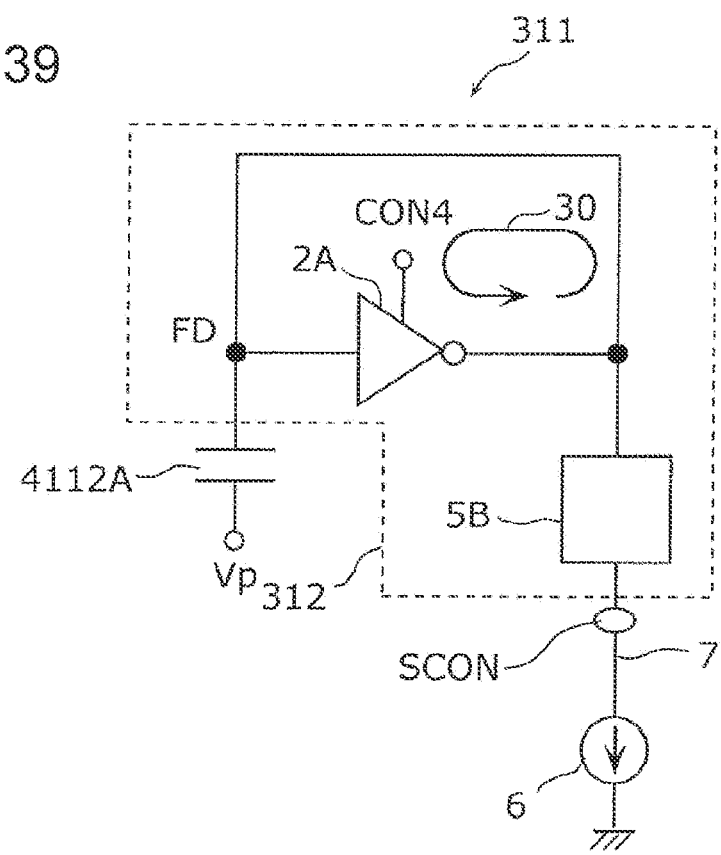
FIG. 39 is a schematic diagram illustrating an exemplary circuit configuration of one pixel according to a fourth embodiment.

FIG. 39 schematically illustrates an exemplary circuit configuration of one pixel 311 in the imaging device 100 according to the present embodiment. The pixel 311 includes a photoelectric converter 4112A and the detection circuit 312. The detection circuit 312 includes the amplifier 2A, a charge accumulation region FD, and an output selector 5B. The output selector 5B is connected to a constant current source 6 through a signal reading line 7 and is driven with current from the constant current source 6. The amplifier 2A amplifies a signal corresponding to charge accumulated in the charge accumulation region FD and performs band control for reducing kTC noise that is generated in the charge accumulation region FD.

The structure and the functions of the detection circuit 312 will be described in detail with reference to FIG. 40.

Figure 40:
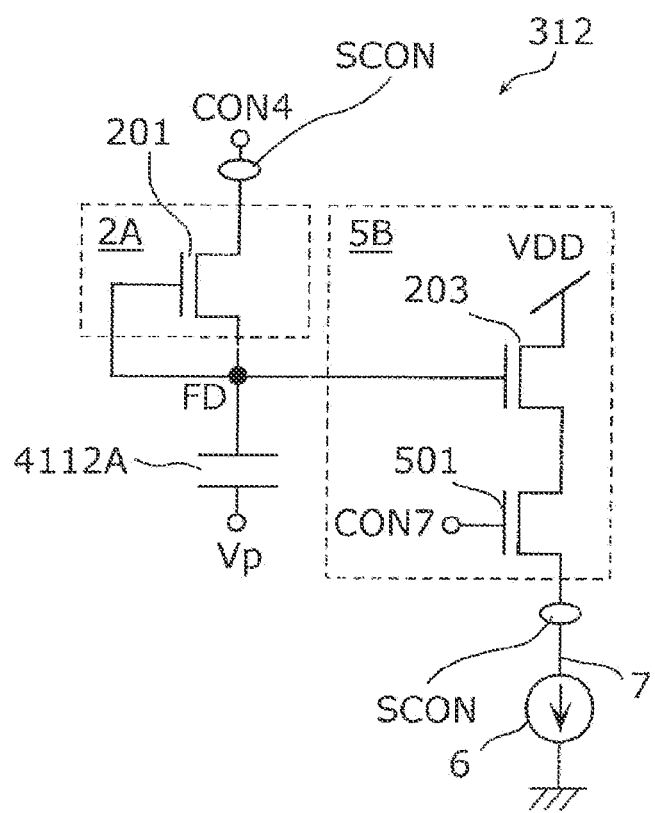
FIG. 40 is a schematic diagram illustrating an exemplary circuit configuration of a detection circuit according to the fourth embodiment.

FIG. 40 schematically illustrates one example of the circuit configuration of the detection circuit 312. The amplifier 2A includes an amplifying transistor 201, and the output selector 5B includes an amplifying transistor 203 and a selecting transistor 501. A relationship of electrical connections in the detection circuit 312 will be described below.

A gate and one of a source and a drain of the amplifying transistor 201 are connected to the charge accumulation region FD. The other of the source and the drain of the amplifying transistor 201 is connected to a control signal line CON4. The amplifying transistor 201 amplifies a signal voltage corresponding to signal charge accumulated in the charge accumulation region FD.

The charge accumulation region FD is connected to a gate of the amplifying transistor 203. One of a source and a drain of the amplifying transistor 203 is connected to a power-supply voltage VDD or a reference voltage. The other of the source and the drain of the amplifying transistor 203 is connected to one of a source and a drain of the selecting transistor 501. A gate of the selecting transistor 501 is connected to a selection control signal line CON7 through which a row to be read is selected. The other of the source and the drain of the selecting transistor 501 is connected to the constant current source 6 through the signal reading line 7. Thus, the amplifying transistor 203, the selecting transistor 501, and the constant current source 6 form a source follower circuit. The selecting transistor 501 also selectively outputs an output of the amplifying transistor 201 to outside through the signal reading line 7.

The gate of the amplifying transistor 201 and one of the source and the drain of the amplifying transistor 201 respectively correspond to an input and an output of the amplifier 2A. The output of the amplifier 2A is connected to the input thereof, as described above, to thereby form a feedback loop. Thus, the feedback circuit 30 negatively feeds back a signal of the photoelectric converter 4112A to the charge accumulation region FD without use of the amplifying transistor 203.

Next, an operation flow of the detection circuit 312 will be described with reference to FIG. 41.

Figure 41:
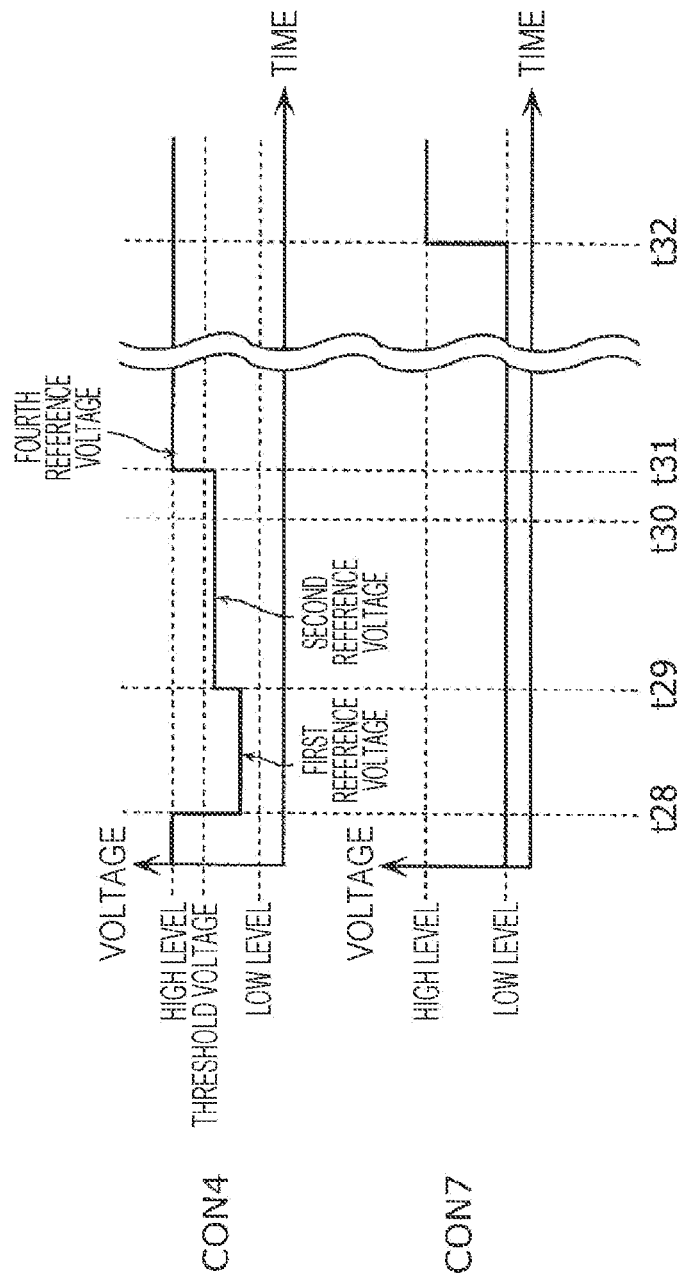
FIG. 41 is a timing chart illustrating one example of an operation of the detection circuit according to the fourth embodiment.

FIG. 41 is a timing chart illustrating one example of the operation of the detection circuit 312. The horizontal axis in each graph represents time. In the vertical axis, CON4 represents a voltage in the control signal line CON4. CON7 represents a voltage in the selection control signal line CON7.

(Reset Period)

At time t28, the voltage in the selection control signal line CON7 is at a low level, so that the selecting transistor 501 is in an off state. That is, the signal reading line 7 and the amplifying transistor 203 are electrically separated from each other. In this state, the voltage in the control signal line CON4 is set to a first reference voltage so that the voltage at the charge accumulation region FD reaches a voltage close to a desired reset voltage VRST. At this point in time, the band of the amplifying transistor 201 is set to a third band, which is a wide band. Thus, voltages at the charge accumulation region FD, the gate of the amplifying transistor 201, and the one of the source and the drain of the amplifying transistor 201 are set to a desired voltage at high speed. The third band means a band corresponding to the first reference voltage.

As the voltage at the charge accumulation region FD gets closer to the reset voltage VRST, the time taken for the noise reduction becomes short, which can reduce the drive time. Thus, it is desirable that the voltage in the control signal line CON4 be set so that the voltage at the charge accumulation region FD reaches a voltage close to the reset voltage VRST. However, if there is a plenty of time for the drive time, the setting value of the voltage in the control signal line CON4 is not limited to that value.

(Noise Reduction Period)

In the period from time t29 to time t31, the selection control signal line CON7 remains at the low level, so that the selecting transistor 501 is in the off state. That is, the signal reading line 7 and the amplifying transistor 203 remain electrically disconnected from each other. In this state, the voltage in the control signal line CON4 is set to a second reference voltage. As a result, the amplifying transistor 201 is gradually changed from the on state to the off state. At this point in time, kTC noise is generated in the amplifying transistor 201. This kTC noise is dependent on a capacitance Cfd that is parasitic in the charge accumulation region FD to which the one of the source and the drain of the amplifying transistor 201 is connected. Accordingly, the kTC noise is reduced using the feedback loop formed by the amplifying transistor 201.

When the second reference voltage is set to such a voltage with which the amplifying transistor 201 is suddenly changed from the on state to the off state, the bandwidth of reset noise that is generated is increased up to several terahertz. Therefore, with the feedback loop using the amplifier 2A, it is difficult to reduce high-frequency noise that exceeds the band of the amplifier 2A. Accordingly, in the period from time t29 to time t31, the second reference voltage is set so that the band of the amplifying transistor 201 reaches a fourth band, which is narrower than the third band. The fourth band means a band corresponding to the second reference voltage. This allows the band of the amplifying transistor 201 to be limited to within the band of the amplifier 2A which is formed by the feedback loop thereof. In addition, the reset noise that is generated in the amplifying transistor 201 can be efficieny reduced in all bands.

At time t31 after the noise is sufficiently reduced, the voltage in the control signal line CON4 is changed to a fourth reference voltage with which the amplifying transistor 201 is completely turned off. As a result, the feedback loop formed by the amplifying transistor 201 is disconnected, so that the voltage at the charge accumulation region FD is stabilized in the state in which the noise is reduced.

Figure 42:
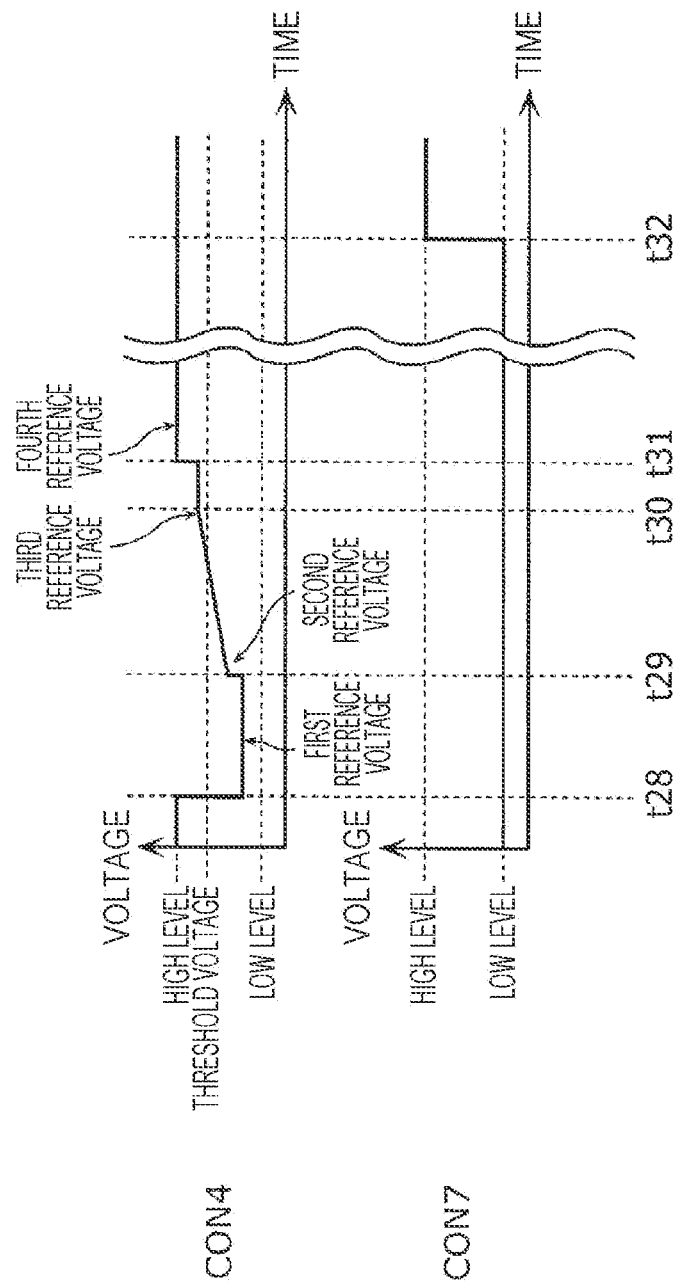
FIG. 42 is a timing chart illustrating another example of the operation of the detection circuit according to the fourth embodiment.

The tapered reset described above with reference to FIGS. 18 and 33 may also be applied in the noise reduction period in the present embodiment. FIG. 42 is a timing chart illustrating one example of the operation of the detection circuit 312 when the tapered reset is applied. As illustrated in FIG. 42, in the period from time t29 to time t30, the voltage in the control signal line CON4 may be gradually changed in the range from the second reference voltage to a third reference voltage so that the voltage at the amplifying transistor 201 crosses a threshold voltage. With such an arrangement, the amplifying transistor 201 changes gradually from the on state to the off state. In other words, in the period from time t29 to time t30, the voltage in the control signal line CON4 is changed so that the band of the amplifying transistor 201 changes gradually from the fourth band to a fifth band. The fifth band means a band corresponding to the third reference voltage. The amplifying transistor 201 is gradually changed from the on state to the off state, while limiting the band of the amplifying transistor 201 to within the band of the amplifier 2A which is formed by the feedback loop of the amplifying transistor 201. Thus, noise that is generated in the charge accumulation region FD can be reduced in all bands. In this case, the fourth band and the fifth band are narrower than the third band. The second reference voltage and the third reference voltage may include a predetermined margin, considering manufacture variations among unit pixels.

(Exposure/Reading Period)

In a state in which the noise in the charge accumulation region FD is sufficiently reduced, and the voltage is stabilized, charge is accumulated in the charge accumulation region FD in a desired period. Thereafter, at time t32, the selecting transistor 501 is turned on to electrically connect the amplifying transistor 203 to the signal reading line 7. As a result, the amplifying transistor 203 and the constant current source 6 form a source follower circuit. The signal charge accumulated in the charge accumulation region FD is amplified by the source follower circuit, and the amplified signal charge is output to the peripheral circuitry (a CDS circuit, an A/D circuit, or the like) through the signal reading line 7.

When a noise reduction rate and stability during reading are considered, it is desirable that the gain of the amplifier 2A be increased as much as possible. For example, it is desirable that the gain of the amplifier 2A be set larger than the gain of the amplifier (i.e., the source follower) in the output selector 5B.

According to the present embodiment, CDS can also be performed in order to cancel variations in the peripheral circuitry, as in the other embodiments. Specifically, at time t32, the source follower circuit reads the signal voltage at the charge accumulation region FD, and then the above-described reset operation is performed again. After the reset operation is completed, the source follower circuit performs the operation for reading the reset voltage again, before the photoelectric converter 4112A performs light detection. This makes it possible to read the reset voltage VRST. The CDS can be performed by determining a difference between the signal voltage at the charge accumulation region FD and the reset voltage VRST.

Also, in the present embodiment, in the exposure period, since the signal voltage at the charge accumulation region FD is read by the source follower circuit, the amplification factor is about 1. However, the present disclosure is not limited to this amplification factor, and a designer may vary the amplification factor in accordance with an S/N ratio or a circuit range required for the system.

In the present embodiment, the feedback for the noise cancelling is completed within the pixel 311, as in the first to third embodiments. Thus, the noise cancelling can be performed at high speed without being affected by the time constant of the signal reading line 7. In addition, the amplifier 2A has both the amplification function and the band control function. This makes it possible to provide measures for a reduction in the area of the pixels 311 and a reduction in the width of pixel cells. This is a noteworthy feature of the present embodiment. In an imaging device having a small pixel area, noise in a charge accumulation region FD can be effectively reduced without an increase in the number of constituent elements.

In the present embodiment, in the reset period and the noise reduction period, the selecting transistor 501 is turned off to put the amplifying transistor 203 into a state in which it is disconnected from the signal reading line 7. However, the present disclosure is not limited to this example, and for example, the signal may be read at a timing that is different from the above-described timing. In such a case, the signal reading may be performed while the selecting transistor 501 is in the on state. If there is a plenty of time for the drive time, only the operations in the noise reduction period and the exposure/reading period may be performed without providing the reset period and without performing driving for reducing a convergence time in which the reset noise is reduced. In addition, the signal reading line 7 and/or the constant current source 6 may be provided for each pixel 311 or may be shared by two or more pixels 311.

Figure 43:
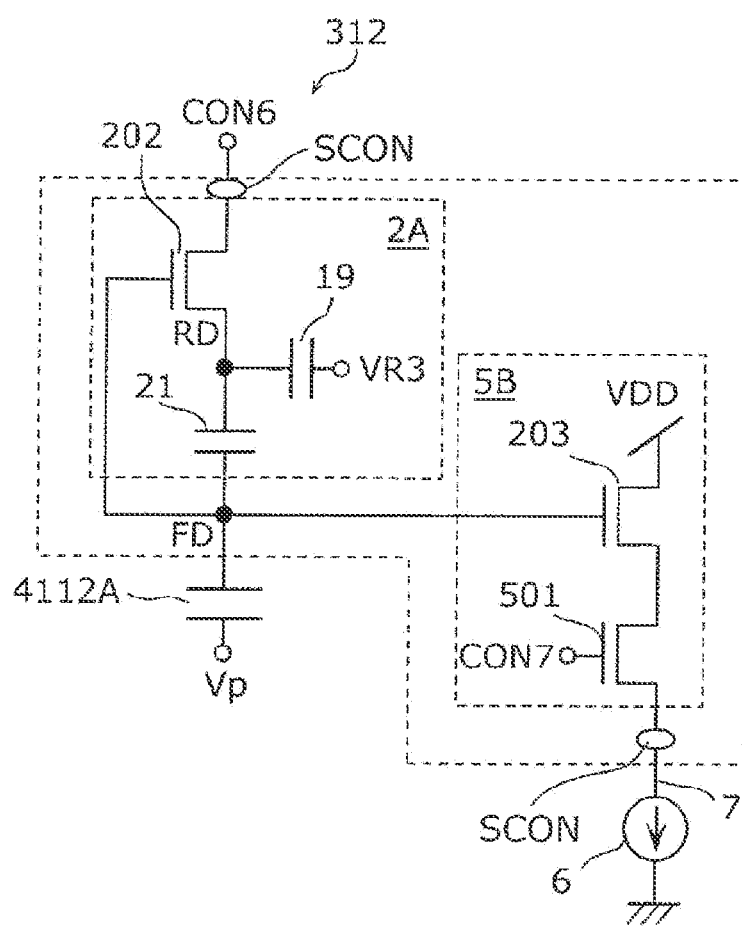
FIG. 43 is a schematic diagram illustrating another exemplary circuit configuration of the detection circuit according to the fourth embodiment.

The following description will be given of a modification of the configuration and the operation of the detection circuit 312 according to the present embodiment. FIG. 43 schematically illustrates another example of the circuit configuration of the detection circuit 312.

What is noteworthy in the configuration in this modification is that the amplifier 2A includes capacitors 19 and 21 in addition to an amplifying transistor 202.

A gate of the amplifying transistor 202 is connected to the charge accumulation region FD. One of a source and a drain of the amplifying transistor 202 is connected to a control signal line CON6. The other of the source and the drain of the amplifying transistor 202 is connected to one end of the capacitor 19 and one end of the capacitor 21. Another end of the capacitor 19 is connected to a third reference voltage VR3. Another end of the capacitor 21 is connected to the charge accumulation region FD. A node RD is formed among the amplifying transistor 202 and the capacitors 19 and 21.

According to the configuration in this modification, the gate of the amplifying transistor 202 corresponds to an input of the amplifier 2A, and the other end of the capacitor 21 corresponds to an output of the amplifier 2A. When the output is connected to the input, a negative feedback loop is formed. When the amplification factor of the amplifier 2A is −A, reset noise that is generated in the amplifying transistor 202 can be reduced to $1/(1+A)^{1/2}$.

A first advantage of this modification is that setting a capacitance C3 of the capacitor 19 to a larger capacitance than the capacitance Cfd of the charge accumulation region FD allows kTC noise that is generated in the amplifying transistor 202 to be reduced to $(kT/C3)^{1/2} < (kT/Cfd)^{1/2}$. A second advantage is that, when a capacitance C4 of the capacitor 21 is set smaller than the capacitance Cfd of the charge accumulation region FD, the amount of noise in the charge accumulation region FD can be attenuated to C4/(Cfd+C4) times, owing to voltage division of the capacitance Cfd of the charge accumulation region FD and the capacitance C4 of the capacitor 21.

An effect that is provided by this modification will be specifically compared with that in the configuration illustrated in FIG. 40. In the configuration described above and illustrated in FIG. 30, when the gain of the amplifier 2A is A, and the gain of the amplifying transistor 201 is A', the reset noise in the amplifying transistor 201 is reduced to $1/(1+A)^{1/2}=1/(1+A')^{1/2}$. On the other hand, in this modification, when the gain of the amplifier 2A is A, and the gain of the amplifying transistor 202 is A', the reset noise in the amplifying transistor 202 is reduced to $1/(1+A)^{1/2}=1/[1+A' \times \{C4/(Cfd+C4)\} \times (C3/Cfd)]^{1/2}$. In this manner, the reset noise can be significantly reduced compared with the configuration illustrated in FIG. 40.

With respect to noise reduction, typically, when the capacitance C3 of the capacitor 19 is increased, the random noise is reduced. However, when the signal charge in the charge accumulation region FD is converted into a voltage signal, the signal level decreases, and consequently, the S/N ratio is not improved. However, according to this modification, since the charge accumulation region FD and the node RD are separated by the capacitor 21, the signal level does not decrease even when the capacitance is increased. Hence, only the random noise is reduced, and thus the S/N ratio is improved.

Next, a reading operation in the imaging device 100 according to this modification will be described while attention is given to points that differ from the drive method illustrated in FIG. 41 or 42.

The control signal line CON6 is connected to the amplifier 2A. In principle, a signal that is the same as the signal in the control signal line CON4 illustrated in FIG. 41 is input to the control signal line CON6. Note that instead of inputting the same signal as the control signal line CON4 to the control signal line CON6, the fifth reference voltage may be set as the third reference voltage VR3, and a voltage of the other of the source and drain of the amplification transistor 202 may be changed. Alternatively, the node RD may be directly controlled. In this case, the fifth reference voltage corresponds to the second reference voltage.

Also, a voltage that changes gradually from the on state to the off state across a threshold of the amplifying transistor 202 may be input to the control signal line CON6, as in the control signal line CON4 illustrated in FIG. 42. That is, in the period from time t29 to time t30, the voltage in the control signal line CON6 may be gradually changed in the range of the second reference voltage to the third reference voltage so as to cross the threshold voltage. Alternatively, in the period from time t29 to time t30, a voltage that changes from the fifth reference voltage to a sixth reference voltage, instead of using the control signal line CON6, may be set as the third reference voltage VR3 to change the voltage at the other of the source and the drain of the amplifying transistor 202. Alternatively, the node RD may be directly controlled. In this case, the sixth reference voltage corresponds to the third reference voltage.

According to this modification, owing to the effects of the capacitors 19 and 21, the noise reduction rate can be significantly increased compared with the configuration illustrated in FIG. 40.

When two capacitances are arranged, the noise reduction effect increases. However, the arrangement area also increases. Since the noise reduction effect varies depending on the presence/absence of a capacitor and the absolute value of the capacitance, a designer can select an arbitrary configuration and an arbitrary value to perform design.

Fifth Embodiment

A structure, a function, and a drive method of an imaging device 100 according to a fifth embodiment will be described with reference to FIGS. 44 to 50. The imaging device 100 according to the present embodiment differs from the imaging device 100 according to the fourth embodiment in that a switching portion 4B is added to the detection circuit 312 according to the fourth embodiment. Points that differ from the fourth embodiment will be mainly described below.

Figure 44:
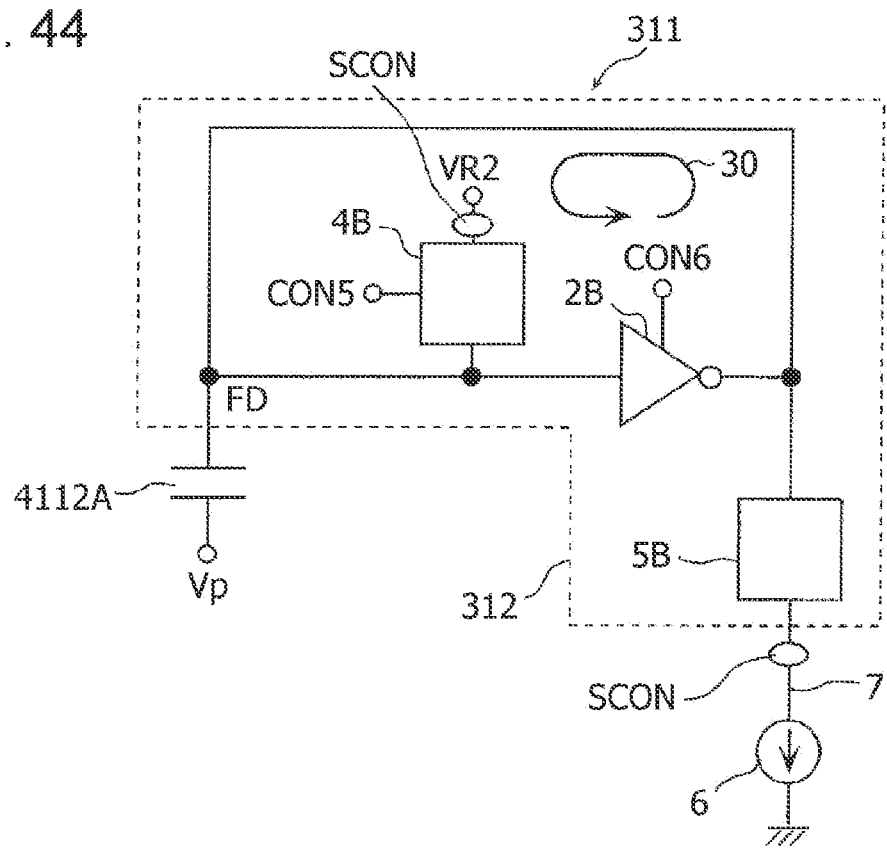
FIG. 44 is a schematic diagram illustrating an exemplary circuit configuration of one pixel according to a fifth embodiment.
Figure 45:
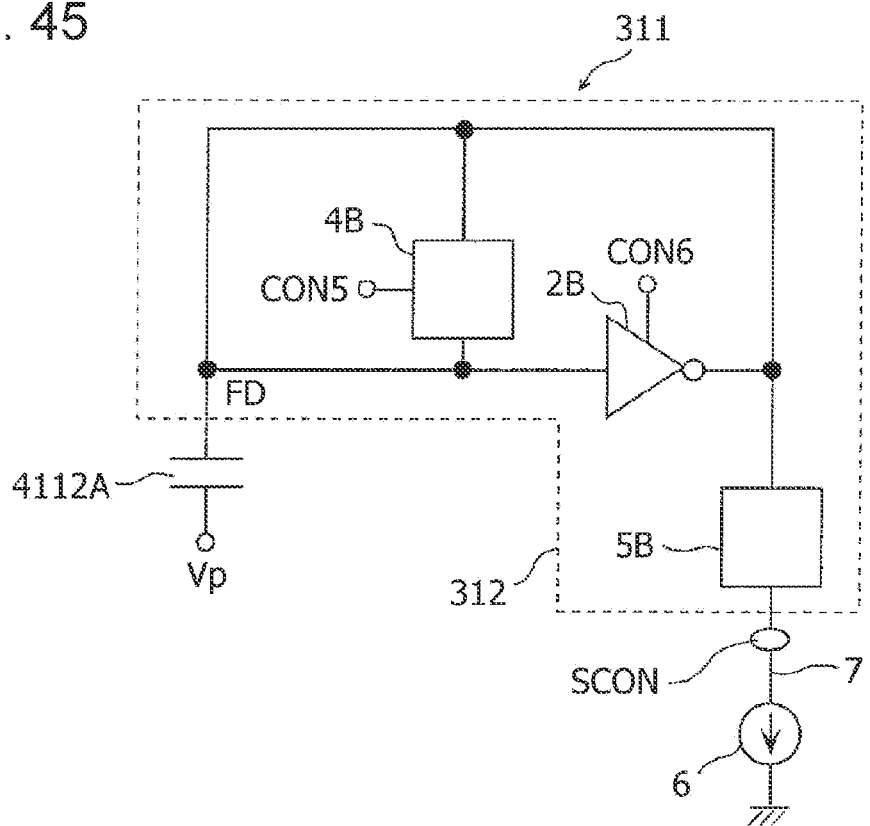
FIG. 45 is a schematic diagram illustrating another exemplary circuit configuration of the pixel according to the fifth embodiment.

FIGS. 44 and 45 schematically illustrate exemplary circuit configurations of one pixel 311 in the imaging device 100 according to the present embodiment. The pixel 311 includes a photoelectric converter 4112A and a detection circuit 312. The detection circuit 312 includes an amplifier 2B, a charge accumulation region FD, the switching portion 4B, and an output selector 5B.

The structure and the functions of the detection circuit 312 will be described in detail with reference to FIG. 46.

Figure 46:
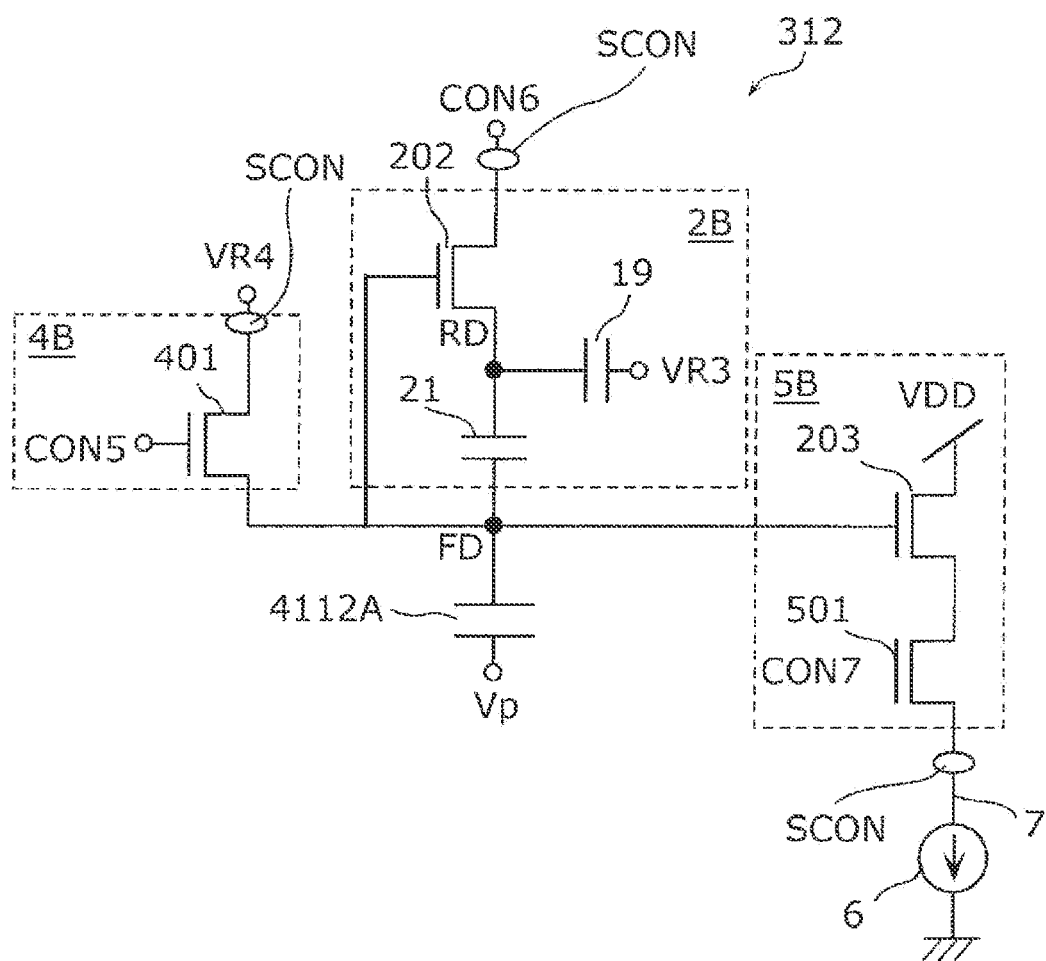
FIG. 46 is a schematic diagram illustrating an exemplary circuit configuration of a detection circuit according to the fifth embodiment.

FIG. 46 schematically illustrates one example of the circuit configuration of the detection circuit 312. The switching portion 4B includes a switching transistor 401. A control signal line CON5 is connected to a gate of the switching transistor 401. The charge accumulation region FD is connected to one of a source and a drain of the switching transistor 401. A reference voltage VR4 is connected to the other of the source and the drain of the switching transistor 401. The control signal line CON6 is connected to one of a source and a drain of an amplifying transistor 202.

Next, the operation flow of the detection circuit 312 will be described with reference to FIG. 47.

Figure 47:
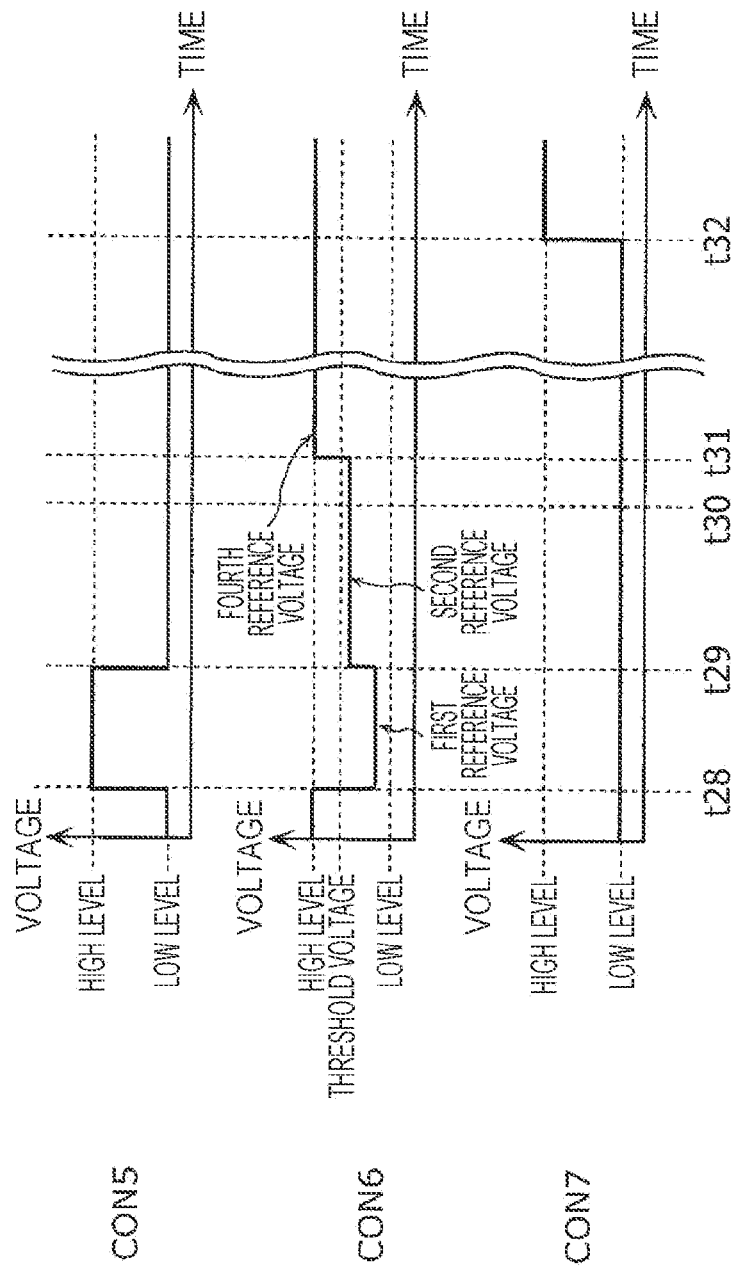
FIG. 47 is a timing chart illustrating one example of an operation of the detection circuit according to the fifth embodiment.

FIG. 47 is a timing chart illustrating one example of the operation of the detection circuit 312. The horizontal axis in each graph represents time. In the vertical axis, CON5 represents a voltage in the control signal line CON5. CON6 represents a voltage in the control signal line CON6. CON7 represents a voltage in a selection control signal line CON7.

(Reset Period)

At time t28, the voltage in the control signal line CON5 is set to a high level to turn on the switching transistor 401. At this point in time, the reference voltage VR4 and the charge accumulation region FD are connected to each other. Also, at time t28, the voltage in the selection control signal line CON7 is at a low level, so that a selecting transistor 501 is in an off state. That is, an amplifying transistor 203 is electrically disconnected from a signal reading line 7. In this state, the voltage in the control signal line CON6 is set to a first reference voltage so that the voltage at the charge accumulation region FD reaches a voltage that is close to a desired reset voltage VRST (=VR4). At this point in time, the band of the amplifying transistor 202 is set to the third band, which is a wide band, so that the voltages at the charge accumulation region FD, the gate of the amplifying transistor 202, and the other of the source and the drain of the amplifying transistor 202 are set to a desired voltage at high speed.

As the voltage at the charge accumulation region FD gets closer to the reset voltage VRST, the time taken for the noise reduction becomes short, which can reduce the drive time. Thus, it is desirable to apply a voltage to the control signal line CON6 so that the voltage at the charge accumulation region FD reaches a voltage that is close to the reset voltage VRST. However, if there is a plenty of time for the drive time, the setting value of the voltage is not limited to that value.

At time t29, the voltage in the control signal line CON5 is set to a low level to turn off the switching transistor 401 so as to cause the reference voltage VR4 and the charge accumulation region FD to be disconnected from each other.

(Noise Reduction Period)

In a state in which the switching transistor 401 is turned off, and the reference voltage VR4 and the charge accumulation region FD are disconnected from each other, a noise reduction operation and a signal-level or reset-level reading operation are performed.

In the period from time t29 to time t31, the voltage in the selection control signal line CON7 remains at the low level, so that the selecting transistor 501 is turned off. That is, the signal reading line 7 and the amplifying transistor 203 remain electrically disconnected from each other. In this state, the voltage in the control signal line CON6 is set to a second reference voltage. As a result, the amplifying transistor 202 is gradually changed from the on state to the off state.

In the period from time t29 to time t31, the second reference voltage is set so that the band of the amplifying transistor 202 becomes a fourth band, which is narrower than the third band. This allows the band of the amplifying transistor 202 to be limited to within the band of the amplifier 2B which is formed by the feedback loop thereof. In addition, the reset noise that is generated in the amplifying transistor 202 can be efficiently reduced in all bands.

At time t31 after the noise is sufficiently reduced, the voltage in the control signal line CON6 is changed to a fourth reference voltage with which the amplifying transistor 202 is completely turned off. As a result, the feedback loop formed by the amplifying transistor 202 is disconnected, and the voltage at the charge accumulation region FD is stabilized in the state in which the noise is reduced.

Figure 48:
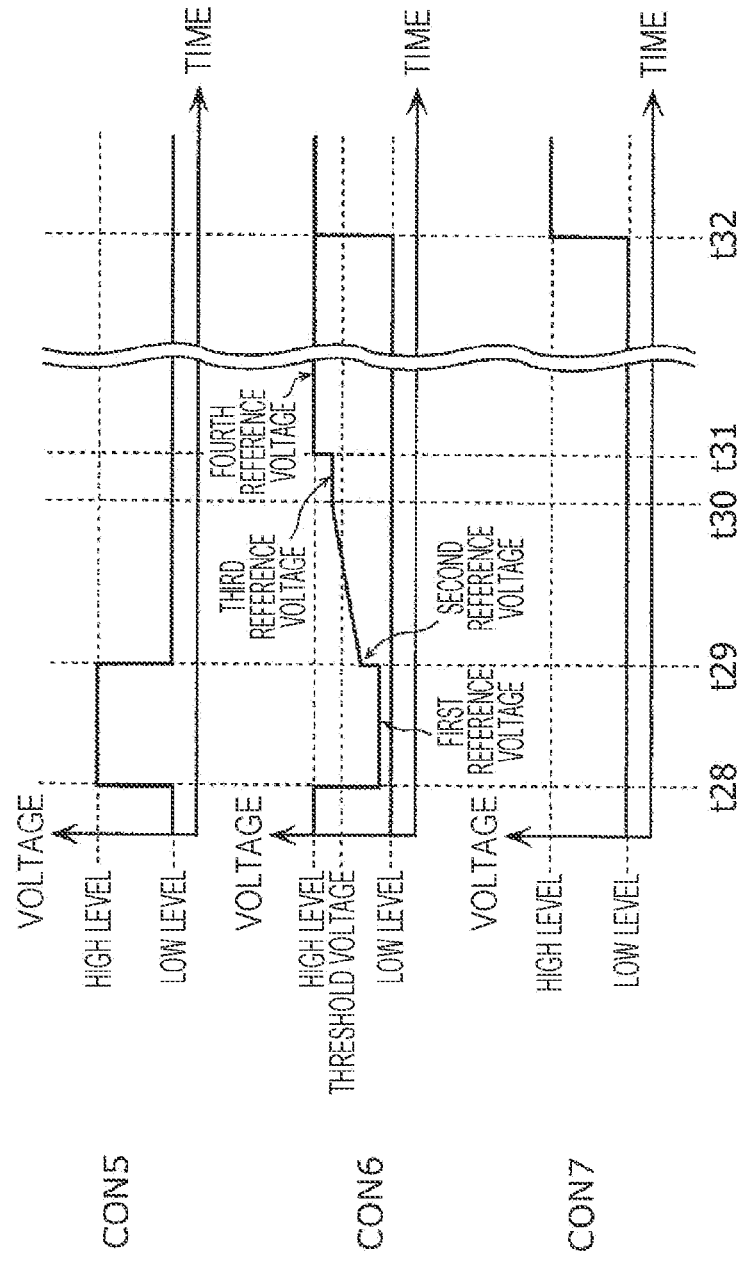
FIG. 48 is a timing chart illustrating another example of the operation of the detection circuit according to the fifth embodiment.

The tapered reset described above with reference to FIGS. 18 and 33 may also be applied in the noise reduction period in the present embodiment. FIG. 48 is a timing chart illustrating one example of the operation of the detection circuit 312 when the tapered reset is applied. As illustrated in FIG. 48, in the period from time t29 to time t30, the voltage in the control signal line CON6 may be gradually changed in the range from the second reference voltage to the third reference voltage so as to cross a threshold voltage of the amplifying transistor 202. The amplifying transistor 202 gradually changes from the on state to the off state. Thus, noise that is generated in the charge accumulation region FD can be reduced in all bands.

(Exposure/Reading Period)

In a state in which the noise in the charge accumulation region FD is sufficiently reduced, and the voltage is stabilized, signal charge is accumulated in the charge accumulation region FD in a desired period. Thereafter, at time t32, the selecting transistor 501 is turned on to electrically connect the amplifying transistor 203 to the signal reading line 7. Thus, the amplifying transistor 203 and the constant current source 6 form a source follower circuit. The signal charge accumulated in the charge accumulation region FD is amplified by the source follower circuit, and the amplified signal charge is output to the peripheral circuitry (a CDS circuit, an A/D circuit, or the like) through the signal reading line 7.

According to the present embodiment, controlling the switching transistor 401 allows the voltage at the charge accumulation region FD to be set to a desired reset voltage VRST at high speed.

In the fourth embodiment, the gain of the amplifier 2A is set to −A, and the reset noise generated in the amplifying transistor 201 or the amplifying transistor 202 is fed back while being subjected to band limitation. As a result, the reset noise is reduced to $1/(1+A)^{1/2}$ times.

In contrast, according to the present embodiment, since the feedback is applied after the switching transistor 401 is turned off, the reset noise that is generated in the switching transistor 401 can be significantly reduced to $1/(1+A)^{1/2}$. Also, the reset noise that is generated in the amplifying transistor 202 is fed back while being subjected to the band limitation, so that the reset noise is reduced to $1/(1+A)^{1/2}$. In addition, when a capacitance C3 of a capacitor 19 is set larger than a capacitance Cfd of the charge accumulation region FD, as in the modification in the fourth embodiment, kTC noise that is generated in the amplifying transistor 202 can be reduced to $(kT/C3)^{1/2} < (kT/Cfd)^{1/2}$. Also, when the capacitance of the capacitor 21 is set smaller than the capacitance Cfd of the charge accumulation region FD, the amount of noise in the charge accumulation region FD can be attenuated to C4/(Cfd+C4) times, owing to voltage division of the capacitance Cfd of the charge accumulation region FD and the capacitance C4 of the capacitor 21.

The effect provided in the present embodiment is specifically compared with the effect provided in the configuration in the embodiment described above and illustrated in FIGS. 40 and 43. According to the configuration illustrated in FIG. 40, when the gain of the amplifier 2A is A, and the gain of the amplifying transistor 201 is A', the reset noise in the amplifying transistor 201 is reduced to $1/(1+A)^{1/2} = 1/(1+A')^{1/2}$. In contrast, according to the configuration illustrated in FIG. 43, when the gain of the amplifier 2A is A, and the gain of the amplifying transistor 202 is A', the reset noise in the amplifying transistor 202 is reduced to $1/(1+A)^{1/2} = 1/[1+A' \times \{C4/(Cfd+C4)\} \times (C3/Cfd)]^{1/2}$. Thus, the reset noise can be reduced compared with the configuration illustrated in FIG. 40.

On the other hand, according to the present embodiment, when the gain of the amplifier 2B is A, and the gain of the amplifying transistor 202 is A', the reset noise in the switching transistor 401 is reduced to $1/(1+A) = 1/[1+A' \times \{C4/(Cfd+C4)\}]$. Also, the reset noise in the amplifying transistor 202 can be reduced to $1/(1+A)^{1/2} = 1/[1+A' \times \{C4/(Cfd+C4)\} \times (C3/Cfd)]^{1/2}$. Since the total noise can be obtained by the square root of the sum of squares of the reset noise in the switching transistor 401 and the reset noise in the amplifying transistor 202, the reset noise can be significantly reduced compared with the fourth embodiment.

According to the present embodiment, compared with the fourth embodiment, the reset noise can be significantly reduced owing to the effects of the capacitors 19 and 21. Also, since the switching portion 4B is provided, the resetting and the noise reduction can be easily performed at high speed.

Since the capacitors 19 and 21 and the switching portion 4B are provided, as described above, a greater noise reduction effect can be obtained. However, the arrangement area also increases. Since the noise reduction effect depends on the presence/absence of a capacitor and the absolute value of the capacitance, a designer can select an arbitrary configuration and the absolute value of the capacitance to perform design.

The following description will be given of a modification of the detection circuit 312 according to the present embodiment.

Figure 49:
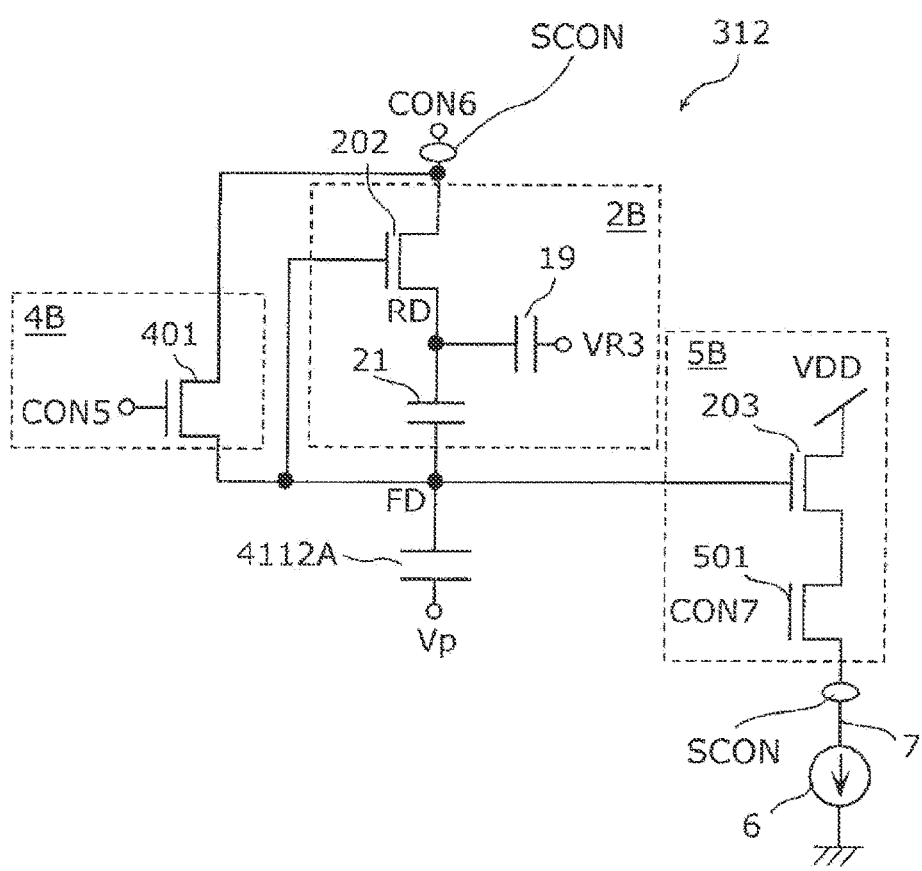
FIG. 49 is a schematic diagram illustrating still another exemplary circuit configuration of the detection circuit according to the fifth embodiment.
Figure 50:
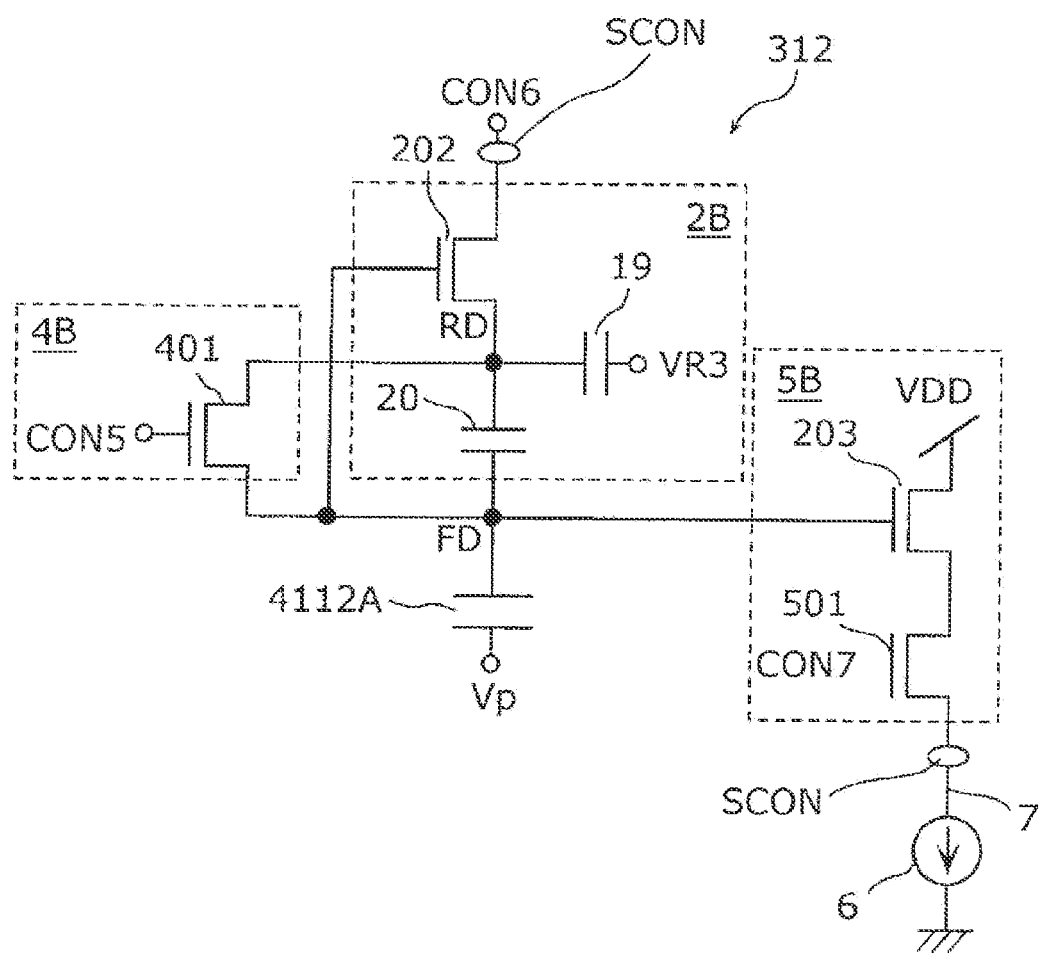
FIG. 50 is a schematic diagram illustrating yet another exemplary circuit configuration of the detection circuit according to the fifth embodiment.

FIGS. 49 and 50 schematically illustrate other exemplary circuit configurations of the detection circuit 312. As illustrated in FIG. 49, one of the source and the drain of the switching transistor 401 may be connected to the charge accumulation region FD, and the other of the source and the drain of the switching transistor 401 may be connected to the control signal line CONE. This configuration makes it possible to execute the resetting without applying the reference voltage VR4 and can provide an effect that is analogous to that in the configuration illustrated in FIG. 46.

Also, in another modification of the switching portion 4B, as illustrated in FIG. 50, one of the source and the drain of the switching transistor 401 may be connected to the charge accumulation region FD, and the other of the source and the drain of the switching transistor 401 may be connected to a node (i.e., a node RD) between the capacitors 19 and 21. This configuration makes it possible to execute the resetting without applying the reference voltage VR4 and provides an effect that is analogous to the effect in the configuration illustrated in FIG. 46. According to this configuration illustrated in FIG. 50, the gate of the amplifying transistor 202 and the other of the source and the drain of the amplifying transistor 202 can be set to the same voltage, thus making it possible to reduce the time of the noise cancelling.

Although the operation of the feedback circuit 30 or 30' for negative feedback has been described above in the first to fifth embodiments, the feedback is not limited thereto. Positive feedback can also be added to the feedback. For example, the noise may be reduced by applying negative feedback after applying positive feedback or may be reduced in an order opposite thereto. The noise may also be reduced while applying positive feedback and negative feedback at the same time. When positive feedback and negative feedback are used in combination, as described above, it is expected that the noise reduction can be performed at higher speed and with higher efficiency.

In FIGS. 46, 49, and 50, the photoelectric converter 4112A and the amplifying transistor 203 may be arranged in the first substrate 101, the control signal line CON6 and the constant current source 6 may be arranged in the second substrate 102, and the photoelectric converter 4112A and the amplifying transistor 203 may be connected to the control signal line CON6 and the constant current source 6 via the substrate connection portions SCON. This makes it possible to transmit signals to the pixels while reducing signal attenuation. The imaging device 100 may also be configured so that a control signal to the control signal line CON5 for the switching transistor 401 in the first substrate 101 is transmitted from a control signal generation circuit arranged in the second substrate 102 to the substrate connection portion SCON. Also, the imaging device 100 may be configured so that, in FIG. 46, a circuit for generating the reference voltage VR4 is arranged in the second substrate 102 to transmit the reference voltage VR4 to the switching transistor 401 in the first substrate 101 via the substrate connection portion SCON.

Sixth Embodiment

Figure 51:
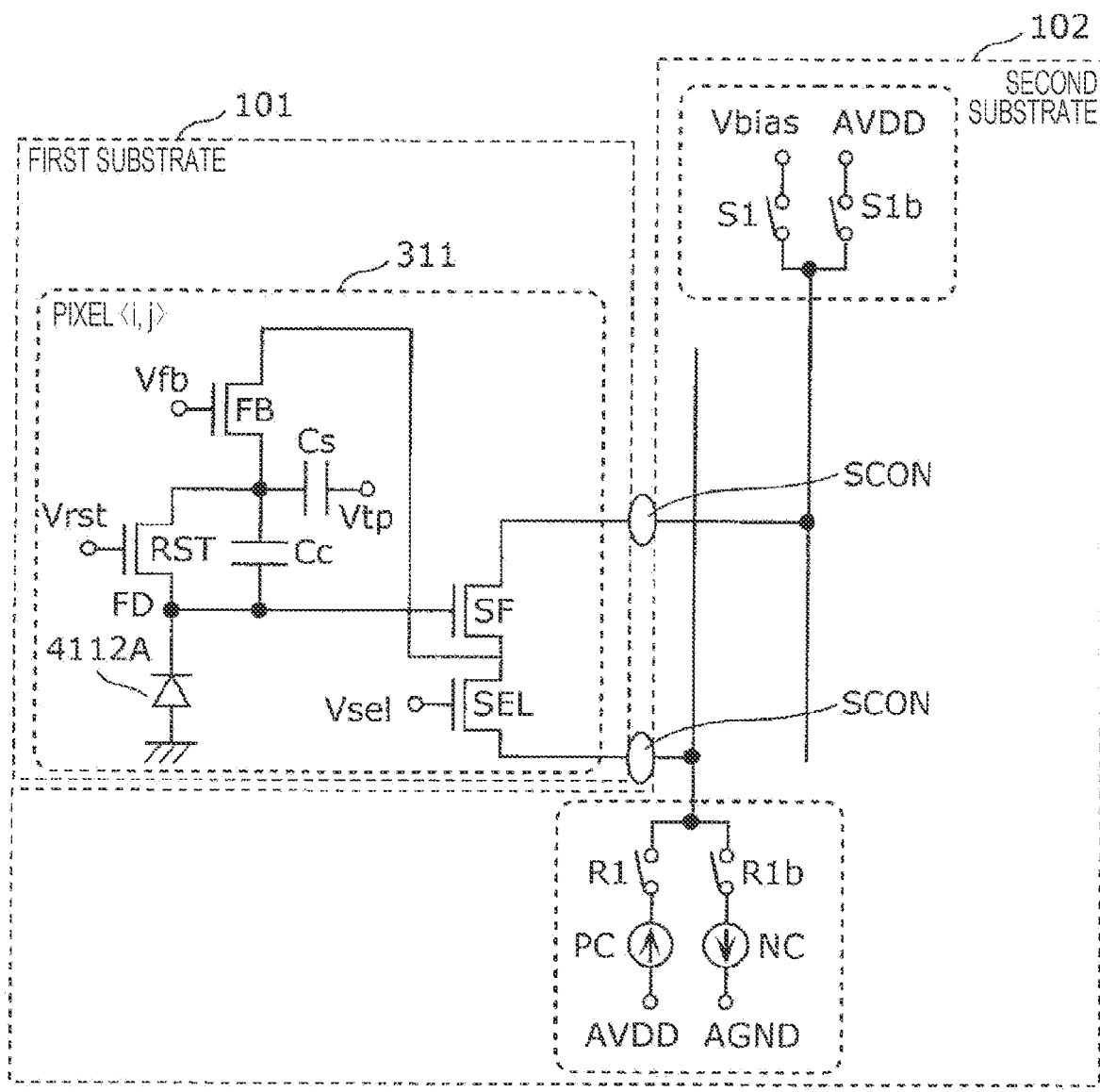
FIG. 51 is a schematic diagram illustrating an exemplary circuit configuration of one pixel according to a sixth embodiment.

FIG. 51 illustrates an exemplary circuit configuration of one pixel 311 according to a sixth embodiment. The pixel 311 according to the sixth embodiment performs an operation that is similar to the embodiment described with reference to FIGS. 38A and 38B. An amplifying transistor SF is arranged in a first substrate 101, as in a photoelectric converter 4112A, and substrate connection portions SCON electrically connect both ends of the amplifying transistor SF to a second substrate 102.

The photoelectric converter 4112A may be provided in the first substrate 101, as in a silicon image sensor, or may be stacked in the first substrate 101, as in an organic image sensor.

Figure 52:
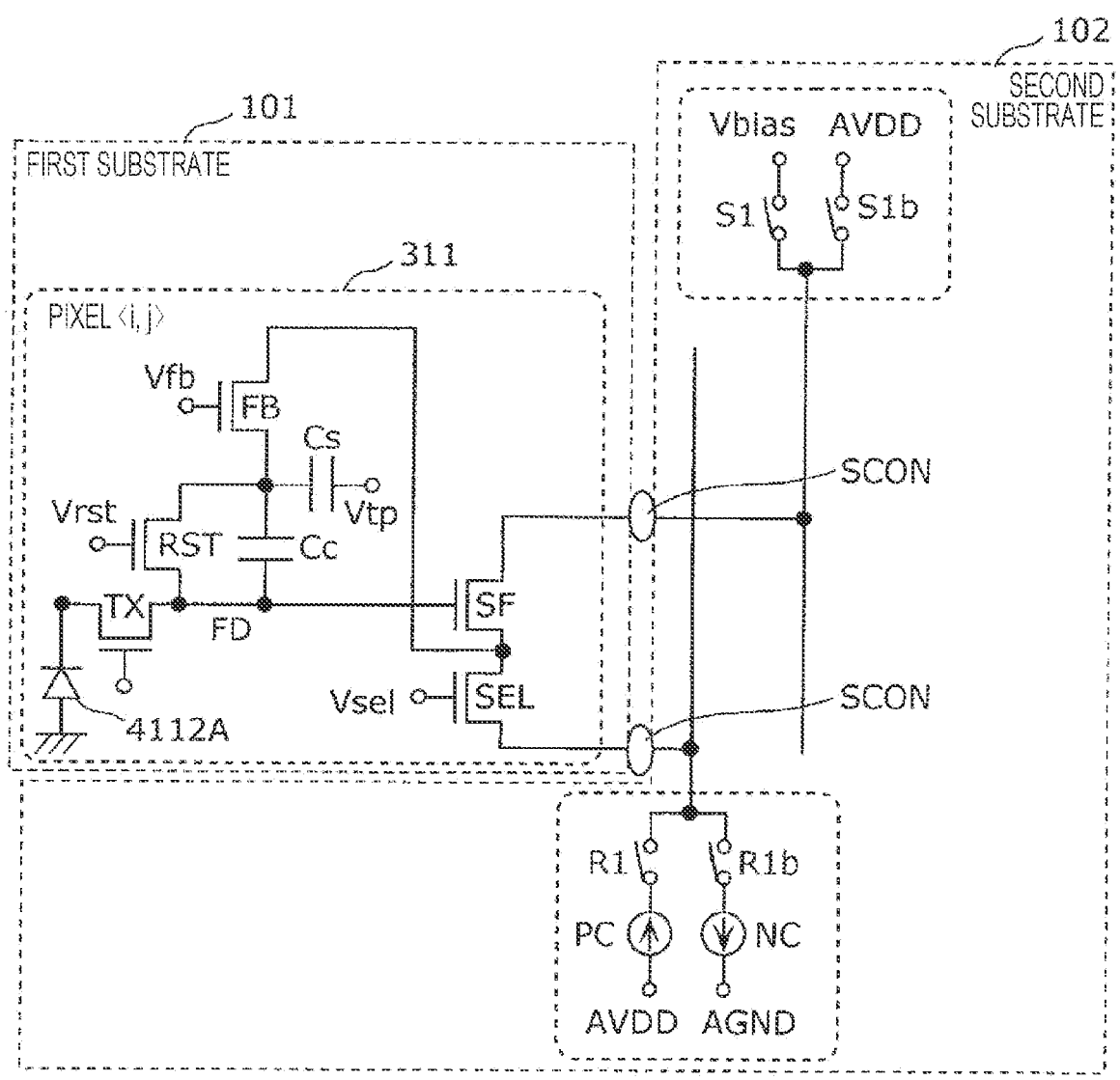
FIG. 52 is a schematic diagram illustrating another exemplary circuit configuration of the pixel according to the sixth embodiment.
Figure 53:
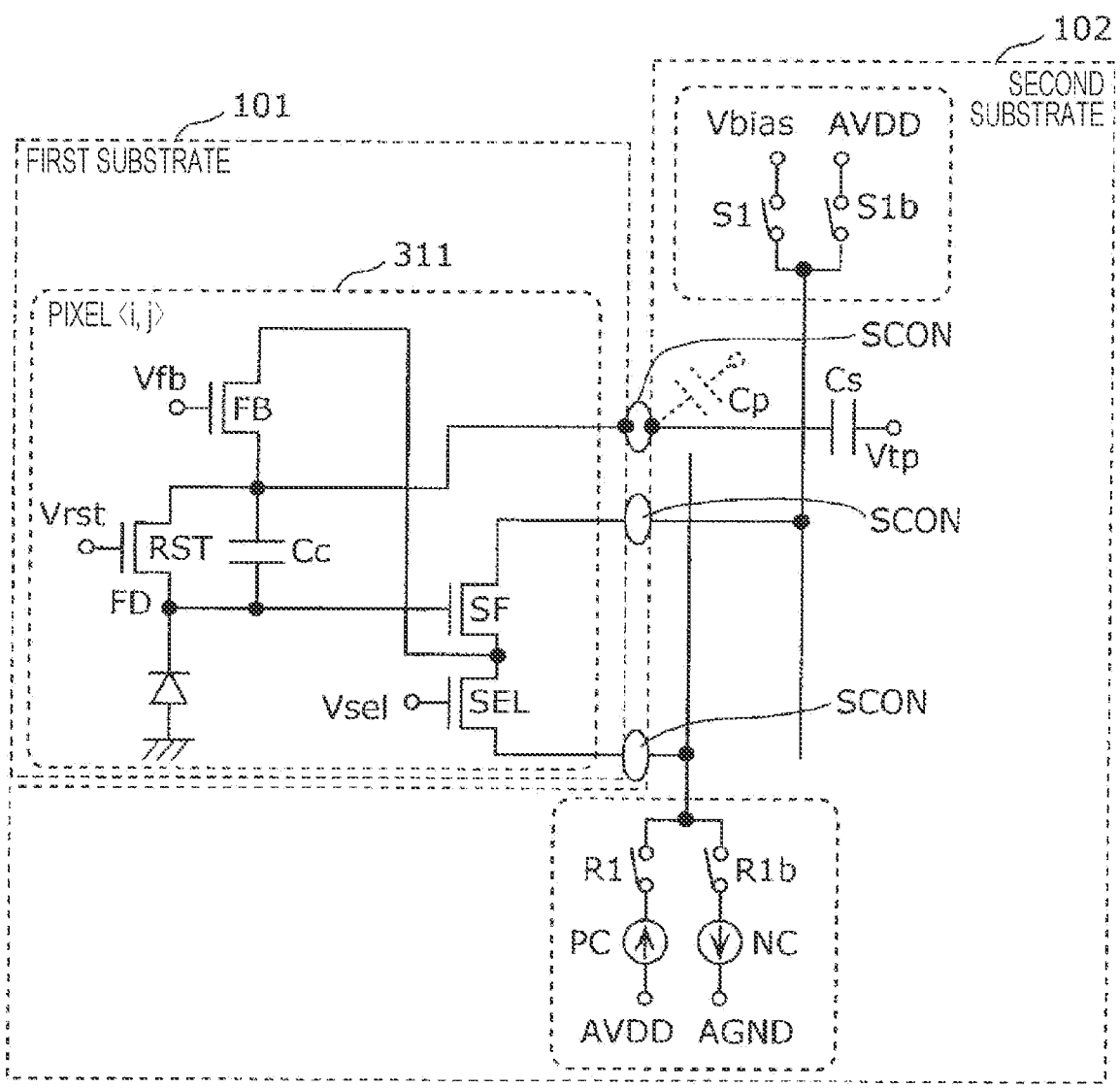
FIG. 53 is a schematic diagram illustrating another exemplary circuit configuration of the pixel according to the sixth embodiment.
Figure 54:
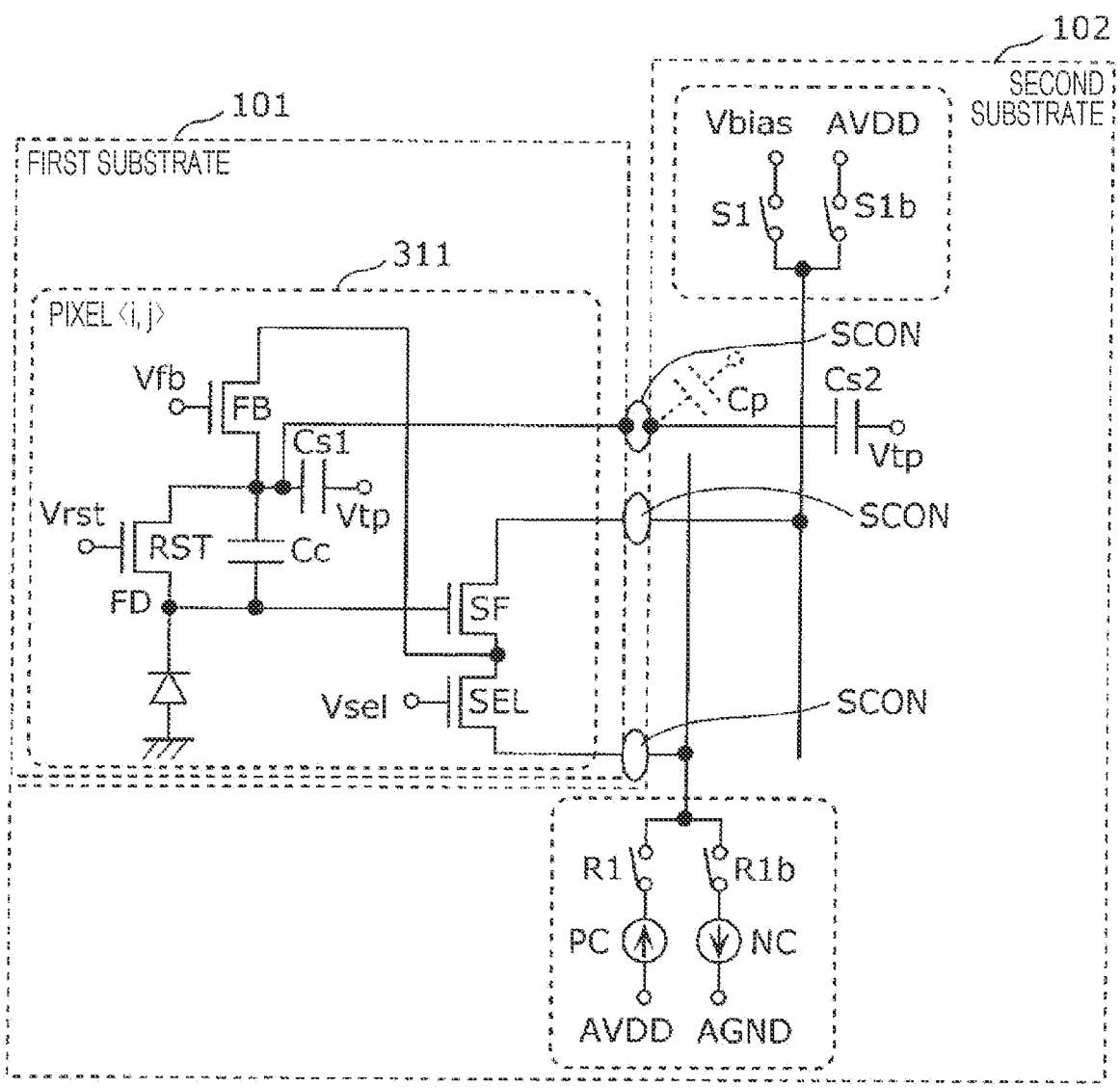
FIG. 54 is a schematic diagram illustrating another exemplary circuit configuration of the pixel according to the sixth embodiment.

FIGS. 52 to 54 are schematic diagrams illustrating other exemplary circuit configurations of the pixel 311 according to the sixth embodiment.

In the configuration illustrated in FIG. 52, a transfer transistor TX is connected to the photoelectric converter 4112A. This allows signal charge generated in the photoelectric converter 4112A to be transferred to a charge accumulation region FD with lower noise.

As illustrated in FIG. 51, the capacitance connected to a gate of the amplifying transistor SF may be arranged in the first substrate 101 in which the amplifying transistor is arranged. This is because when the capacitance connected to the gate of the amplifying transistor SF is arranged across the first and second substrates 101 and 102, there is a possibility that parasitic capacitance occurs across the first and second substrates 101 and 102. The capacitance connected to the gate of the amplifying transistor SF contributes to a conversion gain. Thus, when the capacitance Cc and parasitic capacitance of the charge accumulation region FD are reduced, the conversion gain can be increased.

Although constant current sources PC and NC are arranged in the second substrate 102 in the present embodiment, for example, the constant current source PC and the constant current source NC may be provided in the first substrate 101 and the second substrate 102, respectively. Alternatively, the constant current source PC and the constant current source NC may be provided in each of the first substrate 101 and the second substrate 102. In this case, in accordance with an operation mode, the constant current source PC and the constant current source NC provided in the first substrate 101 and the constant current source PC and the constant current source NC provided in the second substrate 102 may be temporally switched and used respectively as current sources for a shutter operation and current sources for a reading operation.

Meanwhile, when the capacitance value of the capacitance Cs is increased as described in the third to fifth embodiments, the noise can be further reduced. Thus, when the capacitance Cs is provided in the second substrate 102, and the area of the capacitance Cs is increased, as illustrated in FIG. 53, it is possible to realize a larger capacitance value. In such a case, the imaging device 100 may have a configuration in which a capacitance Cp is connected through the substrate connection portion SCON. The capacitance Cs and the capacitance Cp may take any form of a diffused metal-oxide semiconductor (DMOS) capacitance, a MIM capacitance, a MOS capacitance, or a fringing capacitance with a peripheral structure.

Also, as illustrated in FIG. 54, while a capacitance Cs1 is provided in a first substrate 101, a capacitance Cs2 may be provided in a second substrate 102 so as to be connected in parallel with the capacitance Cs1. In addition, the capacitance Cp may be provided utilizing a gap between the substrate connection portions SCON or a gap between the first substrate 101 and the second substrate 102. In such a case, the imaging device 100 may have a configuration in which, in order to create the capacitance Cp, a small distance is provided between the first substrate 101 and the second substrate 102 so as to form a parallel plate capacitor.

Figure 55:
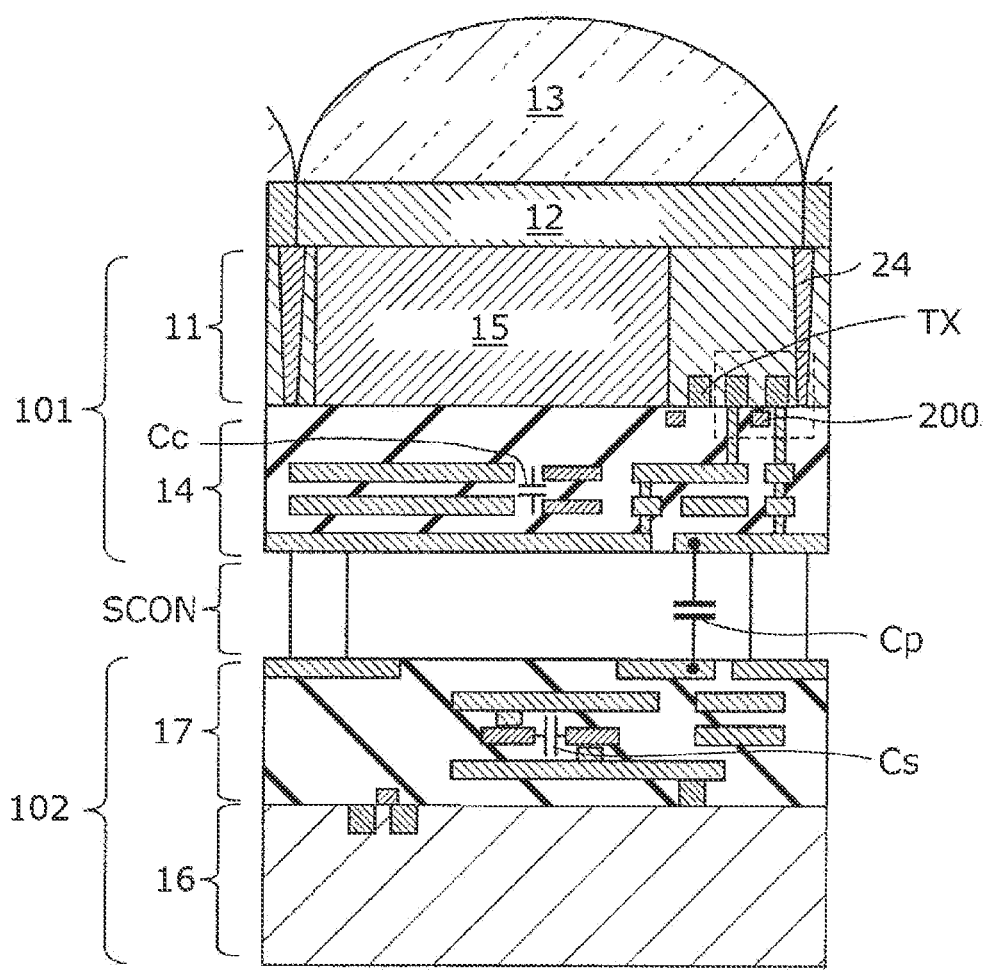
FIG. 55 is a schematic diagram illustrating an exemplary cross section of an imaging device according to the sixth embodiment.
Figure 56:
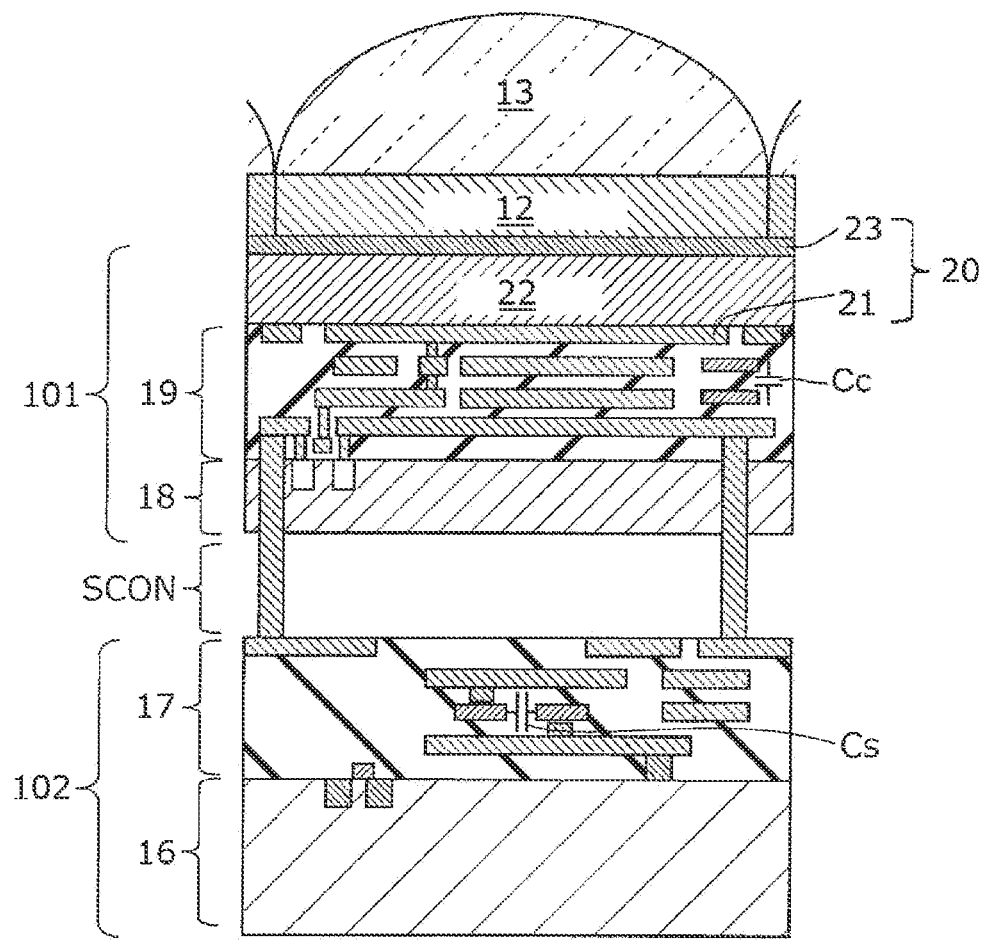
FIG. 56 is a schematic diagram illustrating an exemplary cross section of the imaging device according to the sixth embodiment.

FIGS. 55 and 56 each illustrate an exemplary cross section of the imaging device 100 according to the sixth embodiment.

FIG. 55 is a schematic diagram illustrating an exemplary cross section when the imaging device 100 according to the sixth embodiment is a silicon image sensor. In FIG. 55, a first substrate 101 includes a wiring layer 14 and a silicon substrate 11 on the wiring layer 14. A color filter 12 and a microlens 13 are stacked on the silicon substrate 11 in that order. A photodiode 15, an amplifying transistor 200, a transfer transistor TX, and a pixel separation region 24, which separates the pixels, are formed in the silicon substrate 11. The wiring layer 14 includes a capacitance Cc. A second substrate 102 includes a silicon substrate 16 and a wiring layer 17 on the silicon substrate 16. The wiring layer 17 includes a capacitance Cs.

In FIG. 55, the first substrate 101 and the second substrate 102 are connected via substrate connection portions SCON. The connection via the substrate connection portions SCON may be, for example, Cu—Cu hybrid bonding, connection using metal bumps, or connection using through-silicon vias (TSVs). In FIG. 55, a backside-illumination silicon image sensor is provided in the first substrate 101, and a constant current source and the capacitance Cs are arranged in the second substrate 102. In addition, the gap between the first substrate 101 and the second substrate 102 is used to realize a capacitance Cp. In the present embodiment, two or more substrate connection portions SCON are provided for each pixel or for each pixel block. The capacitance in one of the substrate connection portions SCON is reduced for pixel reading, and the capacitance in the other substrate connection portion SCON is increased for capacitance connected to the corresponding pixel and is connected to the second substrate 102. In the present embodiment, three substrate connection portions SCON may be provided for each pixel or for each pixel block. The capacitance Cp may be connected to the substrate connection portion SCON that is included in the three substrate connection portions SCON and that is electrically connected to the capacitance Cs. Also, it is desirable that, in order to increase the conversion gain, no capacitance be connected to the substrate connection portion SCON that is included in the three substrate connection portions SCON and that is electrically connected to the output signal line 314 described above.

FIG. 56 is a schematic diagram illustrating an exemplary cross section when the imaging device according to the sixth embodiment is a photoelectric-converter-stacked image sensor like those typified by an organic image sensor. In FIG. 56, a first substrate 101 includes a stack in which a silicon substrate 18, a wiring layer 19, and a photoelectric converter 20 are stacked in that order. A color filter 12 and a microlens 13 are stacked on the photoelectric converter 20 in that order. The photoelectric converter 20 includes a pixel electrode 21, an opposing electrode 23, and a photoelectric conversion layer 22, which is sandwiched therebetween. An amplifying transistor 200 and a band control transistor 300 are formed in the silicon substrate 18. The wiring layer 19 includes a capacitance Cc. A second substrate 102 includes a silicon substrate 16 and a wiring layer 17 on the silicon substrate 16. The wiring layer 17 includes a capacitance Cs. The first substrate 101 and the second substrate 102 are connected to each other via substrate connection portions SCON. The connection via the substrate connection portions SCON is, for example, connection using TSVs. In the configuration example illustrated in FIG. 56, two or more substrate connection portions SCON may be provided for each pixel or for each pixel block, as in the configuration example illustrated in FIG. 55.

Seventh Embodiment

Figure 57:
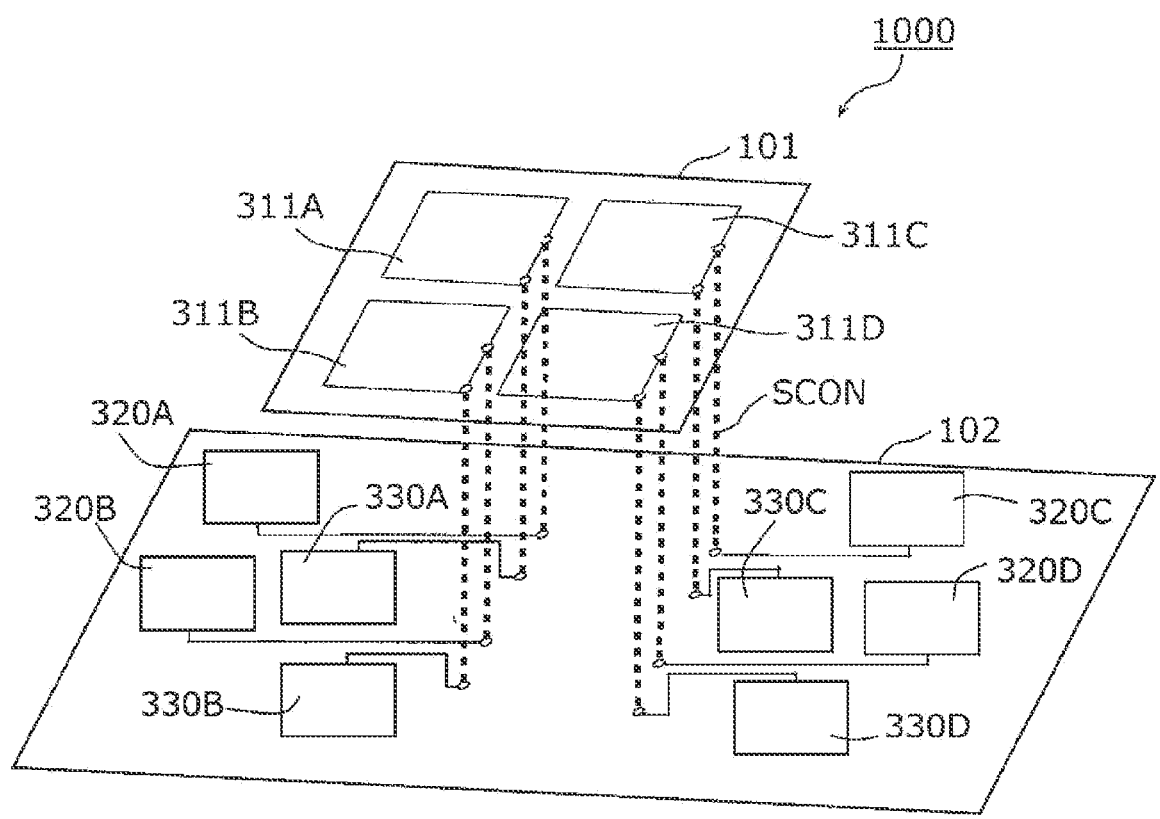
FIG. 57 is a schematic diagram illustrating a stack according to a seventh embodiment.
Figure 58:
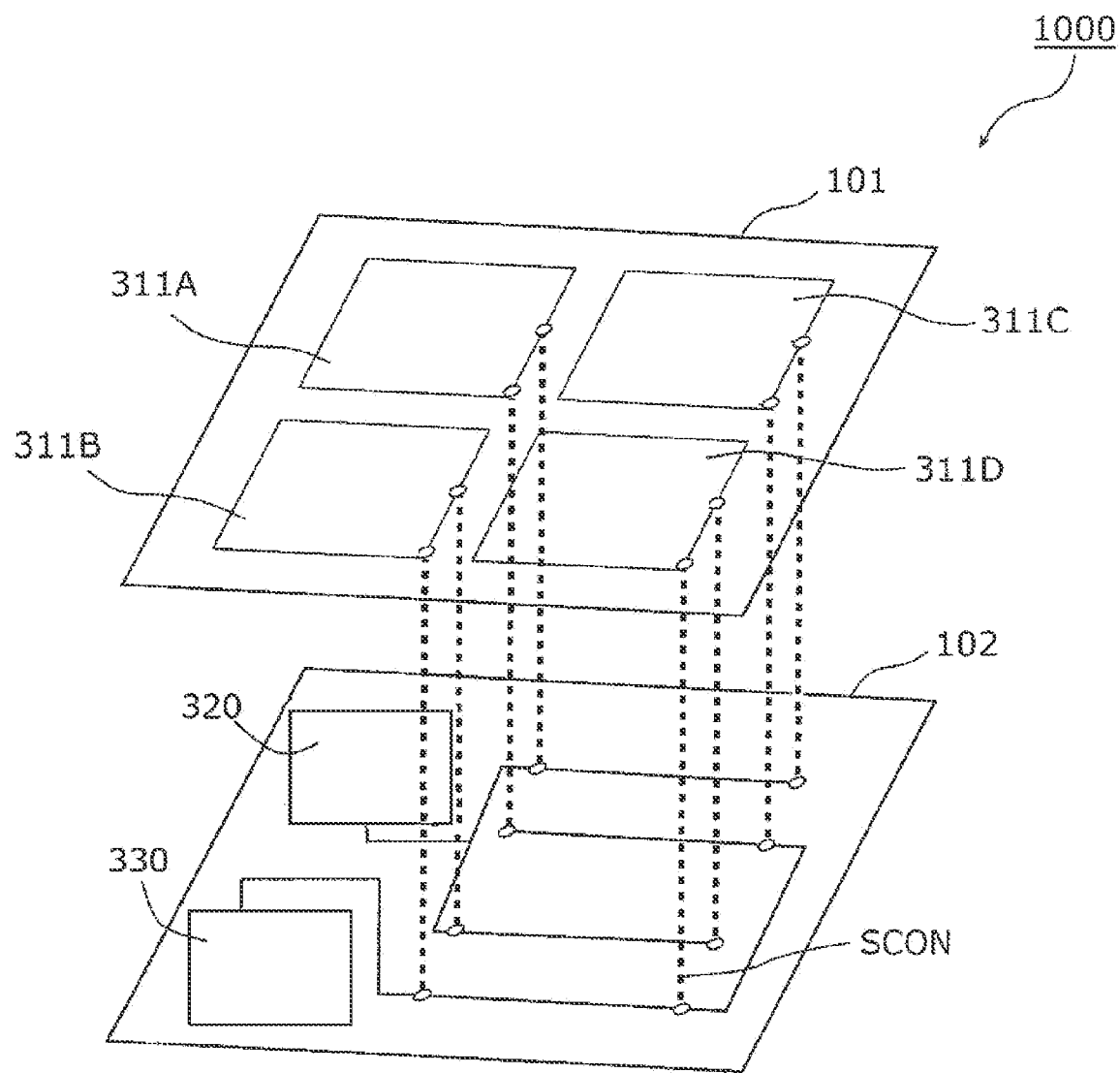
FIG. 58 is a schematic diagram illustrating a stack according to the seventh embodiment.

FIGS. 57 and 58 are schematic diagram each illustrating a stack 1000 according to a seventh embodiment.

As illustrated in FIGS. 57 and 58, the stack 1000 includes a first substrate 101 and a second substrate 102. The first substrate 101 is stacked above the second substrate 102.

FIGS. 57 and 58 illustrate connection relationships between the first substrate 101 and the second substrate 102.

In FIG. 57, a total of four pixels in two rows×two columns are illustrated in the first substrate 101 as a representative of a plurality of pixels 311. The four pixels are, specifically, pixels 311A, 311B, 311C, and 311D.

The first substrate 101 and the second substrate 102 are connected to each other via substrate connection portions SCON. The second substrate 102 has bias control circuits 320A to 320D and constant current source circuits 330A to 330D. The vertical scanning circuit 350 described above and an analog-to-digital converting circuit (also called a column ADC circuit) may be arranged in the second substrate 102. This makes it possible to reduce the lengths of signal paths between the vertical scanning circuit 350 and the pixels and the lengths of signal paths between the column ADC circuit and the pixels.

In the configuration illustrated in FIG. 57, the constant current source circuits 330A to 330D and the bias control circuits 320A to 320D are provided for the respective pixels 311A to 311D. The constant current source circuits 330A to 330D may have the same circuit configuration as the constant current source circuit 330 illustrated in FIG. 4 or may have the circuit configuration in another embodiment. Similarly, the bias control circuits 320A to 320D may have the same circuit configuration as the bias control circuit 320 illustrated in FIG. 4 or may have the circuit configuration in another embodiment. Thus, in the configuration illustrated in FIG. 57, a reading operation or a reset operation can be set for each pixel. Heretofore, in a column-parallel operation in a CMOS image sensor, not only reading but also an electronic shutter operation has been performed for each row. On the other hand, in the present embodiment, a reading operation and an electronic shutter operation can be performed for each pixel. Thus, a global shutter operation can be performed. Accordingly, it is possible to avoid rolling shutter distortion that occurs when an electronic shutter operation or a reading operation is performed for each row.

In the configuration illustrated in FIG. 57, reading operations or reset operations can be performed on all pixels at the same time, and a reading operation or a reset operation can be performed on only a particular pixel group that is selected. For example, it is possible to execute a shutter operation of each 2×2 pixel block or a reset operation of only a 2×2 pixel block at row-and-column numbers (1, 1). Since the pixels that are reset at the same time are some of all the pixels, rolling shutter distortion can be reduced while reducing concentration of current that is consumed and an exposure-time dead time. Naturally, the configuration illustrated in FIG. 57 can also be applied to a wide dynamic range operation, encoding exposure, and computational photography involving exposure time control for each block.

Also, performing a reading operation and an ADC operation for each block or for each pixel, rather than performing a column-parallel ADC operation, makes it possible to avoid the issue of random horizontal-line noise having correlations in the row directions. Since the human eye is sensitive to patterns having correlations in the vertical or horizontal directions, it has heretofore been necessary to sufficiently reduce the random horizontal-line noise relative to random noise in the pixels. In contrast, when a reading operation and an ADC operation are performed for each pixel block or for each pixel, as in the present embodiment, noise due to ADC appears as scattering to the human eye, thus offering an advantage in that specifications required for noise values are relaxed.

FIG. 58 illustrates a state in which one bias control circuit 320 and one constant current source circuit 330 provided in the second substrate 102 are shared by two or more pixels. The constant current source circuit 330 may have the same circuit configuration as the constant current source circuit 330 illustrated in FIG. 4 or may have the circuit configuration in another embodiment. Similarly, the bias control circuit 320 may have the same circuit configuration as the bias control circuit 320 illustrated in FIG. 4 or may have the circuit configuration in another embodiment.

Naturally, the pixels that share one bias control circuit 320 and one constant current source circuit 330 do not necessarily have to be adjacent pixels as illustrated in FIG. 58, and the sharing may be performed every other pixel or may be performed according to the color filter arrangement. When the bias control circuits 320 are grouped together for each color, it can be expected that color shifting due to mismatching in the circuits is alleviated.

A switch for switching the sharing may be provided in the second substrate 102 and be controlled.

Eighth Embodiment

A camera system 600 according to an eighth embodiment will be described with reference to FIG. 59.

Figure 59:
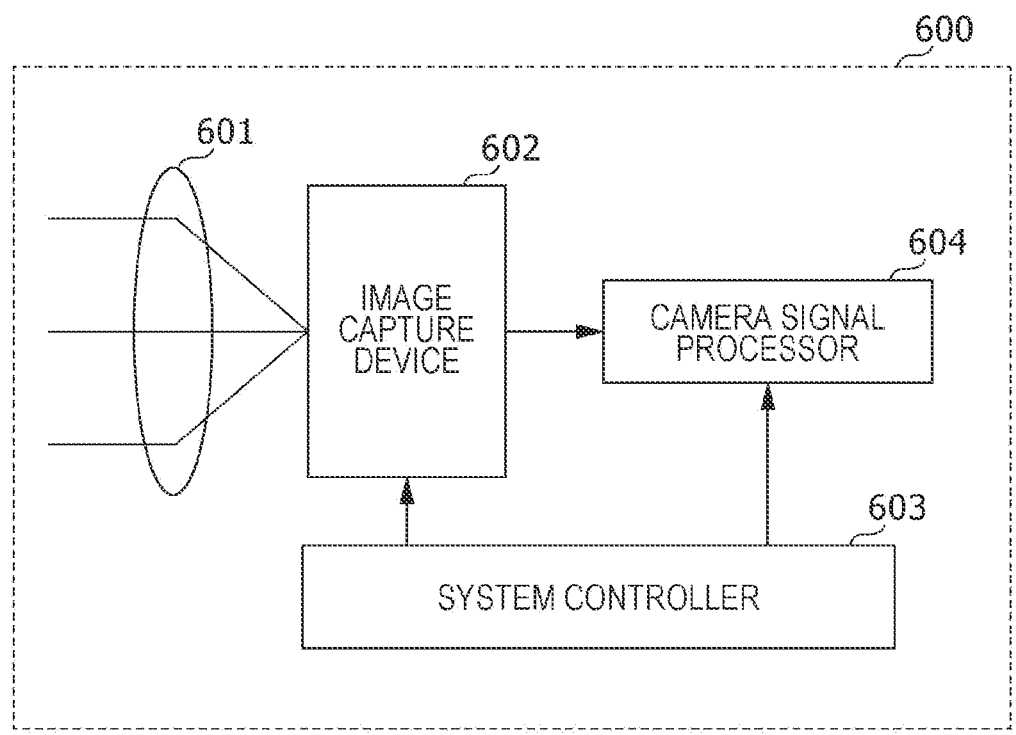
FIG. 59 is a schematic diagram illustrating an exemplary configuration of a camera system according to an eighth embodiment.

FIG. 59 schematically illustrates a configuration example of the camera system 600 according to the present embodiment. The camera system 600 includes a lens optical system 601, an imaging device 602, a system controller 603, and a camera signal processor 604.

The lens optical system 601 includes, for example, a lens for autofocusing, a lens for zooming, and a diaphragm. The lens optical system 601 focuses light onto an image capture plane of the imaging device 100. The imaging device 100 according to each of the first to seventh embodiments described above can be widely used as the imaging device 602.

The system controller 603 controls the entire camera system 600. The system controller 603 can be implemented by, for example, a microcomputer.

The camera signal processor 604 functions as a signal processing circuit that processes a signal output from the imaging device 100. The camera signal processor 604 performs processing, for example, gamma correction, color interpolation processing, spatial interpolation processing, and automatic white balancing. The camera signal processor 604 may be implemented by, for example, a digital signal processor (DSP).

By using the imaging device 100 according to any of the first to seventh embodiments, the camera system 600 according to the present embodiment can appropriately reduce reset noise (kTC noise) during reading. As a result, charge can be read accurately, and a favorable image can be acquired.

Herein, when an element is expressed as being "connected" to another element, this means that a third element may be interposed between these elements. When an element is expressed as being "directly connected" to another element, this means that a third element is not interposed between these elements. In addition, when an element is expressed as being "electrically connected" to another element, this means that these elements do not necessarily have to be always electrically connected to each other and are electrically connected to each other at least at a certain point in time.

The imaging device according to the present disclosure can be applied to various sensor systems and camera systems, such as digital still cameras, medical cameras, surveillance cameras, vehicle-mounted cameras, digital single-lens reflex cameras, and digital mirrorless single-lens reflex cameras.

What is claimed is:

1. An imaging device comprising:
    a first substrate;
    a second substrate stacked on the first substrate;
    a first connection portion and a second connection portion between the first substrate and the second substrate;
    a first pixel and a second pixel; and
    a common signal line for the first pixel and the second pixel, wherein:
    each of the first and second pixels includes
        a photoelectric converter that converts incident light into a signal charge, and
        a detection circuit that detects the signal charge and includes a first transistor that outputs a signal corresponding to the signal charge to the common signal line,
    the first substrate includes the photoelectric converter and the first transistor of the detection circuit, and
    the second substrate includes
        a first line that transmits a voltage to the first transistor of the first pixel and the first transistor of the second pixel, and
        a voltage source that is coupled, without through the second connection portion, to the first transistor of the detection circuit of the first pixel, via the first line and the first connection portion, and that is coupled, without through the first connection portion, to the first transistor of the detection circuit of the second pixel, via the first line and the second connection portion.

2. The imaging device according to claim 1, wherein the voltage source is coupled to one of a source or a drain of the first transistor of the first pixel, via the first line and the first connection portion, and the voltage source is coupled to one of a source or a drain of the first transistor of the second pixel, via the first line and the second connection portion.

3. The imaging device according to claim 2, further comprising:
    a third connection portion and a fourth connection portion, between the first substrate and the second substrate, wherein
    the second substrate includes
        a second line, and
        a current source that is coupled to the other of the source or the drain of the first transistor of the first pixel, via the second line and the third connection portion, and that is coupled to the other of the source or the drain of the first transistor of the second pixel, via the second line and the fourth connection portion.

4. The imaging device according to claim 1, further comprising:
    a third connection portion and a fourth connection portion, between the first substrate and the second substrate, wherein
    the second substrate includes
        a second line, and
        a current source that is coupled to the first transistor of the detection circuit of the first pixel, via the second line and the third connection portion, and that is coupled to the first transistor of the detection circuit of the second pixel, via the second line and the fourth connection portion.

5. The imaging device according to claim 1, wherein the first pixel and the second pixel each include a PMOS transistor and an NMOS transistor.

6. The imaging device according to claim 1, wherein
    the first pixel and the second pixel are arranged in a first direction, and
    the first line extends in the first direction.

7. The imaging device according to claim 1, wherein the first line has a mesh pattern.

8. The imaging device according to claim 1, wherein the voltage source is not coupled to the first transistor of the detection circuit of the second pixel via the first connection portion.

9. The imaging device according to claim 1, wherein a gate of the first transistor is coupled to the photoelectric convertor without interposing a transistor.

10. The imaging device according to claim 1, wherein:
    the detection circuit of each of the first and second pixels includes a second transistor that causes the first transistor to selectively output the signal to the common signal line, and
    the first substrate includes the second transistor of the detection circuit of each of the first and second pixels.

11. The imaging device according to claim 1, wherein an entirety of the detection circuit is disposed in the first substrate.

12. An imaging device comprising:
    a first substrate;
    a second substrate stacked on the first substrate;
    a first connection portion and a second connection portion between the first substrate and the second substrate;
    a first pixel and a second pixel; and
    a first line for the first pixel and the second pixel, wherein:
    each of the first and second pixels includes
        a photoelectric converter that converts incident light into a signal charge, and
        a detection circuit that detects the signal charge and includes a first transistor that outputs a signal corresponding to the signal charge to the first line,
    the first substrate includes the photoelectric converter and the first transistor of the detection circuit,
    the first line transmits the signal output by the first transistor of the first pixel and the signal output by the first transistor of the second pixel, and
    the second substrate includes
        the first line, and
        a current source that is coupled, without through the second connection portion, to the first transistor of the detection circuit of the first pixel, via the first line and the first connection portion, and that is coupled, without through the first connection portion, to the first transistor of the detection circuit of the second pixel, via the first line and the second connection portion.

13. The imaging device according to claim 12, wherein
the current source is coupled to one of a source or a drain of the first transistor of the first pixel, via the first line and the first connection portion, and
the current source is coupled to one of a source or a drain of the first transistor of the second pixel, via the first line and the second connection portion.

14. The imaging device according to claim 12, wherein the first pixel and the second pixel each include a PMOS transistor and an NMOS transistor.

15. The imaging device according to claim 12, wherein
the first pixel and the second pixel are arranged in a first direction, and
the first line extends in the first direction.

16. The imaging device according to claim 12, wherein the current source is not coupled to the first transistor of the detection circuit of the second pixel via the first connection portion.

17. The imaging device according to claim 12, wherein a gate of the first transistor is coupled to the photoelectric convertor without interposing a transistor.

18. The imaging device according to claim 12, wherein:
the detection circuit of each of the first and second pixels includes a second transistor that causes the first transistor to selectively output the signal to the first line, and
the first substrate includes the second transistor of the detection circuit of each of the first and second pixels.

19. The imaging device according to claim 12, wherein an entirety of the detection circuit is disposed in the first substrate.

* * * * *